(12) United States Patent
Yamanaka et al.

(10) Patent No.: US 10,522,090 B2
(45) Date of Patent: Dec. 31, 2019

(54) DISPLAY DEVICE INCLUDING OUTPUT CONTROL CIRCUITS

(71) Applicant: Sharp Kabushiki Kaisha, Sakai, Osaka (JP)

(72) Inventors: Shigetsugu Yamanaka, Sakai (JP); Noboru Noguchi, Sakai (JP); Masanori Ohara, Sakai (JP); Noritaka Kishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 151 days.

(21) Appl. No.: 15/562,920

(22) PCT Filed: Mar. 25, 2016

(86) PCT No.: PCT/JP2016/059616
§ 371 (c)(1),
(2) Date: Sep. 29, 2017

(87) PCT Pub. No.: WO2016/158745
PCT Pub. Date: Oct. 6, 2016

(65) Prior Publication Data
US 2018/0082642 A1    Mar. 22, 2018

(30) Foreign Application Priority Data

Apr. 2, 2015    (JP) .................................. 2015-075615

(51) Int. Cl.
*G09G 3/3291*    (2016.01)
*G09G 3/3233*    (2016.01)
(Continued)

(52) U.S. Cl.
CPC ......... *G09G 3/3291* (2013.01); *G09G 3/3233* (2013.01); *G09G 3/3258* (2013.01);
(Continued)

(58) Field of Classification Search
None
See application file for complete search history.

(56) References Cited

U.S. PATENT DOCUMENTS

2010/0066922 A1    3/2010  Kumada
2010/0327955 A1    12/2010 Umezaki
(Continued)

FOREIGN PATENT DOCUMENTS

JP    2011-028237 A    2/2011
JP    2012-078622 A    4/2012
(Continued)

OTHER PUBLICATIONS

Official Communication issued in International Patent Application No. PCT/JP2016/059616, dated Jun. 28, 2016.

*Primary Examiner* — Amr A Awad
*Assistant Examiner* — Donna V Lui
(74) *Attorney, Agent, or Firm* — Keating & Bennett, LLP

(57) ABSTRACT

A display device that is configured to include two independent shift registers and is capable of performing a monitoring process without causing the degradation of display quality or the occurrence of abnormal operation is implemented. In a display device including: a writing control shift register composed of a plurality of first unit circuits (30) each including a first boost circuit (320) and a first output node reset circuit (330); and a monitoring control shift register composed of a plurality of second unit circuits (40) each including a second boost circuit (420) and a second output node reset circuit (430), current drive capability of the first boost circuit (320) is higher than current drive capability of the second boost circuit (420), and current drive capability of the second output node reset circuit (430) is higher than current drive capability of the first output node reset circuit (330).

20 Claims, 33 Drawing Sheets

(51) Int. Cl.
  *G09G 3/3258*   (2016.01)
  *H01L 27/12*    (2006.01)
  *H01L 29/786*   (2006.01)

(52) U.S. Cl.
  CPC ........... *G09G 2310/0286* (2013.01); *G09G 2320/0626* (2013.01); *H01L 27/1225* (2013.01); *H01L 29/7869* (2013.01)

(56) References Cited

U.S. PATENT DOCUMENTS

| | | |
|---|---|---|
| 2012/0138922 A1 | 6/2012 | Yamazaki et al. |
| 2015/0213757 A1 | 7/2015 | Takahama et al. |
| 2016/0055791 A1 | 2/2016 | Kishi et al. |
| 2016/0111044 A1 | 4/2016 | Kishi et al. |

FOREIGN PATENT DOCUMENTS

| | | |
|---|---|---|
| JP | 2012-134475 A | 7/2012 |
| JP | 2013-048425 A | 3/2013 |
| WO | 2008/093458 A1 | 8/2008 |
| WO | 2014/021201 A1 | 2/2014 |
| WO | 2014/174905 A1 | 10/2014 |
| WO | 2014/208459 A1 | 12/2014 |

DISPLAY DEVICE INCLUDING OUTPUT CONTROL CIRCUITS

TECHNICAL FIELD

The present invention relates to a display device, and more particularly to a display device, such as an organic EL display device and the like, equipped with a self light-emitting type display element driven by a current, and a method for driving the same.

BACKGROUND ART

Conventionally, as display elements included in a display device, there have been an electro-optical element whose luminance is controlled by a voltage applied thereto, and an electro-optical element whose luminance is controlled by a current flowing therethrough. A representative example of the electro-optical element whose luminance is controlled by a voltage applied thereto is a liquid crystal display element. On the other hand, a representative example of the electro-optical element whose luminance is controlled by a current flowing therethrough is an organic electro luminescence (EL) element. The organic EL element is also called an OLED (Organic Light-Emitting Diode). An organic EL display device using the organic EL elements which are self light-emitting type electro-optical elements can more easily achieve slimming down, a reduction in power consumption, an increase in luminance, etc., compared to a liquid crystal display device that requires a backlight, color filters, and the like. Therefore, in recent years, there has been active development of organic EL display devices.

As for driving systems for an organic EL display device, there are known a passive matrix system (also called a simple matrix system) and an active matrix system. An organic EL display device that adopts the passive matrix system is simple in structure, but is difficult to achieve an increase in size and an improvement in definition. On the other hand, an organic EL display device that adopts the active matrix system (hereinafter, referred to as "active matrix-type organic EL display device") can more easily achieve an increase in size and an improvement in definition, compared to the organic EL display device that adopts the passive matrix system.

The active matrix-type organic EL display device has a plurality of pixel circuits formed in a matrix form. Each pixel circuit of the active matrix-type organic EL display device typically includes an input transistor that selects a pixel; and a drive transistor that controls the supply of a current to an organic EL element. Note that in the following, the current flowing through the organic EL element from the drive transistor may be referred to as "drive current."

FIG. 37 is a circuit diagram showing a configuration of a conventional general pixel circuit 81. The pixel circuit 81 is provided at a corresponding one of intersections of a plurality of data lines DL and a plurality of scanning lines SL which are disposed in a display unit. As shown in FIG. 37, the pixel circuit 81 includes two transistors T1 and T2, one capacitor Cst, and one organic EL element OLED. The transistor T1 is an input transistor and the transistor T2 is a drive transistor.

The transistor T1 is provided between a data line DL and a gate terminal of the transistor T2. The transistor T1 has a gate terminal connected to a scanning line SL; and a source terminal connected to the data line DL. The transistor T2 is provided in series with the organic EL element OLED. The transistor T2 has a drain terminal connected to a power supply line that supplies an organic EL high-level power supply voltage ELVDD; and a source terminal connected to an anode terminal of the organic EL element OLED. Note that the power supply line that supplies an organic EL high-level power supply voltage ELVDD is hereinafter referred to as "organic EL high-level power supply line." The organic EL high-level power supply line is denoted by the same reference character ELVDD as the organic EL high-level power supply voltage. The capacitor Cst has one end connected to the gate terminal of the transistor T2; and the other end connected to the source terminal of the transistor T2. Note that there is also a case in which the other end of the capacitor Cst is connected to the drain terminal of the transistor T2. A cathode terminal of the organic EL element OLED is connected to a power supply line that supplies an organic EL low-level power supply voltage ELVSS. Note that the power supply line that supplies an organic EL low-level power supply voltage ELVSS is hereinafter referred to as "organic EL low-level power supply line." The organic EL low-level power supply line is denoted by the same reference character ELVSS as the organic EL low-level power supply voltage. Note also that here a connecting point of the gate terminal of the transistor T2, the one end of the capacitor Cst, and a drain terminal of the transistor T1 is referred to as "gate node" for convenience sake. The gate node is denoted by reference character VG. Note that, in general, one of a drain and a source that has a higher potential is called a drain, but in the description of this specification, one is defined as a drain and the other as a source, and thus, a source potential may be higher than a drain potential in some cases.

FIG. 38 is a timing chart for describing the operation of the pixel circuit 81 shown in FIG. 37. Prior to time point t91, the scanning line SL is in a non-selected state. Therefore, prior to time point t91, the transistor T1 is in an off state and the potential at the gate node VG maintains an initial level (e.g., a level determined depending on writing performed in the preceding frame). When reaching time point t91, the scanning line SL goes into a selected state and the transistor T1 goes into an on state. By this, a data voltage Vdata corresponding to the luminance of a pixel (subpixel) formed by the pixel circuit 81 is supplied to the gate node VG through the data line DL and the transistor T1. Thereafter, during a period up to time point t92, the potential at the gate node VG changes depending on the data voltage Vdata. At this time, the capacitor Cst is charged to a gate-source voltage Vgs which is the difference between the potential at the gate node VG and the source potential of the transistor T2. When reaching time point t92, the scanning line SL goes into a non-selected state. By this, the transistor T1 goes into an off state and the gate-source voltage Vgs held in the capacitor Cst is fixed. The transistor T2 supplies a drive current to the organic EL element OLED, depending on the gate-source voltage Vgs held in the capacitor Cst. As a result, the organic EL element OLED emits light at a luminance determined depending on the drive current.

Meanwhile, the organic EL display device typically adopts a thin-film transistor (TFT) as a drive transistor. However, the thin-film transistor is likely to cause variations in characteristics (threshold voltage and mobility). When variations occur in the characteristics of the drive transistors provided in the display unit, variations occur in the magnitude of a drive current. As a result, luminance nonuniformity occurs on a display screen, degrading display quality. In addition, regarding the organic EL element, the current efficiency (light emission efficiency) decreases with the passage of time. Therefore, even when a constant current is supplied to the organic EL element, the luminance gradually decreases with the passage of time. As a result, burn-in occurs.

Hence, conventionally, regarding the organic EL display device, there is proposed a technique for compensating for degradation of circuit elements such as drive transistors or organic EL elements. For example, WO 2014/021201 A discloses a configuration in which both the threshold voltage compensation and gain compensation of a drive transistor are performed for each pixel circuit.

PRIOR ART DOCUMENT

Patent Document

[Patent Document 1] WO 2014/021201 A

SUMMARY OF THE INVENTION

Problems to be Solved by the Invention

Meanwhile, in a case in which drive current measurement is performed to compensate for variations in the characteristics of drive transistors, a pixel circuit 91 of a configuration such as that shown in FIG. 39 may be adopted. The pixel circuit 91 shown in FIG. 39 is provided with a transistor T3 for controlling whether to perform drive current measurement, in addition to components provided conventionally. When the transistor T3 is in an on state, a drive current is read through a data line DL. In addition, in a display unit, a signal line for controlling the on/off of the transistor T3 is provided in parallel with a scanning line. For convenience of description, a signal line corresponding to a scanning line which is conventionally provided is hereinafter referred to as "writing control line", and the signal line for controlling the on/off of the transistor T3 is hereinafter referred to as "monitoring control line." The writing control line is denoted by reference character GL and the monitoring control line is denoted by reference character ML. Note that a measurement target used when degradation of circuit elements is compensated for is not limited to a current, and voltage measurement may be performed. A process of measuring a current or voltage to compensate for degradation of circuit elements is hereinafter referred to as "monitoring process." In addition, a period including a period during which a current or voltage is actually measured and a preparation period for the measurement is referred to as "monitoring process period."

The writing control lines GL and the monitoring control lines ML are driven using a shift register(s). As configurations therefor, a configuration in which one shift register that drives both the writing control lines GL and the monitoring control lines ML is provided on one side of the display unit and a configuration (a configuration shown in FIG. 40) in which a shift register that drives the writing control lines GL (hereinafter, referred to as "writing control shift register") 96 is provided on one side of a display unit 95 and a shift register that drives the monitoring control lines ML (hereinafter, referred to as "monitoring control shift register") 97 is provided on the other side of the display unit 95 are conceivable. By adopting the configuration shown in FIG. 40, the picture-frame sizes on both the left and right sides of the display unit 95 can be made uniform.

In general, the length of a period during which one writing control line GL is maintained in a selected state for a data voltage writing process differs from the length of a period during which one monitoring control line ML is maintained in a selected state for a monitoring process. Hence, if, when the configuration shown in FIG. 40 is adopted, the writing control shift register 96 and the monitoring control shift register 97 have the exact same internal configuration, then degradation of display quality or abnormal operation may occur. However, there is a case in which there is no choice but to adopt the configuration shown in FIG. 40 due to constraints on layout, etc.

An object of the present invention is therefore to implement a display device that is configured to include two independent shift registers (a writing control shift register and a monitoring control shift register) and is capable of performing a monitoring process without causing the degradation of display quality or the occurrence of abnormal operation.

Means for Solving the Problems

A first aspect of the present invention is directed to a display device having a plurality of pixel circuits formed in a matrix form, the display device including, a plurality of writing control lines provided to correspond to respective rows, and each configured to transmit a writing control signal controlling whether to write data voltages into pixel circuits of a corresponding row;

a plurality of monitoring control lines provided to correspond to the respective rows, and each configured to transmit a monitoring control signal controlling whether to measure amounts of electricity representing characteristics of circuit elements included in pixel circuits of a corresponding row;

a plurality of data lines provided to correspond to respective columns, and each configured to supply the data voltages to pixel circuits of a corresponding column;

an amount-of-electricity measurement circuit configured to measure amounts of electricity supplied from the plurality of pixel circuits;

a writing control shift register including a plurality of stages and configured to sequentially output an on-level writing control signal to the plurality of writing control lines based on a first clock signal group, the plurality of stages having a one-to-one correspondence with the plurality of writing control lines;

a monitoring control shift register including a plurality of stages and configured to output an on-level monitoring control signal to a monitoring control line of a monitored row based on a second clock signal group, the plurality of stages having a one-to-one correspondence with the plurality of monitoring control lines, and the monitored row being a target row for measurement of an amount of electricity;

a data line drive circuit configured to apply the data voltages to the plurality of data lines; and a drive control circuit configured to control operation of the amount-of-electricity measurement circuit, the writing control shift register, the monitoring control shift register, and the data line drive circuit, wherein a first unit circuit forming each of the stages of the writing control shift register includes:
 a first internal node;
 a first transfer circuit configured to transfer an on-level signal to the first internal node, the on-level signal being outputted from a first unit circuit forming a stage previous to its own stage;
 a first signal output circuit including a first output node connected to a writing control line corresponding to its own stage; and a first boost circuit configured to increase a voltage level at the first internal node based on a clock signal included in the first clock signal group, the first signal output circuit being configured to output a writing control signal from the first output node, and the writing control signal having a voltage level equal to a voltage level of the clock signal provided to the first boost circuit;

a first internal node reset circuit configured to bring a voltage level at the first internal node to an off level; and a first output node reset circuit configured to bring a voltage level at the first output node to an off level, a second unit circuit forming each of the stages of the monitoring control shift register includes:

a second internal node;

a second transfer circuit configured to transfer an on-level signal to the second internal node, the on-level signal being outputted from a second unit circuit forming a stage previous to its own stage;

a second signal output circuit including a second output node connected to a monitoring control line corresponding to its own stage; and a second boost circuit configured to increase a voltage level at the second internal node based on a clock signal included in the second clock signal group, the second signal output circuit being configured to output a monitoring control signal from the second output node, and the monitoring control signal having a voltage level equal to a voltage level of the clock signal provided to the second boost circuit;

a second internal node reset circuit configured to bring a voltage level at the second internal node to an off level; and a second output node reset circuit configured to bring a voltage level at the second output node to an off level, current drive capability of the first boost circuit is higher than current drive capability of the second boost circuit, current drive capability of the second output node reset circuit is higher than current drive capability of the first output node reset circuit, and the drive control unit:

controls the operation of the writing control shift register such that the output of the on-level writing control signal to the plurality of writing control lines stops during an amount-of-electricity measurement period, the amount-of-electricity measurement period being a period during which measurement of an amount of electricity by the amount-of-electricity measurement circuit is to be performed; and controls the operation of the monitoring control shift register such that the on-level monitoring control signal is outputted to the monitoring control line of the monitored row during the amount-of-electricity measurement period.

According to a second aspect of the present invention, in the first aspect of the present invention, the plurality of data lines each transmit amounts of electricity to the amount-of-electricity measurement circuit, the amounts of electricity being supplied from pixel circuits of a corresponding column, and each of the pixel circuits includes:

a writing control transistor having a control terminal connected to a corresponding writing control line; and a first conductive terminal connected to a corresponding data line;

a monitoring control transistor having a control terminal connected to a corresponding monitoring control line; and a first conductive terminal connected to the corresponding data line;

a drive transistor having a control terminal connected to a second conductive terminal of the writing control transistor; a first conductive terminal to which an on-level power supply voltage is provided; and a second conductive terminal connected to a second conductive terminal of the monitoring control transistor; and an organic EL element having an anode terminal connected to the second conductive terminal of the drive transistor; and a cathode terminal to which an off-level power supply voltage is provided.

According to a third aspect of the present invention, in the first aspect of the present invention, the display device further includes a plurality of monitoring lines provided to correspond to the respective columns, and each configured to transmit amounts of electricity to the amount-of-electricity measurement circuit, the amounts of electricity being supplied from pixel circuits of a corresponding column, wherein a writing control line and a monitoring control line are shared by a shared control line, the shared control line being a single control line, and each of the pixel circuits includes:

a writing control transistor having a control terminal connected to a corresponding shared control line; and a first conductive terminal connected to a corresponding data line;

a monitoring control transistor having a control terminal connected to the corresponding shared control line; and a first conductive terminal connected to a corresponding monitoring line;

a drive transistor having a control terminal connected to a second conductive terminal of the writing control transistor; a first conductive terminal to which an on-level power supply voltage is provided; and a second conductive terminal connected to a second conductive terminal of the monitoring control transistor; and an organic EL element having an anode terminal connected to the second conductive terminal of the drive transistor; and a cathode terminal to which an off-level power supply voltage is provided.

According to a fourth aspect of the present invention, in the first aspect of the present invention, the second signal output circuit further includes a second output control circuit configured to control an output of an on-level monitoring control signal from the second output node, based on a second enable signal.

According to a fifth aspect of the present invention, in the fourth aspect of the present invention, the second output control circuit is provided in a region between the second transfer circuit and the second boost circuit so as to divide the second internal node into two regions.

According to a sixth aspect of the present invention, in the fourth aspect of the present invention, the second output control circuit is provided in a region between the second boost circuit and the second output node.

According to a seventh aspect of the present invention, in the fourth aspect of the present invention, the first signal output circuit further includes a first output control circuit configured to control an output of an on-level writing control signal from the first output node, based on a first enable signal, and current drive capability of the first output control circuit is higher than current drive capability of the second output control circuit.

According to an eighth aspect of the present invention, in the first aspect of the present invention, the second unit circuit further includes a second holding circuit configured to hold the on-level signal transferred to the second internal node from the second transfer circuit.

According to a ninth aspect of the present invention, in the eighth aspect of the present invention, current drive capability of the second internal node reset circuit is higher than current drive capability of the first internal node reset circuit.

According to a tenth aspect of the present invention, in the eighth aspect of the present invention, the first unit circuit further includes a first holding circuit configured to hold the on-level signal transferred to the first internal node from the first transfer circuit, and signal holding capability of the second holding circuit is higher than signal holding capability of the first holding circuit.

According to an eleventh aspect of the present invention, in the first aspect of the present invention, the drive control unit stops the output of the on-level writing control signal to the plurality of writing control lines by the writing control shift register, by stopping clock operation of the first clock signal group during the amount-of-electricity measurement period.

According to a twelfth aspect of the present invention, in the eleventh aspect of the present invention, the drive control unit controls the operation of the writing control shift register and the operation of the data line drive circuit such that an on-level writing control signal is outputted to a writing control line of the monitored row and an initialization signal is applied to the plurality of data lines during at least a period immediately before the amount-of-electricity measurement period.

According to a thirteenth aspect of the present invention, in the first aspect of the present invention, the drive control unit controls the operation of the writing control shift register and the operation of the monitoring control shift register such that an on-level monitoring control signal is outputted to the monitoring control line of the monitored row during a period during which the output of the on-level writing control signal to the plurality of writing control lines is stopped.

According to a fourteenth aspect of the present invention, in the first aspect of the present invention, stopping and resumption of the output of the on-level monitoring control signal by the monitoring control shift register can be controlled externally.

According to a fifteenth aspect of the present invention, in the first aspect of the present invention, the drive control unit controls the operation of the writing control shift register and the operation of the monitoring control shift register such that a writing control signal provided to a writing control line of the monitored row and a monitoring control signal provided to a monitoring control line of the monitored row go to an on level in synchronization with each other.

Effects of the Invention

According to the first aspect of the present invention, in a display device that measures the amount of electricity supplied from a pixel circuit and can compensate for degradation of a circuit element based on a result of the measurement, a writing control shift register that drives writing control lines and a monitoring control shift register that drives monitoring control lines are provided. In such a configuration, the current drive capability of a first boost circuit (a boost circuit in each unit circuit forming the writing control shift register) is higher than the current drive capability of a second boost circuit (a boost circuit in each unit circuit forming the monitoring control shift register). Hence, the rise time of a writing control signal is shorter than the rise time of a monitoring control signal, suppressing degradation of display quality caused by insufficient charging. In addition, the current drive capability of a second output node reset circuit (an output node reset circuit in each unit circuit forming the monitoring control shift register) is higher than the current drive capability of a first output node reset circuit (an output node reset circuit in each unit circuit forming the writing control shift register). Hence, the fall time of the monitoring control signal is shorter than the fall time of the writing control signal, suppressing degradation of display quality. By the above, a display device is implemented that is configured to include two independent shift registers and is capable of performing a monitoring process (a process of measuring the amount of electricity supplied from a pixel circuit) without causing the degradation of display quality or the occurrence of abnormal operation.

According to the second aspect of the present invention, the same effect as that of the first aspect of the present invention can be obtained.

According to the third aspect of the present invention, since a writing control line and a monitoring control line are provided in a shared manner, the number of wiring lines can be reduced, achieving an improvement in definition.

According to the fourth aspect of the present invention, it is possible to output an on-level monitoring control signal only when a monitoring process is performed, with a relatively simple configuration.

According to the fifth aspect of the present invention, the same effect as that of the fourth aspect of the present invention can be obtained.

According to the sixth aspect of the present invention, the same effect as that of the fourth aspect of the present invention can be obtained.

According to the seventh aspect of the present invention, the rise time of a writing control signal is shorter than the rise time of a monitoring control signal, and thus, degradation of display quality caused by insufficient charging is suppressed.

According to the eighth aspect of the present invention, even when it takes a long period to transfer an on-level signal transferred to a second internal node from a second transfer circuit further to a second boost circuit, a reduction in the voltage level of the signal is suppressed. By this, the occurrence of an operation failure of a second unit circuit is suppressed.

According to the ninth aspect of the present invention, the voltage level at the second internal node promptly goes to an off level after a monitoring process ends. By this, the occurrence of an operation failure of the second unit circuit is suppressed.

According to the tenth aspect of the present invention, the voltage level at the second internal node can be maintained at a high level for a long period. By this, the occurrence of an operation failure caused by a reduction in the voltage level at the second internal node is suppressed.

According to the eleventh aspect of the present invention, by stopping the clock operation of a first clock signal group for a sufficient period, a sufficient period for measurement of the amount of electricity can be secured.

According to the twelfth aspect of the present invention, variations in charging rate do not occur between pixels, and thus, measurement of the amounts of electricity supplied from pixel circuits is accurately performed. Therefore, degradation of circuit elements is sufficiently compensated for.

According to the thirteenth aspect of the present invention, a monitoring process can be performed during a non-scanning period such as a vertical flyback period or a period immediately after the power is turned on.

According to the fourteenth aspect of the present invention, a monitoring process can be stopped for a long period when the changes (changes over time) in the characteristics of circuit elements are small, and a monitoring process can be performed only when necessary.

According to the fifteenth aspect of the present invention, the operation of the writing control shift register and the monitoring control shift register can be prevented from becoming complex.

MODES FOR CARRYING OUT THE INVENTION

Embodiments of the present invention will be described below with reference to the accompanying drawings. Note that for each transistor, a gate terminal corresponds to a control terminal, a drain terminal corresponds to a first conductive terminal, and a source terminal corresponds to a second conductive terminal. Note also that in the following, the characteristics of a drive transistor provided in a pixel circuit are referred to as "TFT characteristics", the characteristics of an organic EL element provided in the pixel circuit are referred to as "OLED characteristics", and a row that is the target of a monitoring process is referred to as "monitored row."

1. First Embodiment

1.1 Overall Configuration and Summary of Operation

Figure 2:
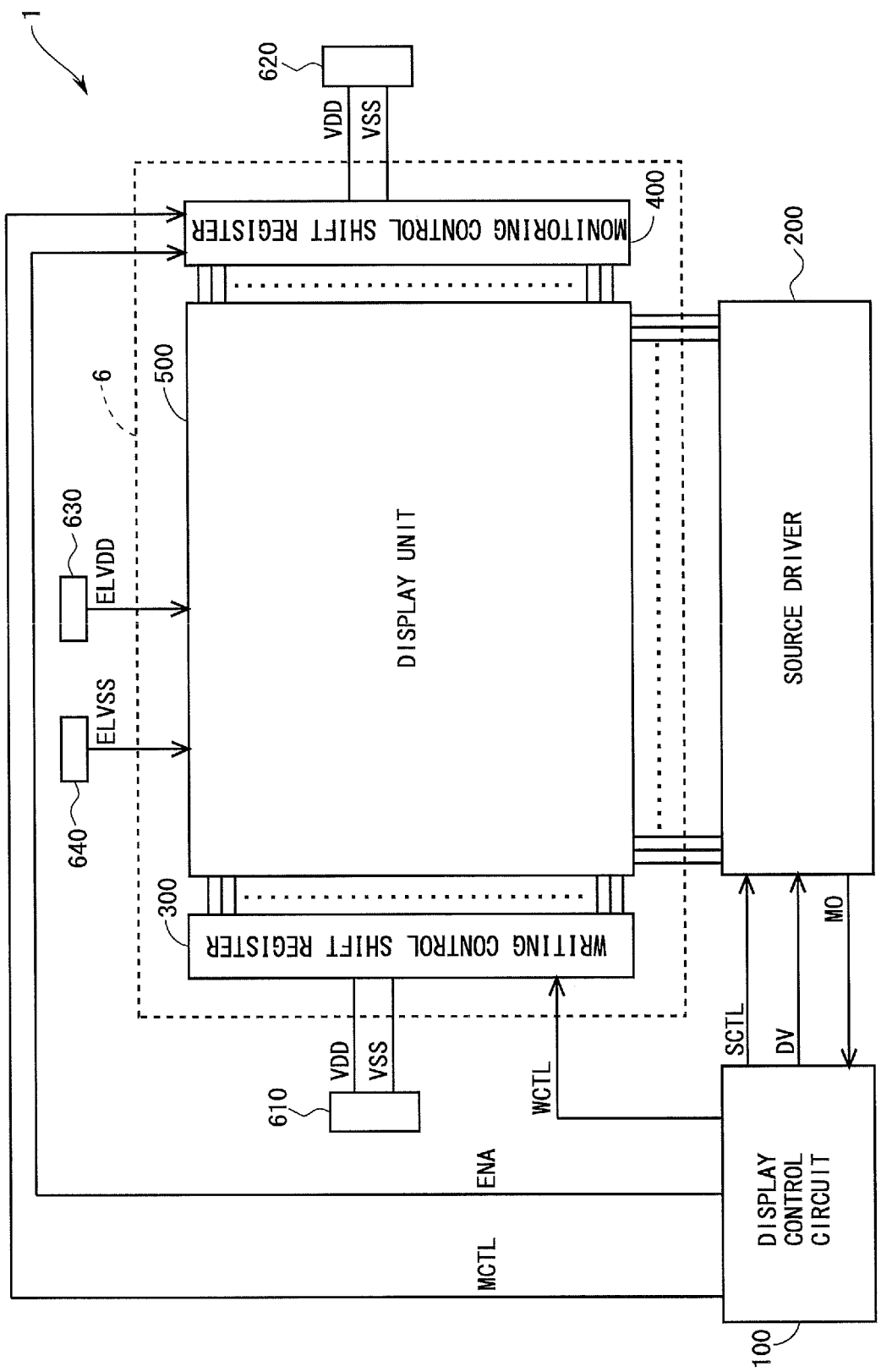
FIG. 2 is a block diagram showing an overall configuration of the organic EL display device in the first embodiment.
Figure 3:
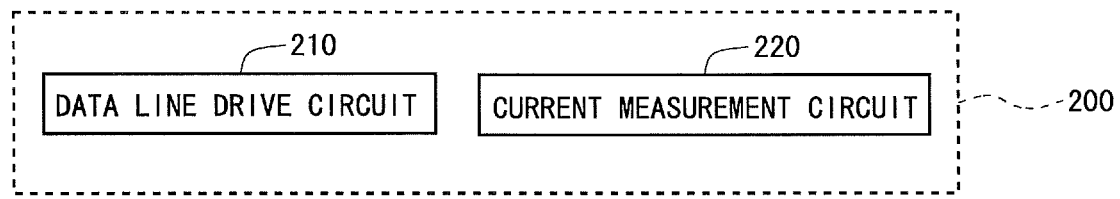
FIG. 3 is a diagram for describing an outline of a source driver in the first embodiment.

FIG. 2 is a block diagram showing an overall configuration of an active matrix-type organic EL display device 1 according to a first embodiment of the present invention. The organic EL display device 1 includes a display control circuit 100, a source driver 200, a writing control shift register 300, a monitoring control shift register 400, and a display unit 500. As shown in FIG. 3, the source driver 200 includes a portion that functions as a data line drive circuit 210; and a portion that functions as a current measurement circuit 220. In the present embodiment, the writing control shift register 300 and the monitoring control shift register 400 are formed in an organic EL panel 6 including the display unit 500. That is, the writing control shift register 300 and the monitoring control shift register 400 are monolithic. In addition, the organic EL display device 1 is provided with a logic power supply 610, a logic power supply 620, an organic EL high-level power supply 630, and an organic EL low-level power supply 640 as components for supplying various types of power supply voltage to the organic EL panel 6. Note that, in the present embodiment, a drive control circuit is implemented by the display control circuit 100, and an amount-of-electricity measurement circuit is implemented by the current measurement circuit 220.

The logic power supply 610 supplies to the organic EL panel 6 a shift register high-level power supply voltage VDD and a shift register low-level power supply voltage VSS which are required for the operation of the writing control shift register 300. The logic power supply 620 supplies to the organic EL panel 6 a shift register high-level power supply voltage VDD and a shift register low-level power supply voltage VSS which are required for the operation of the monitoring control shift register 400. The organic EL high-level power supply 630 supplies to the organic EL panel 6 an organic EL high-level power supply voltage ELVDD which is a constant voltage. The organic EL low-level power supply 640 supplies to the organic EL panel 6 an organic EL low-level power supply voltage ELVSS which is a constant voltage.

Figure 4:
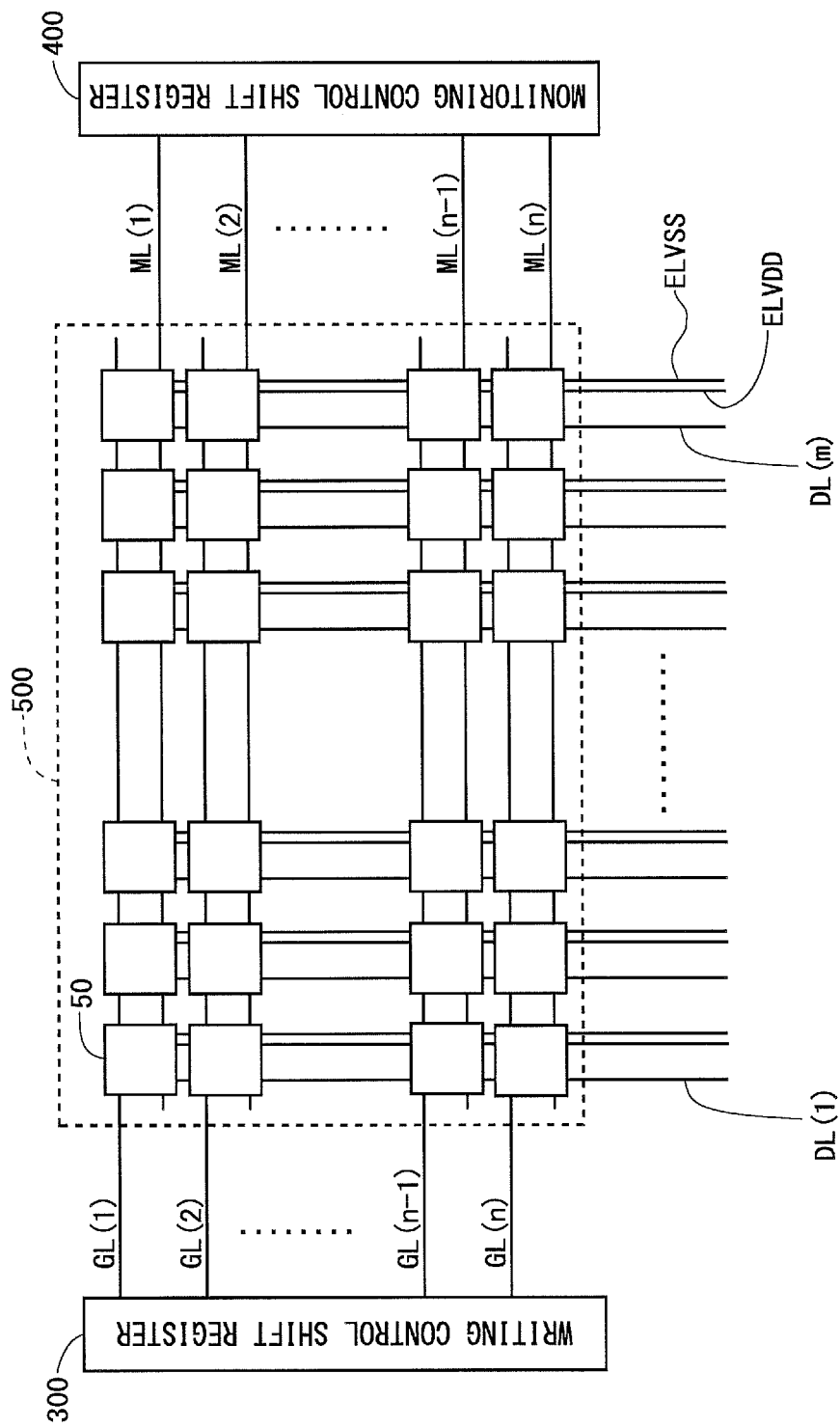
FIG. 4 is a diagram for describing a configuration of a display unit in the first embodiment.

FIG. 4 is a diagram for describing a configuration of the display unit 500 in the present embodiment. As shown in FIG. 4, in the display unit 500, n writing control lines GL(1) to GL(n) and m data lines DL(1) to DL(m) are disposed such that they intersect each other. As for the data lines DL(1) to DL(m), a data line for a red pixel, a data line for a green pixel, and a data line for a blue pixel are sequentially disposed. Pixel circuits 50 are provided at their corresponding intersections of the writing control lines GL(1) to GL(n) and the data lines DL(1) to DL(m). That is, in the display unit 500, the pixel circuits 50 are formed in a matrix form so as to form a plurality of rows (n rows) and a plurality of columns (m columns). In the display unit 500, n monitoring control lines ML(1) to ML(n) are also disposed such that they have a one-to-one correspondence with then writing control lines GL (1) to GL(n). Furthermore, in the display unit 500, organic EL high-level power supply lines ELVDD and organic EL low-level power supply lines ELVSS are disposed. A detailed configuration of the pixel circuits 50 will be described later.

Note that in the following, when the n writing control lines GL(1) to GL(n) do not need to be distinguished from each other, each of the writing control lines is simply represented by reference character GL. Likewise, each of the monitoring control lines and each of the data lines are simply represented by reference characters ML and DL, respectively. In addition, a signal provided to the writing control line GL is referred to as "writing control signal" and a signal provided to the monitoring control line ML is referred to as "monitoring control signal." The writing control signal is denoted by the same reference character GL as the writing control line. The monitoring control signal is denoted by the same reference character ML as the monitoring control line.

The display control circuit 100 controls the operation of the source driver 200 by providing digital video signals DV and source control signals SCTL to the source driver 200, controls the operation of the writing control shift register 300 by providing control signals WCTL to the writing control shift register 300, and controls the operation of the monitoring control shift register 400 by providing control signals MCTL and a monitoring enable signal ENA to the monitoring control shift register 400. The source control signals SCTL include a source start pulse signal, a source clock signal, a latch strobe signal, and an input/output control signal DWT. The control signals WCTL include a writing start pulse signal and two-phase clock signals (a clock signal GCK1 and a clock signal GCK2). The control signals MCTL include a monitoring start pulse signal and two-phase clock signals (a clock signal MCK1 and a clock signal MCK2). Note that the monitoring enable signal ENA is a signal for controlling whether to allow drive current measurement. The display control circuit 100 also receives monitored data MO which is provided from the source driver 200, and updates, using the monitored data MO, correction data which is used to correct video signals (the original data of the above-described digital video signals DV) transmitted from an external source. Note that the monitored data MO is data measured to obtain TFT characteristics or OLED characteristics.

The source driver 200 selectively performs the operation of driving the data lines DL(1) to DL(m) (operation as the data line drive circuit 210) and the operation of measuring drive currents outputted to the data lines DL(1) to DL(m) from pixel circuits 50 (operation as the current measurement circuit 220). The source driver 200 performs the following operation when functioning as the data line drive circuit 210. The source driver 200 receives the source control signals SCTL and digital video signals DV transmitted from the display control circuit 100, and applies driving video signals to the data lines DL(1) to DL(m). At this time, the source driver 200 sequentially holds a digital video signal DV indicating a voltage to be applied to each data line DL, at timing at which a pulse of the source clock signal occurs and using a pulse of the source start pulse signal as a trigger. Then, the held digital video signals DV are converted into analog voltages at timing at which a pulse of the latch strobe signal occurs. The converted analog voltages are simultaneously applied to all data lines DL(1) to DL(m), as driving video signals. When the source driver 200 functions as the current measurement circuit 220, the source driver 200 outputs, as monitored data MO, voltages determined depending on drive currents which are outputted to the data lines DL(1) to DL(m) from pixel circuits 50.

The writing control shift register 300 drives the n writing control lines GL(1) to GL(n), based on the control signals WCTL transmitted from the display control circuit 100. The monitoring control shift register 400 drives the n monitoring control lines ML(1) to ML(n), based on the control signals MCTL and monitoring enable signal ENA transmitted from the display control circuit 100. Note that a detailed drive method for the writing control lines GL and the monitoring control lines ML will be described later.

By each component operating in the above-described manner to drive the data lines DL(1) to DL(m), the writing control lines GL (1) to GL(n), and the monitoring control lines ML(1) to ML(n), an image is displayed on the display unit 500. At that time, video signals are corrected based on the results of measurement of drive currents. As a result, degradation of the drive transistors is compensated for. Note that, in the present embodiment, as such, a configuration for compensating for degradation of the drive transistors is described as an example, but a configuration for compensating for degradation of circuit elements (e.g., the organic EL elements) other than the drive transistors can also be adopted.

1.2 Pixel Circuit and Source Driver

Figure 5:
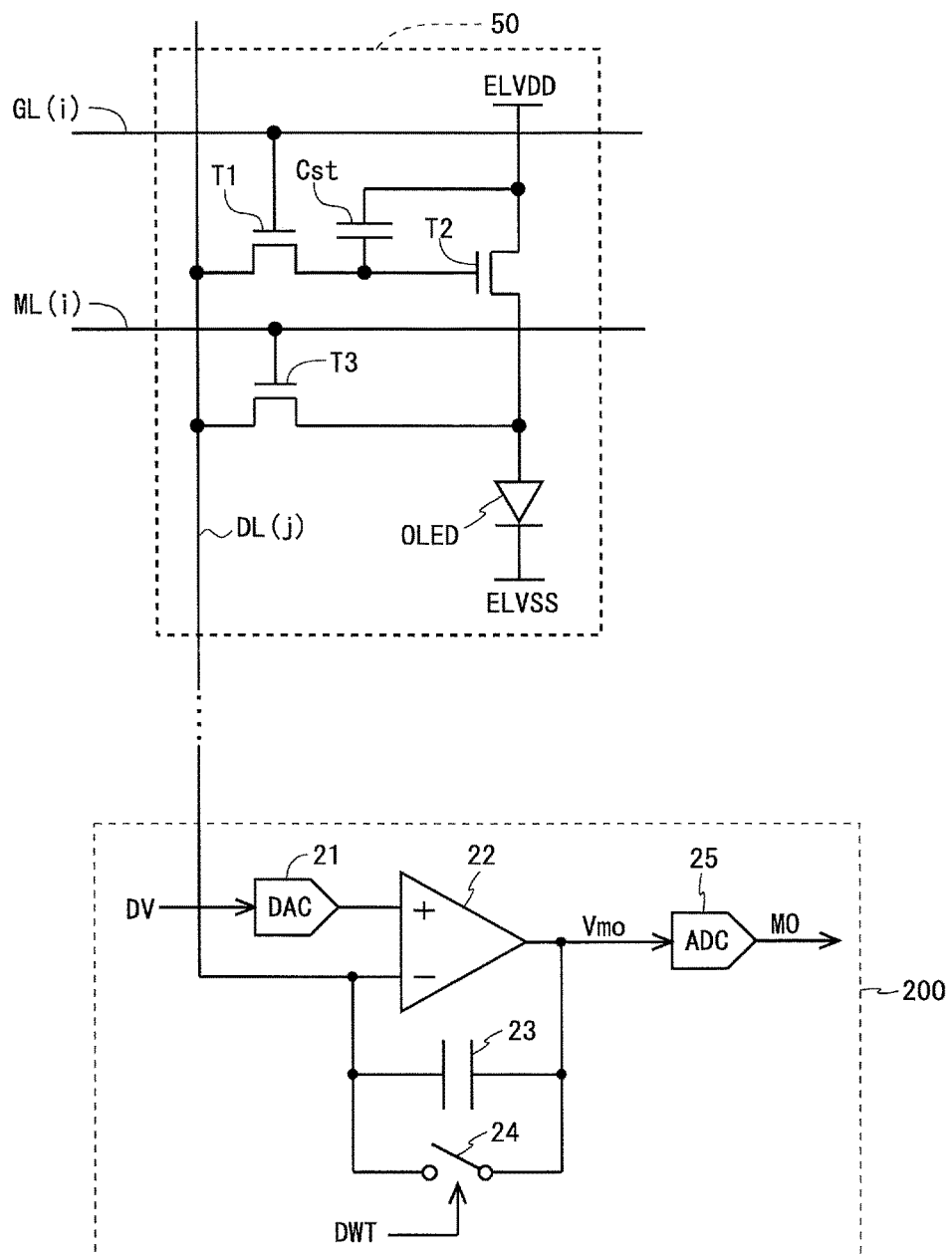
FIG. 5 is a circuit diagram showing a pixel circuit and a part of the source driver in the first embodiment.

FIG. 5 is a circuit diagram showing a pixel circuit 50 and a part of the source driver 200. FIG. 5 shows a pixel circuit 50 of an ith row and a jth column and a portion of the source driver 200 corresponding to a data line DL(j) of the jth column. The pixel circuit 50 includes one organic EL element (electro-optical element) OLED, three transistors T1 to T3, and one capacitor Cst. The transistor T1 functions as an input transistor (writing control transistor) that selects a pixel, the transistor T2 functions as a drive transistor that controls the supply of a current to the organic EL element OLED, and the transistor T3 functions as a monitoring control transistor that controls whether to perform current measurement for detecting the characteristics of the transistor T2 (drive transistor).

The transistor T1 is provided between the data line DL (j) and a gate terminal of the transistor T2. The transistor T1 has a gate terminal connected to a writing control line GL(i); and a source terminal connected to the data line DL(j). The transistor T2 is provided in series with the organic EL element OLED. The transistor T2 has the gate terminal connected to a drain terminal of the transistor T1; a drain terminal connected to the organic EL high-level power supply line ELVDD; and a source terminal connected to an anode terminal of the organic EL element OLED. The transistor T3 has a gate terminal connected to a monitoring control line ML(i); a drain terminal connected to the anode terminal of the organic EL element OLED; and a source terminal connected to the data line DL(j). The capacitor Cst has one end connected to the gate terminal of the transistor T2; and the other end connected to the drain terminal of the transistor T2. A cathode terminal of the organic EL element OLED is connected to the organic EL low-level power supply line ELVSS.

In the present embodiment, the transistors T1 to T3 in the pixel circuit 50 are all of an n-channel type. In addition, in the present embodiment, for the transistors T1 to T3, an oxide TFT (a thin-film transistor using an oxide semiconductor as a channel layer) is adopted, which also applies to the transistors in the writing control shift register 300 and the transistors in the monitoring control shift register 400.

An oxide semiconductor layer included in an oxide TFT will be described below. The oxide semiconductor layer is, for example, an In—Ga—Zn—O-based semiconductor layer. The oxide semiconductor layer includes, for example, an In—Ga—Zn—O-based semiconductor. The In—Ga—Zn—O-based semiconductor is a ternary oxide of indium (In), gallium (Ga), and zinc (Zn). The proportions (composition ratio) of In, Ga, and Zn are not particularly limited. For example, the proportions may be such that In:Ga:Zn=2:2:1, In:Ga:Zn=1:1:1, or In:Ga:Zn=1:1:2.

A TFT having an In—Ga—Zn—O-based semiconductor layer has high mobility (mobility exceeding 20 times that of an amorphous silicon TFT) and a low leakage current (a leakage current less than $1/100$ compared to an amorphous silicon TFT), and thus is suitably used as a drive TFT (the above-described transistor T2) and as a switching TFT (the above-described transistor T1) in a pixel circuit. By using TFTs having an In—Ga—Zn—O-based semiconductor layer, the power consumption of a display device can be significantly reduced.

The In—Ga—Zn—O-based semiconductor may be amorphous and may include crystalline portions and have crystalline properties. As the crystalline In—Ga—Zn—O-based semiconductor, a crystalline In—Ga—Zn—O-based semiconductor, in which a c-axis is oriented substantially perpendicular to a layer surfaces, is preferable. A crystalline structure of such an In—Ga—Zn—O-based semiconductor is disclosed in, for example, Japanese Laid-Open Patent Publication No. 2012-134475.

The oxide semiconductor layer may include other oxide semiconductors instead of an In—Ga—Zn—O-based semiconductor. For example, the oxide semiconductor layer may include a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semiconductor, an In—Sn—Zn—O-based semiconductor (e.g., $In_2O_3$—$SnO_2$—ZnO), an In—Ga—Sn—O-based semiconductor, etc.

As shown in FIG. 5, the source driver 200 includes a DA converter 21, an operational amplifier 22, a capacitor 23, a switch 24, and an AD converter 25. A digital video signal DV is provided to an input terminal of the DA converter 21. The DA converter 21 converts the digital video signal DV into an analog data voltage. An output terminal of the DA converter 21 is connected to a non-inverting input terminal of the operational amplifier 22. Therefore, the data voltage is provided to the non-inverting input terminal of the operational amplifier 22. An inverting input terminal of the operational amplifier 22 is connected to the data line DL(j). The switch 24 is provided between the inverting input terminal and output terminal of the operational amplifier 22. The capacitor 23 is provided in parallel with the switch 24 and between the inverting input terminal and output terminal of the operational amplifier 22. The input/output control signal DWT included in source control signals SCTL is provided to a control terminal of the switch 24. The output terminal of the operational amplifier 22 is connected to an input terminal of the AD converter 25.

In a configuration such as that described above, when the input/output control signal DWT is at a high level, the switch 24 goes into an on state, and the inverting input terminal and output terminal of the operational amplifier 22 are short-circuited. At this time, the operational amplifier 22 functions as a buffer amplifier. By this, the data voltage provided to the non-inverting input terminal of the operational amplifier 22 is applied to the data line DL(j). When the input/output control signal DWT is at a low level, the switch 24 goes into an off state, and the inverting input terminal and output terminal of the operational amplifier 22 are connected to each other through the capacitor 23. At this time, the operational amplifier 22 and the capacitor 23 function as an integrating circuit. By this, the output voltage (monitored voltage Vmo) from the operational amplifier 22 becomes a voltage of a magnitude determined depending on a drive current that is outputted to the data line DL (j) from the pixel circuit 50. The AD converter 25 converts the output voltage (monitored voltage Vmo) from the operational amplifier 22 into monitored data MO which is digital data. In the present embodiment, the input/output control signal DWT goes to a low level during a measurement period which will be described later, and goes to a high level during a period other than the measurement period.

1.3 Configuration of the Writing Control Shift Register

Figure 6:
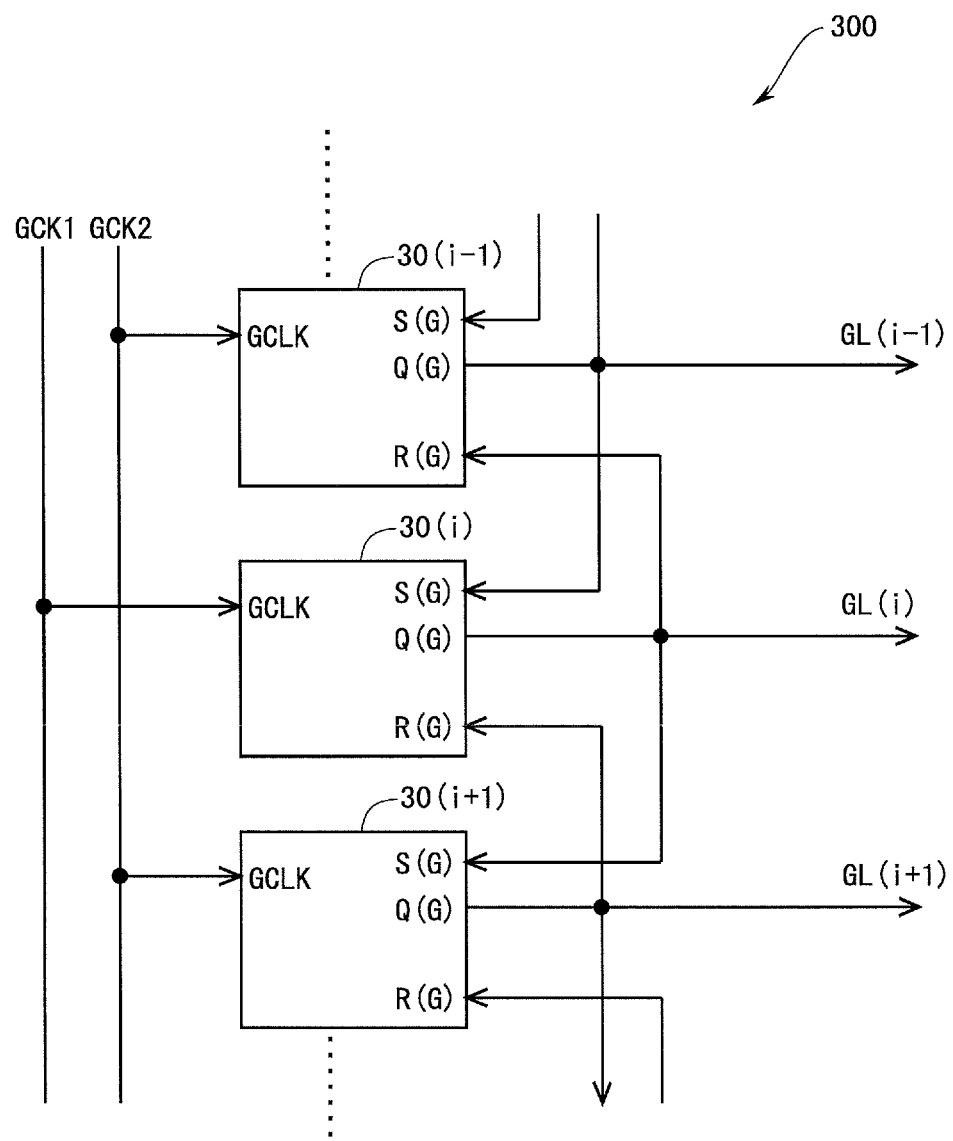
FIG. 6 is a block diagram showing a configuration of a writing control shift register in the first embodiment.

FIG. 6 is a block diagram showing a configuration of the writing control shift register 300 in the present embodiment. The writing control shift register 300 is composed of n stages (n unit circuits). That is, the writing control shift register 300 includes n unit circuits such that they have a one-to-one correspondence with the n writing control lines GL(1) to GL(n) in the display unit 500. Note that each of the unit circuits in the writing control shift register 300 is hereinafter referred to as "first unit circuit." FIG. 6 only shows first unit circuits 30(i−1) to 30(i+1) that form an (i−1)th stage to an (i+1)th stage. For convenience of description, it is assumed that i is an even number. The first unit circuit 30 is provided with an input terminal for receiving a clock signal GCLK; an input terminal for receiving a set signal S(G); an input terminal for receiving a reset signal R(G); and an output terminal for outputting an output signal Q(G).

As for FIG. 6, signals to be provided to the input terminals of each stage (each first unit circuit 30) in the writing control shift register 300 are as follows. For the odd-numbered stages, a clock signal GCK2 is provided as a clock signal GCLK. For the even-numbered stages, a clock signal GCK1 is provided as a clock signal GCLK. In addition, for any stage, an output signal Q(G) outputted from the previous stage is provided as a set signal S(G), and an output signal Q(G) outputted from the subsequent stage is provided as a reset signal R(G). Note, however, that for the first stage (not shown in FIG. 6), a writing start pulse signal is provided as a set signal S(G). Note that a shift register low-level power supply voltage VSS (not shown in FIG. 6) is provided to all stages in a shared manner.

In addition, an output signal Q(G) is outputted from each stage (each first unit circuit 30) in the writing control shift register 300. An output signal Q(G) outputted from each stage is provided as a writing control signal GL to a corresponding writing control line GL, and provided as a reset signal R(G) to the previous stage and provided as a set signal S(G) to the subsequent stage.

Figure 7:
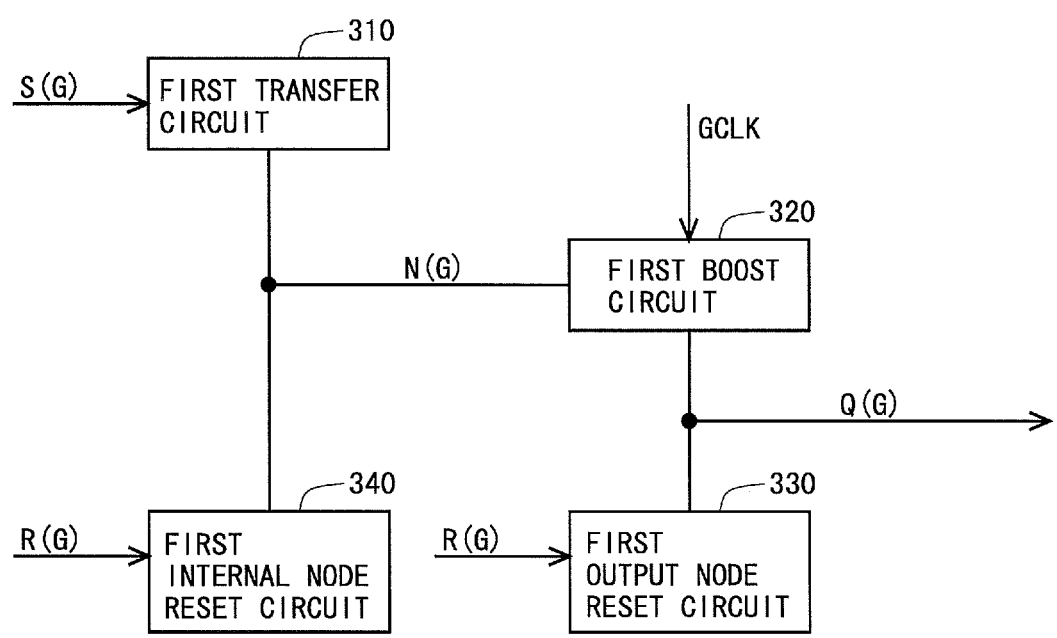
FIG. 7 is a block diagram showing a schematic configuration of a first unit circuit (a unit circuit in the writing control shift register) in the first embodiment.

FIG. 7 is a block diagram showing a schematic configuration of a first unit circuit 30 (a unit circuit in the writing control shift register 300) in the present embodiment. Note that the components in the first unit circuit 30 are given the word "first" in order to distinguish them from the components in a second unit circuit 40 which will be described later. As shown in FIG. 7, the first unit circuit 30 includes a first transfer circuit 310, a first boost circuit 320, a first output node reset circuit 330, and a first internal node reset circuit 340. Note that a node between the first transfer circuit 310, the first boost circuit 320, and the first internal node reset circuit 340 is referred to as a "first internal node." The first internal node is denoted by reference character N(G).

The function of each component in the first unit circuit 30 will be described. The first transfer circuit 310 brings the voltage level at the first internal node N(G) to a high level by transferring the set signal S(G) to the first internal node N(G) when the set signal S(G) is at a high level. The first boost circuit 320 boosts the first internal node N(G) based on a clock signal GCLK, and thereby makes the voltage level of an output signal Q (G) equal to the voltage level of the clock signal GCLK. The first output node reset circuit 330 brings the output signal Q (G) into a reset state (low-level state) based on a reset signal R(G). The first internal node reset circuit 340 brings the first internal node N(G) into a reset state (low-level state) based on the reset signal R(G). Note that although the reset signal R(G) is provided to the first output node reset circuit 330 and the first internal node reset circuit 340 in the present embodiment, it is also possible to adopt a configuration in which a clock signal is provided to both or one of the first output node reset circuit 330 and the first internal node reset circuit 340.

Figure 8:
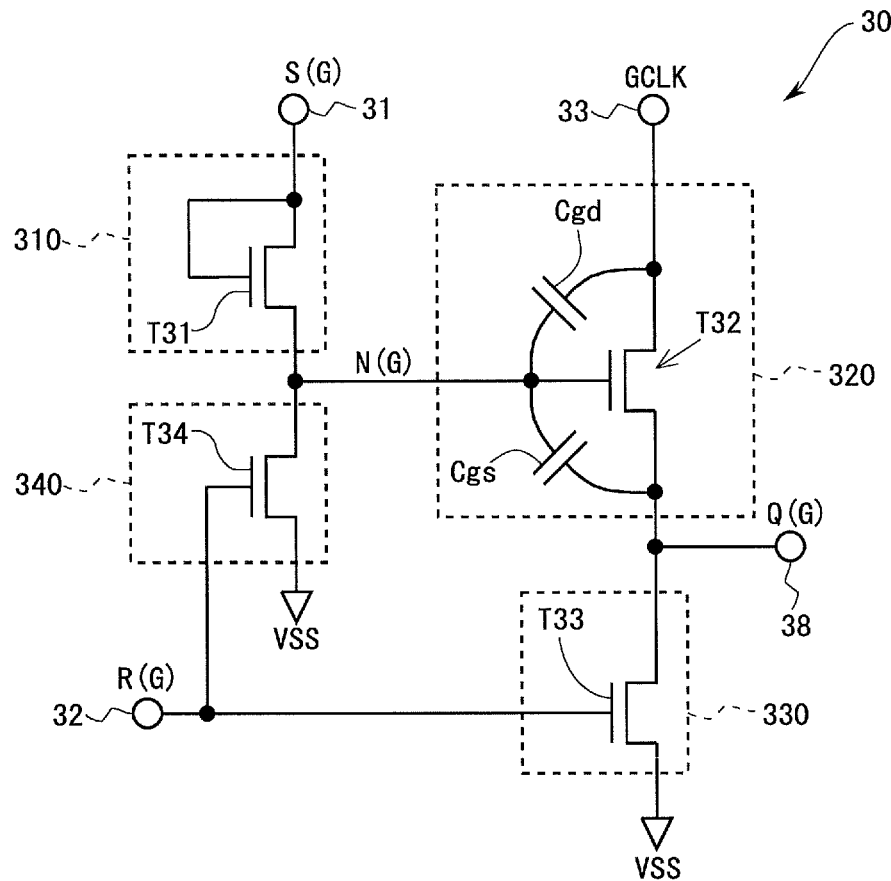
FIG. 8 is a circuit diagram showing a detailed configuration of the first unit circuit in the first embodiment.

FIG. 8 is a circuit diagram showing a detailed configuration of a first unit circuit 30 in the present embodiment. As shown in FIG. 8, the first unit circuit 30 includes four transistors T31 to T34. In addition, the first unit circuit 30 has three input terminals 31 to 33 and one output terminal 38, in addition to input terminals for a shift register low-level power supply voltage VSS. Here, the input terminal that receives a set signal S(G) is denoted by reference character 31, the input terminal that receives a reset signal R(G) is denoted by reference character 32, and the input terminal that receives a clock signal GCLK is denoted by reference character 33. In addition, the output terminal that outputs an output signal Q (G) is denoted by reference character 38. The output terminal 38 corresponds to the first output node. A parasitic capacitance Cgd is formed between the gate terminal and drain terminal of the transistor T32, and a parasitic capacitance Cgs is formed between the gate terminal and source terminal of the transistor T32. A source terminal of the transistor T31, the gate terminal of the transistor T32, and a drain terminal of the transistor T34 are connected to each other through a first internal node N(G). Note that, in the present embodiment, a first signal output circuit is implemented by the transistor T32 (first boost circuit 320) and the output terminal 38.

The transistor T31 has a gate terminal and a drain terminal that are connected to the input terminal 31 (that is, diode-connected); and the source terminal connected to the first internal node N(G). The transistor T32 has the gate terminal connected to the first internal node N(G); the drain terminal connected to the input terminal 33; and the source terminal connected to the output terminal 38. The transistor T33 has a gate terminal connected to the input terminal 32; a drain terminal connected to the output terminal 38; and a source terminal connected to the input terminal for a shift register low-level power supply voltage VSS. The transistor T34 has a gate terminal connected to the input terminal 32; the drain terminal connected to the first internal node N(G); and a source terminal connected to the input terminal for a shift register low-level power supply voltage VSS.

Next, the function of each component in the first unit circuit 30 will be described. The transistor T31 changes the voltage level at the first internal node N(G) to a high level when the set signal S(G) goes to a high level. The transistor T32 provides the voltage level of the clock signal GCLK to the output terminal 38 when the first internal node N(G) goes into a boosted state (details will be described later). The transistor T33 changes the voltage level at the output terminal 38 to the voltage level of the shift register low-level power supply voltage VSS when the reset signal R(G) goes to a high level. The transistor T34 changes the voltage level at the first internal node N(G) to the voltage level of the shift register low-level power supply voltage VSS when the reset signal R(G) goes to a high level. As described above, the first transfer circuit 310 is implemented by the transistor T31, the first boost circuit 320 is implemented by the transistor T32, the first output node reset circuit 330 is implemented by the transistor T33, and the first internal node reset circuit 340 is implemented by the transistor T34.

Figure 9:
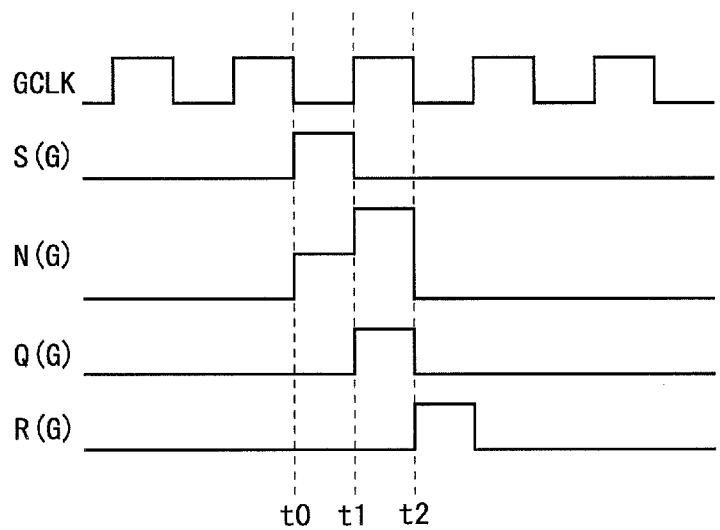
FIG. 9 is a timing chart for describing the basic operation of the first unit circuit in the first embodiment.

With reference to FIG. 9, the basic operation of the first unit circuit 30 will be described. As shown in FIG. 9, during a period prior to time point t0, the voltage level at the first internal node N(G) and the voltage level of the output signal Q(G) (the voltage level at the output terminal 38) are at a low level. In addition, the clock signal GCLK that goes to a high level every predetermined period is provided to the input terminal 33. Note that, regarding FIG. 9, although the actual waveforms have some delay, ideal waveforms are shown here.

When reaching time point to, a pulse of the set signal S(G) is provided to the input terminal 31. Since, the transistor T31 is diode-connected as shown in FIG. 8, the transistor T31 goes into an on state by the pulse of the set signal S(G). By this, the voltage level at the first internal node N(G) increases.

When reaching time point t1, the clock signal GCLK changes from a low level to a high level. At this time, since the reset signal R(G) is at a low level, the transistor T34 is in an off state. In addition, since the set signal S(G) is changed from a high level to a low level, the transistor T31 is also in an off state. Therefore, the first internal node N(G) is in a floating state. As described above, the parasitic capacitance Cgd is formed between the gate terminal and drain terminal of the transistor T32, and the parasitic capacitance Cgs is formed between the gate terminal and source terminal of the transistor T32. By the above, due to the bootstrap effect caused by the clock signal GCLK changing from a low level to a high level, the voltage level at the first internal node N(G) greatly increases (the first internal node N(G) goes into a boosted state). As a result, a large voltage is applied to the transistor T32. By this, the voltage level of the output signal Q(G) (the voltage level at the output terminal 38) increases to the voltage level of a high level of the clock signal GCLK. Note that, during a period from time point t1 to time point t2, the reset signal R(G) is at a low level, and thus, the transistor T33 and the transistor T34 are maintained in an off state. Therefore, the voltage level of the output signal Q (G) and the voltage level at the first internal node N(G) do not decrease during this period.

When reaching time point t2, the clock signal GCLK changes from a high level to a low level. By this, the voltage level of the output signal Q(G) decreases with a decrease in the voltage level at the input terminal 33, and furthermore the voltage level at the first internal node N(G) also decreases through the parasitic capacitances Cgd and Cgs. In addition, at time point t2, a pulse of the reset signal R(G) is provided to the input terminal 32. By this, the transistor T33 and the transistor T34 go into an on state. By the transistor T33 going into an on state, the voltage level of the output signal Q(G) decreases to a low level, and by the transistor T34 going into an on state, the voltage level at the first internal node N(G) decreases to a low level.

Note that the configuration of the first unit circuit 30 is not limited to that shown in FIG. 8 (a configuration including the four transistors T31 to T34). In general, in order to achieve an improvement in drive performance and an improvement in reliability, the first unit circuit 30 includes more than four transistors. The present invention can also be applied to such a case.

1.4 Configuration of the Monitoring Control Shift Register

Figure 10:
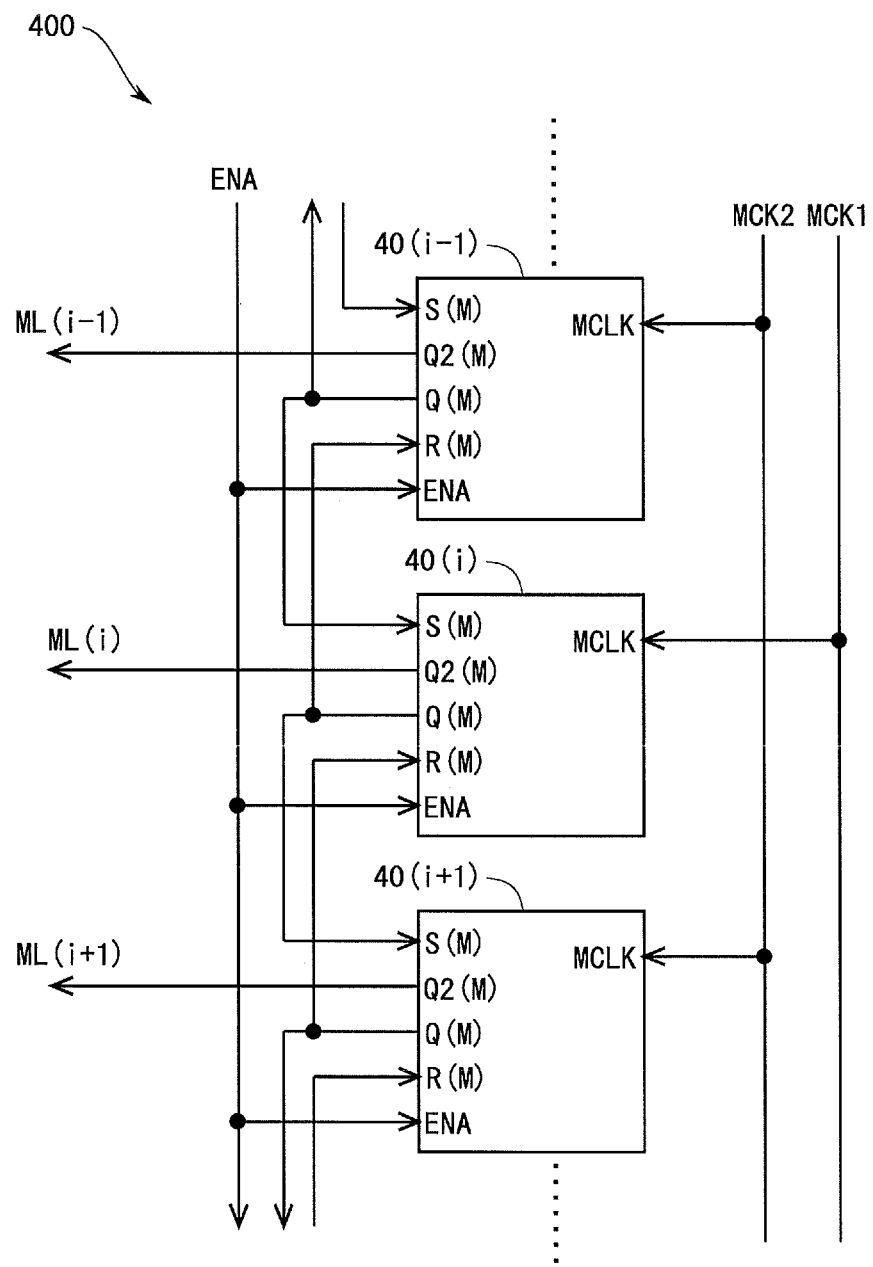
FIG. 10 is a block diagram showing a configuration of a monitoring control shift register in the first embodiment.

FIG. 10 is a block diagram showing a configuration of the monitoring control shift register 400 in the present embodiment. The monitoring control shift register 400 is composed of n stages (n unit circuits). That is, the monitoring control shift register 400 includes n unit circuits such that they have a one-to-one correspondence with the n monitoring control lines ML(1) to ML(n) in the display unit 500. Note that each of the unit circuits in the monitoring control shift register 400 is hereinafter referred to as "second unit circuit." FIG. 10 only shows second unit circuits 40(i−1) to 40(i+1) that form an (i−1)th stage to an (i+1)th stage. For convenience of description, it is assumed that i is an even number. The second unit circuit 40 is provided with an input terminal for receiving a clock signal MCLK; an input terminal for receiving a set signal S(M); an input terminal for receiving a reset signal R(M); an output terminal for outputting an output signal Q(M); an output terminal for outputting an output signal Q2(M); and an input terminal for receiving a monitoring enable signal ENA.

As for FIG. 10, signals to be provided to the input terminals of each stage (second unit circuit 40) in the monitoring control shift register 400 are as follows. For the odd-numbered stages, a clock signal MCK2 is provided as a clock signal MCLK. For the even-numbered stages, a clock signal MCK1 is provided as a clock signal MCLK. In addition, for any stage, an output signal Q(M) outputted from the previous stage is provided as a set signal S(M), and an output signal Q(M) outputted from the subsequent stage is provided as a reset signal R(M). Note, however, that for the first stage (not shown in FIG. 10), a monitoring start pulse signal is provided as a set signal S(M). Note that the monitoring enable signal ENA and a shift register low-level power supply voltage VSS (not shown in FIG. 10) are provided to all stages in a shared manner.

In addition, an output signal Q(M) and an output signal Q2(M) are outputted from each stage (each second unit circuit 40) in the monitoring control shift register 400. An output signal Q(M) outputted from each stage is provided as a reset signal R(M) to the previous stage, and provided as a set signal S(M) to the subsequent stage. An output signal Q2(M) outputted from each stage is provided as a monitoring control signal ML to a corresponding monitoring control line ML.

Figure 11:
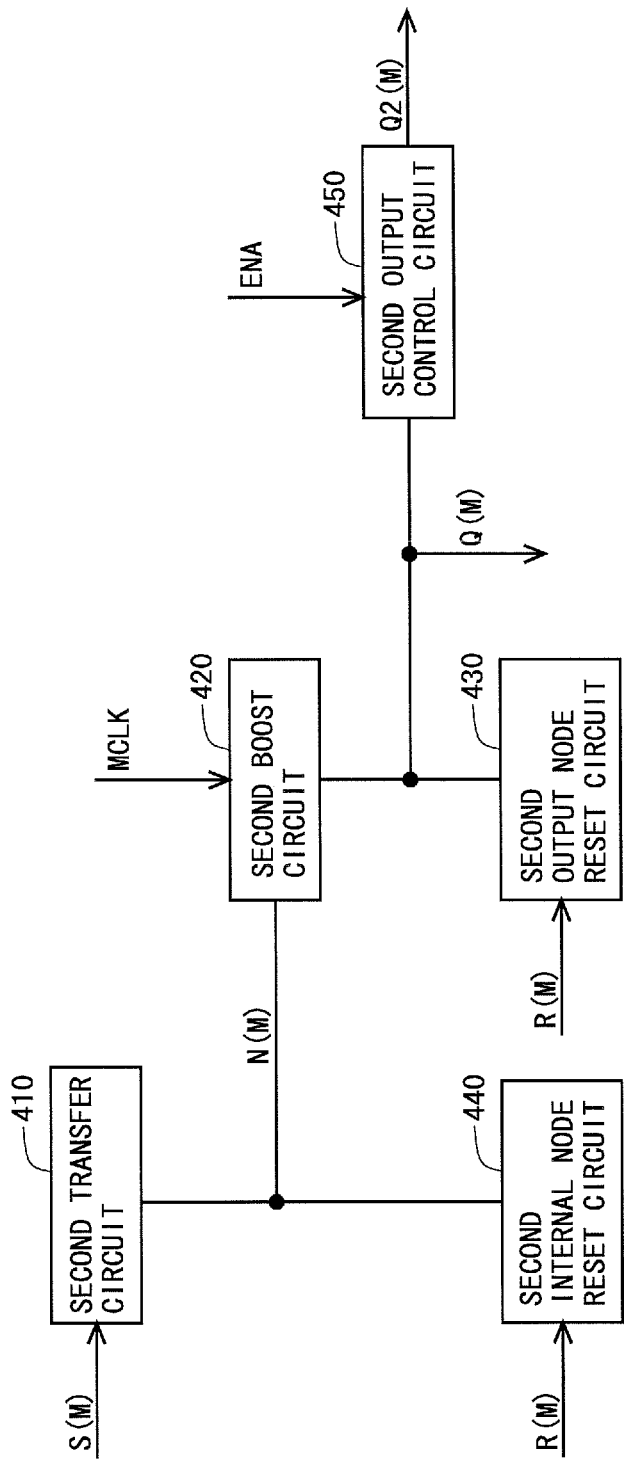
FIG. 11 is a block diagram showing a schematic configuration of a second unit circuit (a unit circuit in the monitoring control shift register) in the first embodiment.

FIG. 11 is a block diagram showing a schematic configuration of a second unit circuit 40 (a unit circuit in the monitoring control shift register 400) in the present embodiment. Note that the components in the second unit circuit 40 are given the word "second" in order to distinguish them from the components in the first unit circuit 30. As shown in FIG. 11, the second unit circuit 40 includes a second transfer circuit 410, a second boost circuit 420, a second output node reset circuit 430, a second internal node reset circuit 440, and a second output control circuit 450. Note that a node between the second transfer circuit 410, the second boost circuit 420, and the second internal node reset circuit 440 is referred to as "second internal node." The second internal node is denoted by reference character N(M).

The function of each component in the second unit circuit 40 will be described. The second transfer circuit 410 brings the voltage level at the second internal node N(M) to a high level by transferring the set signal S(M) to the second internal node N(M) when the set signal S(M) is at a high level. The second boost circuit 420 boosts the second internal node N(M) based on a clock signal MCLK, and thereby makes the voltage level of an output signal Q(M) equal to the voltage level of the clock signal MCLK. The second output node reset circuit 430 brings the output signal Q(M) into a reset state based on a reset signal R(M). The second internal node reset circuit 440 brings the second internal node N(M) into a reset state based on the reset signal R(M). The second output control circuit 450 makes the voltage level of an output signal Q2(M) equal to the voltage level of the output signal Q(M) when a monitoring enable signal ENA is at a high level. Note that although the reset signal R(M) is provided to the second output node reset circuit 430 and the second internal node reset circuit 440 in the present embodiment, it is also possible to adopt a configuration in which a clock signal is provided to both or one of the second output node reset circuit 430 and the second internal node reset circuit 440.

Figure 12:
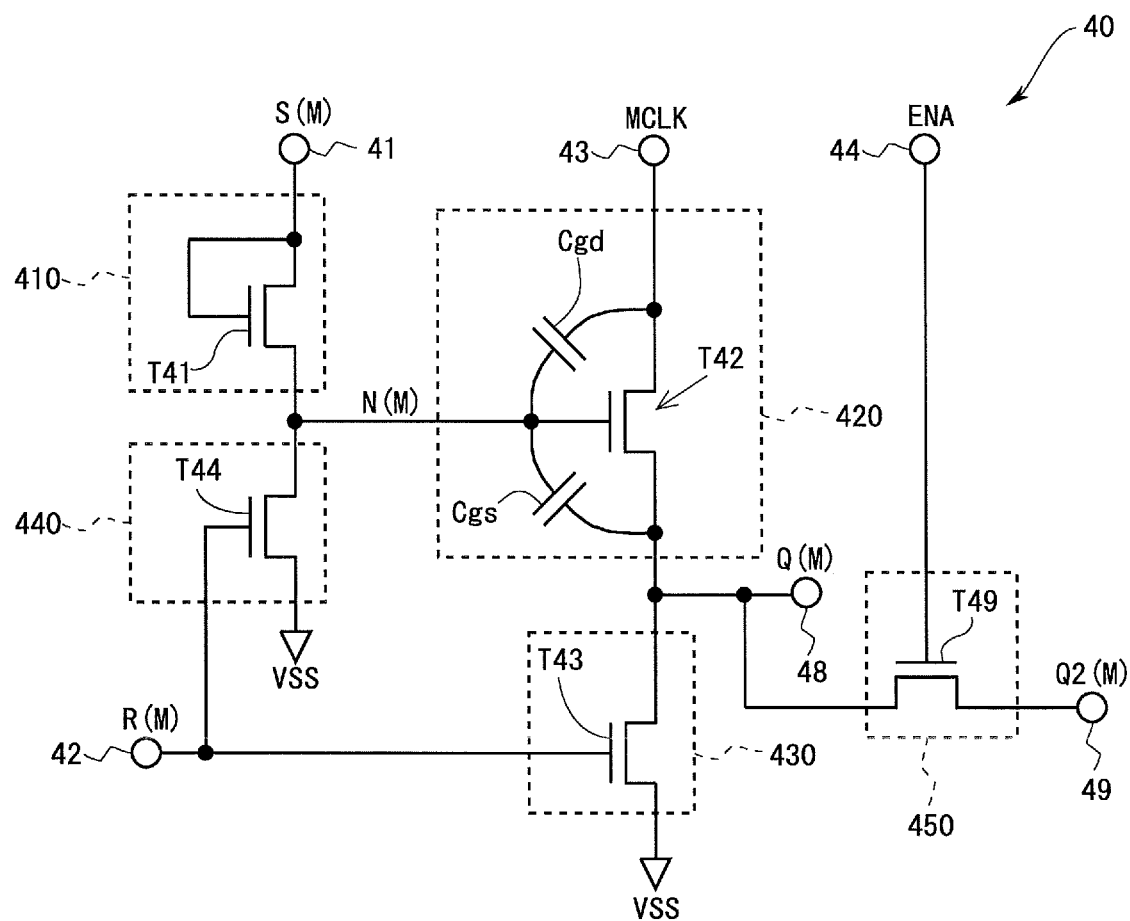
FIG. 12 is a circuit diagram showing a detailed configuration of the second unit circuit in the first embodiment.

FIG. 12 is a circuit diagram showing a detailed configuration of a second unit circuit 40 in the present embodiment. As shown in FIG. 12, the second unit circuit 40 includes five transistors T41 to T44 and T49. In addition, the second unit circuit 40 has four input terminals 41 to 44 and two output terminals 48 and 49, in addition to input terminals for a shift register low-level power supply voltage VSS. The transistors T41 to T44, the input terminals 41 to 43, and the output terminal 48 in FIG. 12 correspond to the transistors T31 to T34, the input terminals 31 to 33, and the output terminal 38 in FIG. 8, respectively. That is, the second unit circuit 40 has the same configuration as the first unit circuit 30 except for the following points.

The second unit circuit 40 is provided with the output terminal 49 different than the output terminal 48. The output terminal 49 corresponds to the second output node. The above-described output signal Q(M) is outputted from the output terminal 48, and the above-described output signal Q2(M) is outputted from the output terminal 49. In addition, the second unit circuit 40 is provided with the transistor T49 configured such that the drain terminal is connected to the output terminal 48, the source terminal is connected to the output terminal 49, and a monitoring enable signal ENA is provided to the gate terminal.

Note that the second transfer circuit 410 is implemented by the transistor T41, the second boost circuit 420 is implemented by the transistor T42, the second output node reset circuit 430 is implemented by the transistor T43, the second internal node reset circuit 440 is implemented by the transistor 144, and the second output control circuit 450 is implemented by the transistor T49. In addition, a second signal output circuit is implemented by the transistor T42 (the second boost circuit 420), the transistor T49 (the second output control circuit 450), and the output terminal 49.

Figure 13:
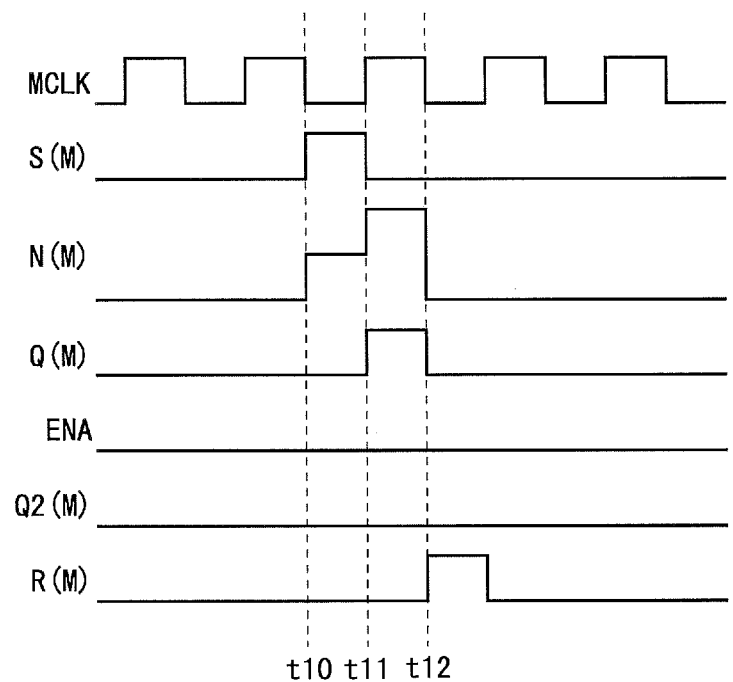
FIG. 13 is a timing chart for describing the basic operation of the second unit circuit 40 during a period other than a monitoring process period in the first embodiment.

With reference to FIG. 13, the basic operation of the second unit circuit 40 during a period other than a monitoring process period will be described. As shown in FIG. 13, during a period prior to time point t10, the voltage level at the second internal node N(M), the voltage level of the output signal Q(M) (the voltage level at the output terminal 48), and the voltage level of the output signal Q2(M) (the voltage level at the output terminal 49) are at a low level. In addition, the clock signal MCLK that goes to a high level every predetermined period is provided to the input terminal 43. Note that, regarding FIG. 13, although the actual waveforms have some delay, ideal waveforms are shown here.

When reaching time point t10, a pulse of the set signal S(M) is provided to the input terminal 41. Since the transistor 141 is diode-connected as shown in FIG. 12, the transistor T41 goes into an on state by the pulse of the set signal S(M). By this, the voltage level at the second internal node N(M) increases.

When reaching time point t11, the clock signal MCLK changes from a low level to a high level. At this time, since the reset signal R(M) is at a low level, the transistor 144 is in an off state. In addition, since the set signal S(M) is changed from a high level to a low level, the transistor T41 is also in an off state. Therefore, the second internal node N(M) is in a floating state. A parasitic capacitance Cgd is formed between the gate terminal and drain terminal of the transistor T42, and a parasitic capacitance Cgs is formed between the gate terminal and source terminal of the transistor 142. By the above, due to the bootstrap effect caused by the clock signal MCLK changing from a low level to a high level, the voltage level at the second internal node N(M) greatly increases. As a result, a large voltage is applied to the transistor T42. By this, the voltage level of the output signal Q(M) (the voltage level at the output terminal 48) increases to the voltage level of a high level of the clock signal MCLK. Here, during a period from time point t11 to time point t12, the monitoring enable signal ENA is at a low level. Hence, the transistor T49 is maintained in an off state. Therefore, the voltage level of the output signal Q2(M) (the voltage level at the output terminal 49) is maintained at a low level. Note that, during the period from time point t11 to time point t12, the reset signal R(M) is at a low level, and thus, the transistor 143 and the transistor 144 are maintained in an off state. Therefore, the voltage level of the output signal Q(M) and the voltage level at the second internal node N(M) do not decrease during this period.

When reaching time point t12, the clock signal MCLK changes from a high level to a low level. By this, the voltage level of the output signal Q(M) decreases with a decrease in the voltage level at the input terminal 43, and furthermore the voltage level at the second internal node N(M) also decreases through the parasitic capacitances Cgd and Cgs. In addition, at time point t12, a pulse of the reset signal R(M) is provided to the input terminal 42. By this, the transistor T43 and the transistor T44 go into an on state. By the transistor T43 going into an on state, the voltage level of the output signal Q(M) decreases to a low level, and by the transistor T44 going into an on state, the voltage level at the second internal node N(M) decreases to a low level.

1.5 Drive Method

Figure 14:
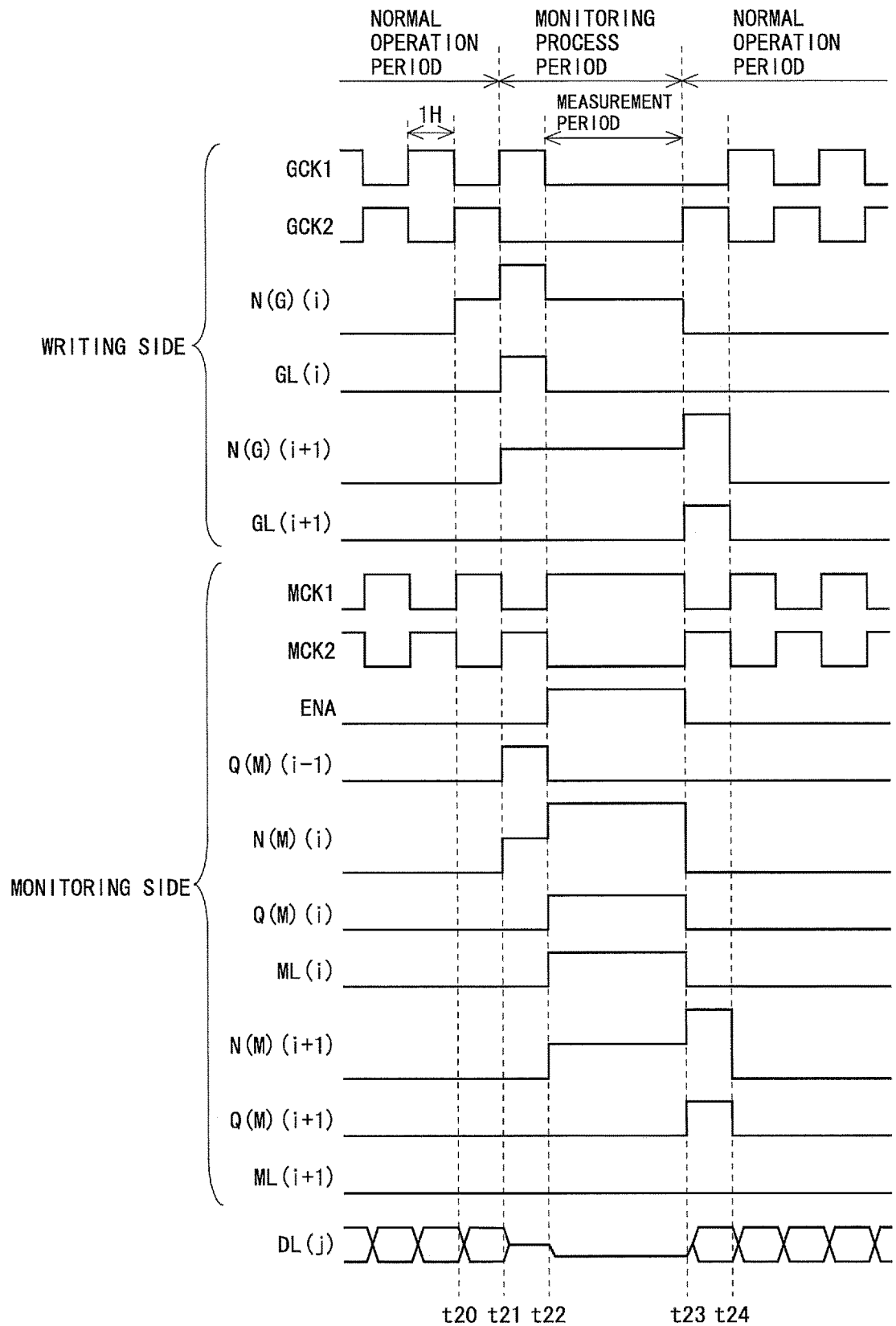
FIG. 14 is a timing chart for describing a method for driving writing control lines and monitoring control lines around a monitoring process period in the first embodiment.

With reference to FIG. 14, a method for driving writing control lines GL and monitoring control lines ML around a monitoring process period will be described. Here, it is assumed that an ith row is a monitored row. In FIG. 14, a period prior to time point t21 and a period after time point t23 are normal operation periods, and a period from time point t21 to time point t23 is a monitoring process period. A measurement period from time point t22 to time point t23 corresponds to an amount-of-electricity measurement period. Note that the normal operation period in the present embodiment is a period during which normal image display is performed on the display unit 500.

As can be grasped from FIG. 14, during the normal operation period, two-phase clock signals (a clock signal GCK1 and a clock signal GCK2) which alternately go to a high level every horizontal scanning period are provided to the writing control shift register 300 from the display control circuit 100, and two-phase clock signals (a clock signal MCK1 and a clock signal MCK2) which alternately go to a high level every horizontal scanning period are provided to the monitoring control shift register 400 from the display control circuit 100.

When a writing control signal GL(i−1) (not shown) for an (i−1)th row goes to a high level at time point t20, the voltage level at a first internal node N(G) (i) in the first unit circuit 30(*i*) changes from a low level to a high level since the writing control signal GL(i−1) is provided as a set signal S(G) to a first unit circuit 30(*i*).

When reaching time point t21, in the writing control shift register 300, the clock signal GCK1 changes from a low level to a high level. Since the clock signal GCK1 is provided as a clock signal GCLK to the first unit circuit 30(*i*), the first internal node N(G) (i) in the first unit circuit 30(*i*) goes into a boosted state, and a writing control signal GL(i) for the ith row changes from a low level to a high level. In addition, by the writing control signal GL(i) changing from a low level to a high level, the voltage level at a first internal node N(G) (i+1) in a first unit circuit 30(*i*+1) changes from a low level to a high level.

In addition, when reaching time point t21, in the monitoring control shift register 400, an output signal Q(M) (i−1) outputted from a second unit circuit 40(*i*−1) changes from a low level to a high level. Since the output signal Q(M) (i−1) is provided as a set signal S(M) to a second unit circuit 40(*i*), the voltage level at a second internal node N(M) (i) in the second unit circuit 40(*i*) changes from a low level to a high level. Note that, since a monitoring enable signal ENA is maintained at a low level at time point t21, a monitoring control signal ML(i−1) (not shown) for the (i−1)th row is maintained at a low level.

Figure 15:
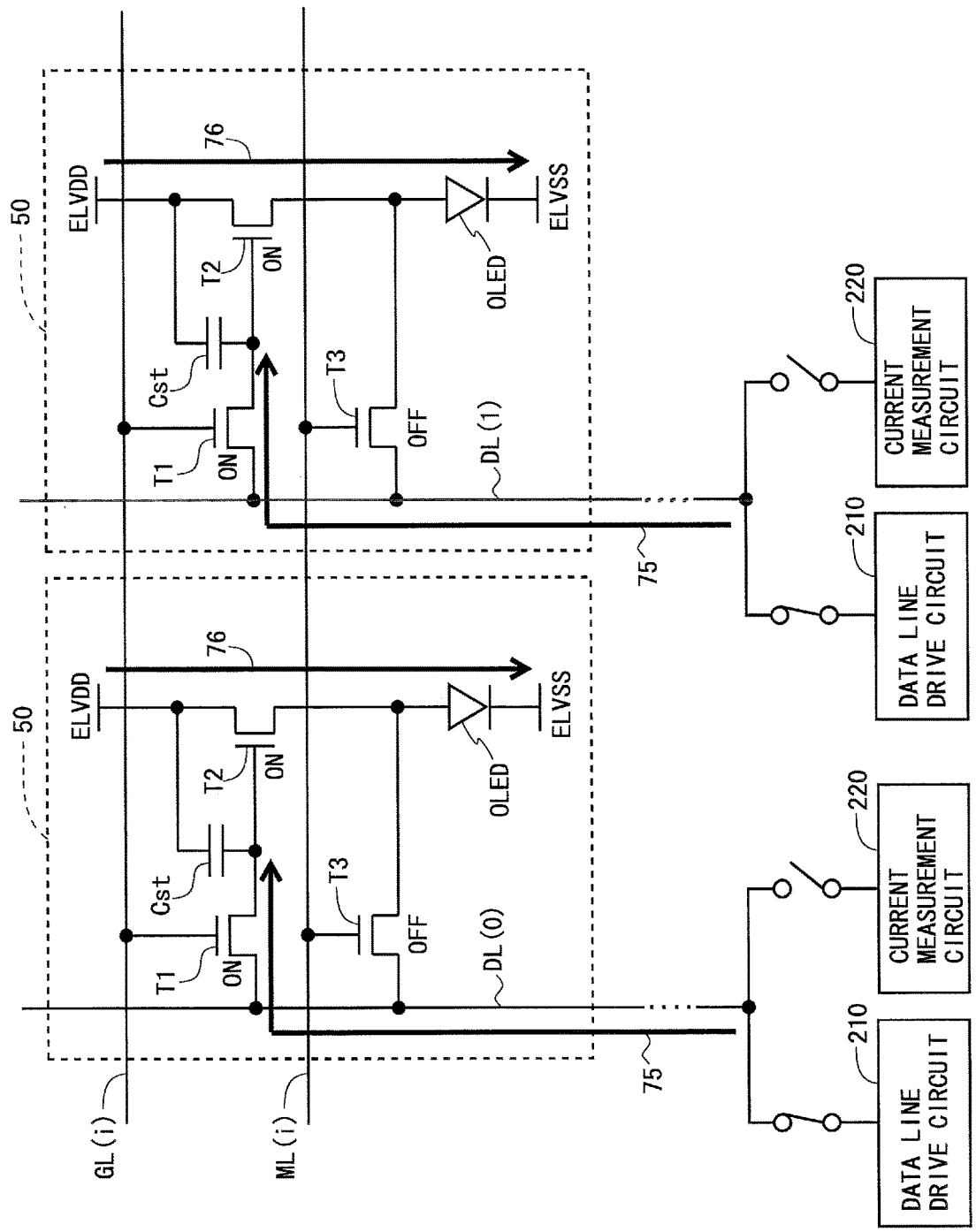
FIG. 15 is a diagram for describing the flow of currents in the first embodiment.

As described above, when reaching time point t21, a writing control line GL(i) of the ith row goes into a selected state. By this, in each pixel circuit 50 of the ith row, the transistor T1 goes into an on state. At this time, a measurement voltage (here, the measurement voltage is a voltage that brings the transistor T2 into an on state) is supplied to each data line DL from the data line drive circuit 210. Therefore, as indicated by an arrow denoted by reference character 75 in FIG. 15, a current is supplied into the pixel circuit 50 through the data line DL. By this, the capacitor Cst is charged based on the measurement voltage, and the transistor T2 goes into an on state. In addition, at time point t21, since a monitoring control line ML(i) of the ith row is in a non-selected state, in each pixel circuit 50 of the ith row, the transistor T3 is maintained in an off state. By the above, during a period from time point t21 to time point t22, as indicated by an arrow denoted by reference character 76 in FIG. 15, a drive current is supplied to the organic EL element OLED through the transistor T2. By this, the organic EL element OLED emits light at a luminance determined depending on the drive current.

When reaching time point t22, in the writing control shift register 300, the clock signal GCK1 changes from a high level to a low level. By this, the writing control signal GL(i) changes from a high level to a low level, and the voltage level at the first internal node N(G) (i) in the first unit circuit 30(*i*) decreases. Meanwhile, at time point t22, the clock signal GCK2 is maintained at a low level. Hence, unlike the normal operation period, the first internal node N(G) (i+1) in the first unit circuit 30(*i*+1) is not boosted.

In addition, when reaching time point t22, in the monitoring control shift register 400, the clock signal MCK1 changes from a low level to a high level. Since the clock signal MCK1 is provided as a clock signal MCLK to the second unit circuit 40(*i*), the second internal node N(M) (i) in the second unit circuit 40(*i*) goes into a boosted state, and an output signal Q(M) (i) outputted from the second unit circuit 40(*i*) changes from a low level to a high level. In addition, at time point t22, the monitoring enable signal ENA changes from a low level to a high level. Hence, at time point t22, with the change of the output signal Q(M) (i) from a low level to a high level, a monitoring control signal ML(i) for the ith row also changes from a low level to a high level. In addition, by the output signal Q(M) (i) changing from a low level to a high level, the voltage level at a second internal node N(M) (i+1) in a second unit circuit 40(*i*+1) changes from a low level to a high level.

Figure 16:
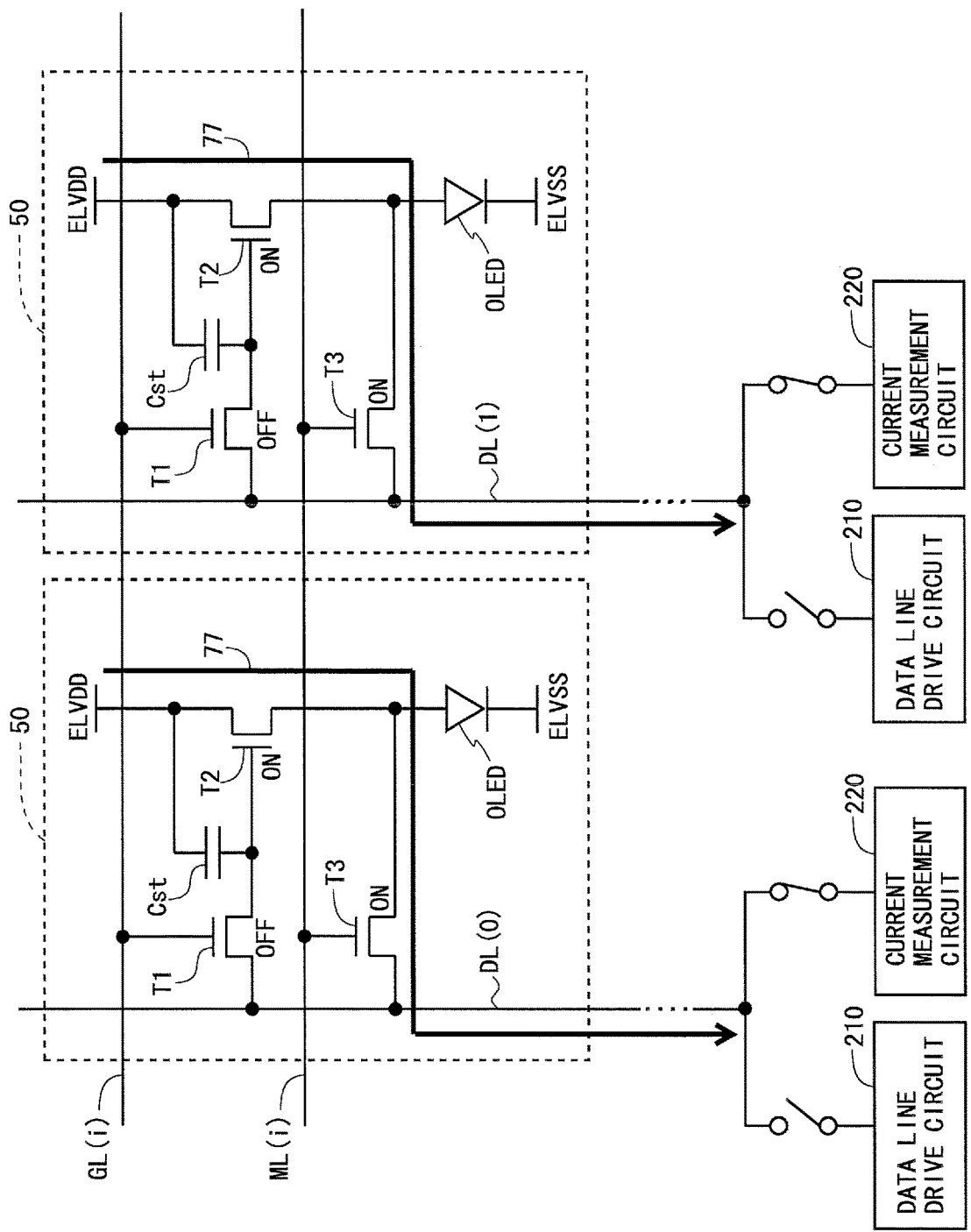
FIG. 16 is a diagram for describing the flow of currents in the first embodiment.

As described above, when reaching time point t22, the writing control line GL(i) goes into a non-selected state. By this, in each pixel circuit 50 of the ith row, the transistor T1 goes into an off state. In addition, at time point t22, the monitoring enable signal ENA goes to a high level, by which the monitoring control line ML(i) goes into a selected state based on the output signal Q(M) (i). By this, in each pixel circuit 50 of the ith row, the transistor T3 goes into an on state. As a result, as indicated by an arrow denoted by reference character 77 in FIG. 16, a drive current is outputted to the data line DL through the transistor T3. Then, the drive current is measured by the current measurement circuit 220. Note that the length of a measurement period is preferably set to such a length that allows accurate measurement of a drive current. Hence, in the present embodiment, as shown in FIG. 14, the display control circuit 100 maintains the monitoring enable signal ENA at a high level and stops the clock operation of the clock signals GCK1, GCK2, MCK1, and MCK2, for several horizontal scanning periods (a period longer than one horizontal scanning period). By this, a measurement period (the period from time point t22 to time point t23) of sufficient length is secured.

When reaching time point t23, in the writing control shift register 300, the clock signal GCK2 changes from a low level to a high level. Since the clock signal GCK2 is provided as a clock signal GCLK to the first unit circuit 30(*i*+1), the first internal node N(G) (i+1) in the first unit circuit 30(*i*+1) goes into a boosted state, and a writing control signal GL(i+1) for an (i+1)th row changes from a low level to a high level. At this time, data voltages have been supplied to the data lines DL from the data line drive circuit 210. By this, during a period from time point t23 to time point t24, writing based on the data voltages is performed in pixel circuits 50 of the (i+1)th row. In addition, by the writing control signal GL(i+1) changing from a low level to a high level, the voltage level at the first internal node N(G) (i) in the first unit circuit 30(*i*) goes to a low level.

In addition, when reaching time point t23, in the monitoring control shift register 400, the monitoring enable signal ENA changes from a high level to a low level, and the clock signal MCK2 changes from a low level to a high level. Since the clock signal MCK2 is provided as a clock signal MCLK to the second unit circuit 40(i+1), by the clock signal MCK2 changing from a low level to a high level, the second internal node N(M) (i+1) in the second unit circuit 40(i+1) goes into a boosted state, and an output signal Q(M) (i+1) outputted from the second unit circuit 40(i+1) changes from a low level to a high level. By this, the voltage level at a second internal node N(M) (i) in the second unit circuit 40(i), the output signal Q(M) (i), and the monitoring control signal ML(i) go to a low level. Note that since the monitoring enable signal ENA changes from a high level to a low level at time point t23, a monitoring control signal ML(i+1) for the (i+1)th row is maintained at a low level.

As described above, after performing a monitoring process during the period from time point t21 to time point t23, normal operation is performed during the period after time point t23. Note that data obtained in the monitoring process is provided as monitored data MO to the display control circuit 100 from the source driver 200. Then, the display control circuit 100 corrects video signals based on the monitored data MO. By this, degradation of circuit elements such as drive transistors or organic EL elements is compensated for.

Note that, in order to securely bring the monitoring control signal ML(i) to a low level after the monitoring process period ends, it is preferred to change the monitoring enable signal ENA to a low level at timing a bit later than time point t23.

1.6 Selection of a Monitored Row

Figure 17:
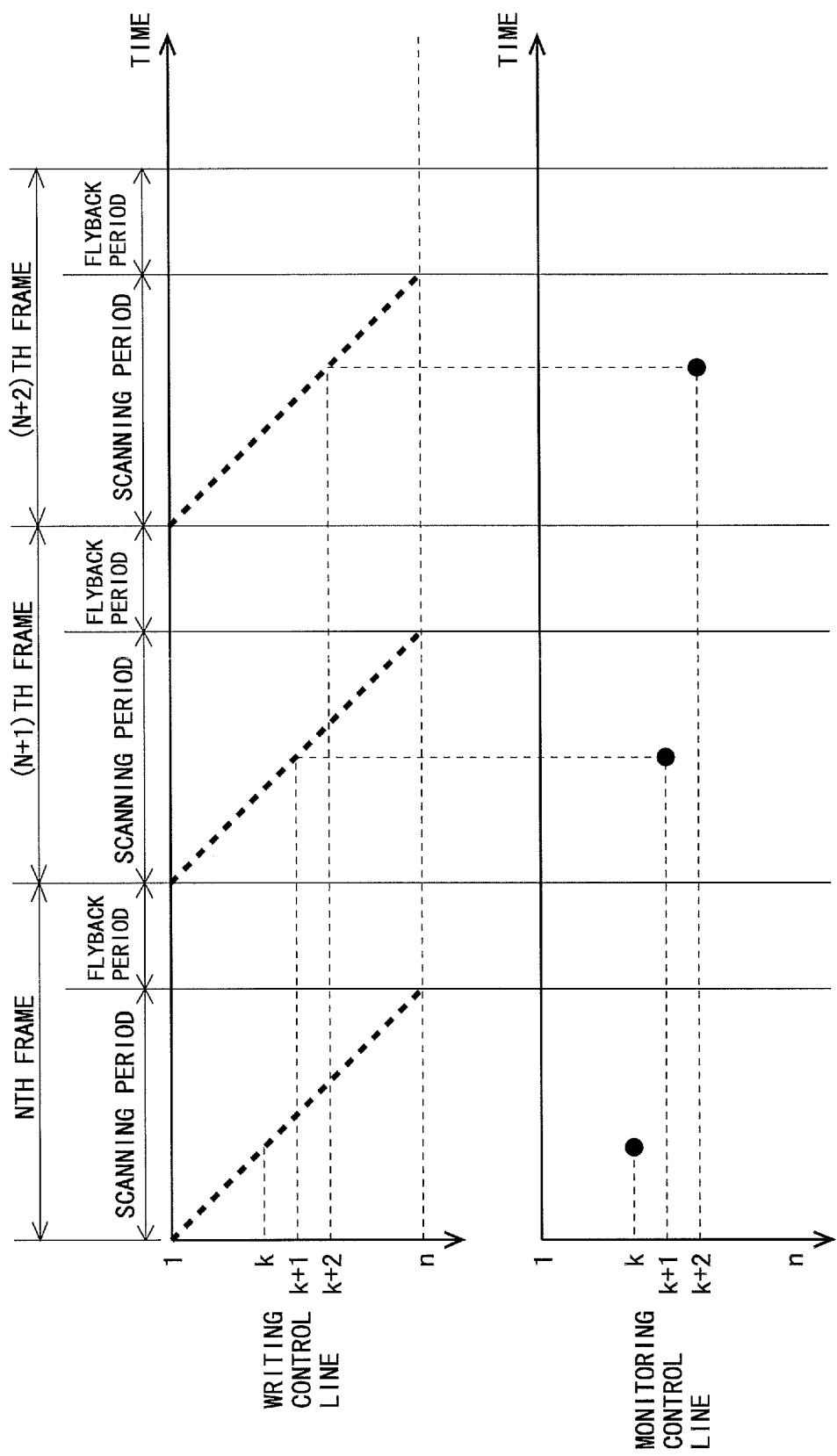
FIG. 17 is a diagram for describing a first example regarding selection of a monitored row in the first embodiment.
Figure 18:
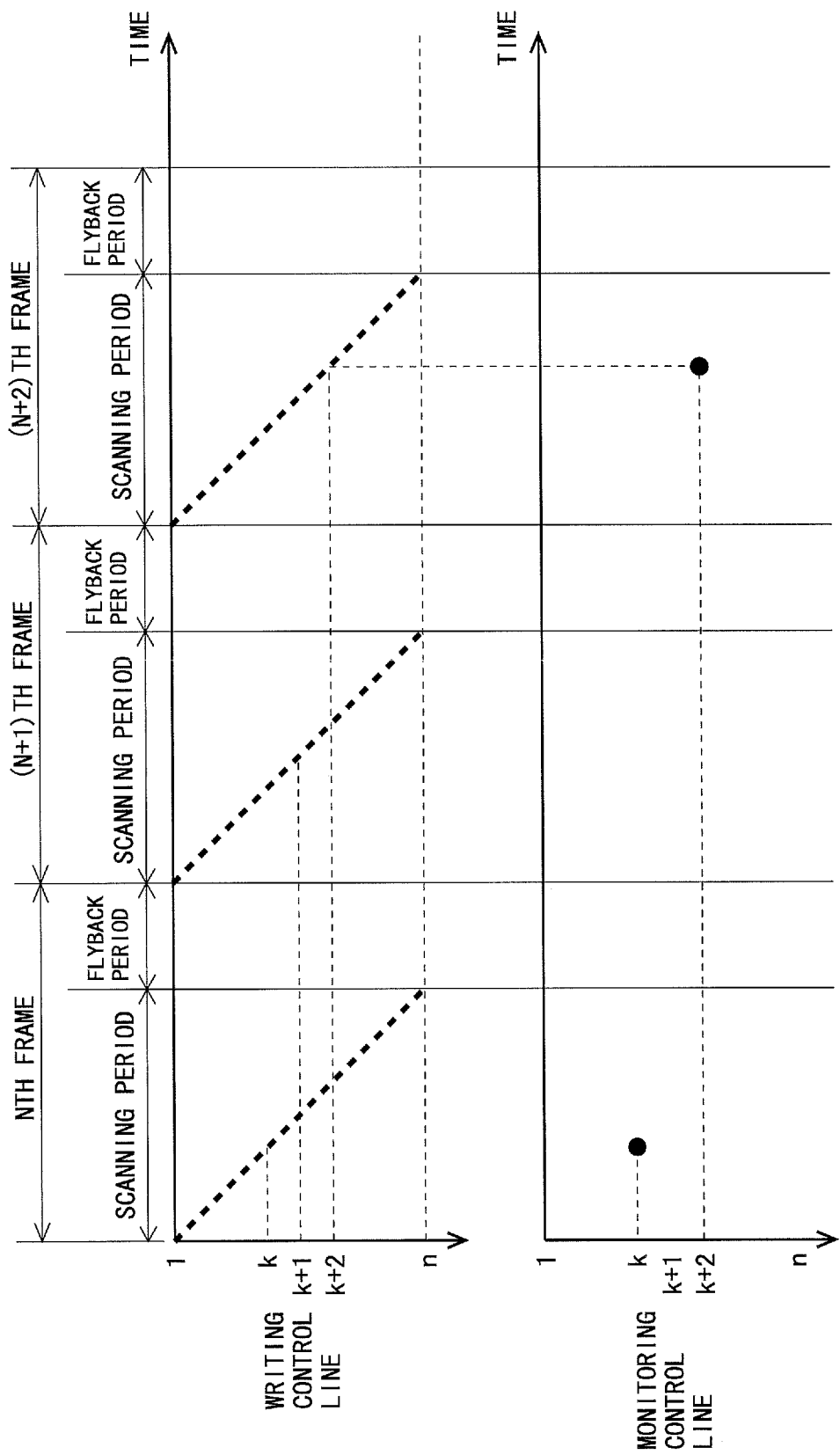
FIG. 18 is a diagram for describing a second example regarding selection of a monitored row in the first embodiment.

Now, how a monitored row is selected will be described. FIG. 17 is a diagram for describing a first example regarding selection of a monitored row, and FIG. 18 is a diagram for describing a second example regarding selection of a monitored row. In FIGS. 17 and 18, the selected state of the writing control lines GL is schematically represented by a thick dotted line, and the selected state of the monitoring control lines ML is schematically represented by a black dot.

1.6.1 First Example

In the first example, one row serves as a monitored row in each frame. That is, in each frame, one monitoring control line ML is brought into a selected state. As can be grasped from FIG. 17, when a monitoring control line ML(k) of a kth row is brought into a selected state in a given frame, a monitoring control line ML(k) of a (k+1)th row is brought into a selected state in the next frame. In addition, in a frame in which a monitoring process is performed, a writing control line GL of the monitored row and a monitoring control line ML of the monitored row go into a selected state in synchronization with each other. According to such a first example, a monitoring process for all rows can be performed in an n-frame period.

1.6.2 Second Example

In the second example, one row serves as a monitored row every two frames. That is, one monitoring control line ML is brought into a selected state every two frames. As can be grasped from FIG. 18, when a monitoring control line ML(k) of a kth row is brought into a selected state in a given frame, a monitoring control line ML (k) of a (k+1)th row is brought into a selected state in a frame two frames after the given frame. In addition, as in the first example, in a frame in which a monitoring process is performed, a writing control line GL of the monitored row and a monitoring control line ML of the monitored row go into a selected state in synchronization with each other. According to such a second example, a monitoring process for all rows can be performed in about a 2n-frame period. In a case in which the changes in the characteristics of circuit elements are relatively small, by adopting the second example, a reduction in power consumption is possible.

1.6.3 Others

Note that examples are not limited to the first and second examples, and one row may serve as a monitored row every three or more frame period, or two or more rows may serve as monitored rows in one frame.

In addition, in the present embodiment, the display control circuit 100 controls the operation of the writing control shift register 300 and the operation of the monitoring control shift register 400 such that a writing control signal GL provided to a writing control line GL of the monitored row and a monitoring control signal ML provided to a monitoring control line ML of the monitored row go to an on level in synchronization with each other. By adopting a configuration in which the writing control line GL of the monitored row and the monitoring control line ML of the monitored row thus go into a selected state in synchronization with each other, the operation of the writing control shift register 300 and the monitoring control shift register 400 is prevented from becoming complex.

Figure 1:
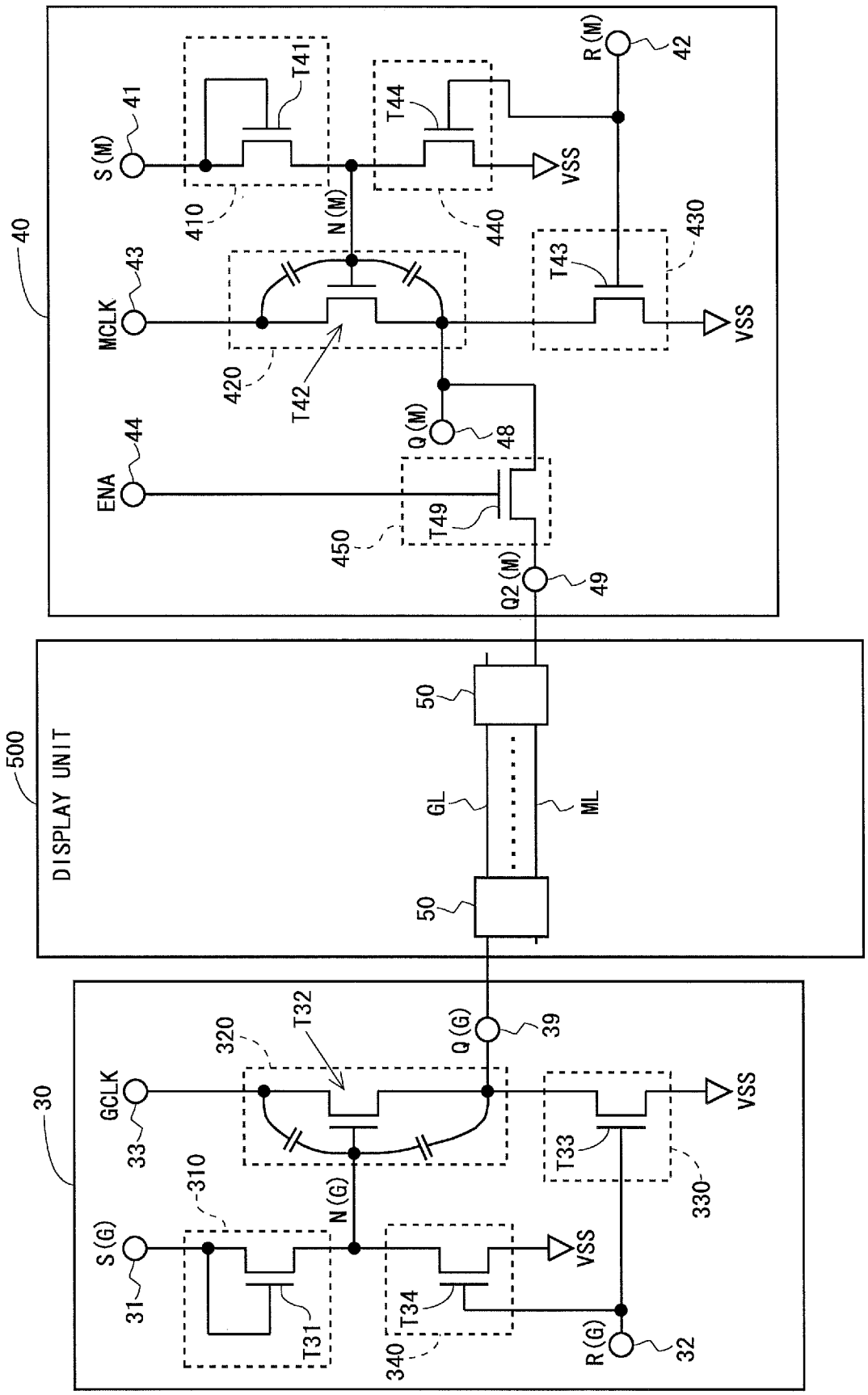
FIG. 1 is a diagram for describing the current drive capability of components in unit circuits (a first unit circuit and a second unit circuit), regarding an active matrix-type organic EL display device according to a first embodiment of the present invention.

1.7 Regarding the Current Drive Capability of Components in the Unit Circuits With reference to FIG. 1, the current drive capability of components in unit circuits (a first unit circuit 30 and a second unit circuit 40) will be described. As can be grasped from FIG. 1, the first unit circuit 30 and the second unit circuit 40 have similar configurations except that the second unit circuit 40 is provided with the transistor T49 and the output terminal 49. However, in the present embodiment, as will be described below, regarding the components in the unit circuits, a difference is made in current drive capability between the first unit circuit 30 and the second unit circuit 40.

1.7.1 Boost Circuits

A monitoring control line ML is brought into a selected state to bring a transistor T3 in a pixel circuit 50 (see FIG. 5) into an on state so that a drive current can be measured. On the other hand, a writing control line GL is brought into a selected state to bring a transistor T1 in the pixel circuit 50 into an on state so that a capacitor Cst in the pixel circuit 50 can be charged depending on a target luminance. The reason that the writing control line GL is thus bought into a selected state is to charge the capacitor Cst. In addition, a period during which the monitoring control line ML is maintained in a selected state is, as shown in FIG. 14, a period longer in length than one horizontal scanning period. On the other hand, a period during which the writing control line GL is maintained in a selected state is one horizontal scanning period. As such, the length of the period during which the selected state is maintained is shorter for the writing control line GL than for the monitoring control line ML. Hence, if the rise of the writing control signal GL is slow, then sufficient charging of the capacitor Cst may not be performed.

In view of this, in the present embodiment, a configuration in which "the current drive capability of the first boost circuit 320 is higher than the current drive capability of the second boost circuit 420" is adopted. For example, by making the channel width of the transistor T32 in the first unit circuit 30 larger than the channel width of the transistor T42 in the second unit circuit 40, the current drive capability of the first boost circuit 320 can be made higher than the current drive capability of the second boost circuit 420. Alternatively, for example, by making the channel length of the transistor T32 in the first unit circuit 30 shorter than the channel length of the transistor T42 in the second unit circuit 40, too, the current drive capability of the first boost circuit 320 can be made higher than the current drive capability of the second boost circuit 420. By this, the rise time of the writing control signal GL becomes shorter than the rise time of the monitoring control signal ML, suppressing degradation of display quality caused by insufficient charging of the capacitor Cst.

1.7.2 Output Node Reset Circuits

As shown in FIG. 14, the monitoring control line ML is brought into a non-selected state after a measurement period whose length is set to be longer than one horizontal scanning period ends. At this time, if a low-level signal output voltage occurs in the monitoring control line ML, then a leakage current may occur in the transistor T3 in the pixel circuit 50. If a leakage current occurs in the transistor T3, then writing of a data voltage into the pixel circuit 50 (charging of the capacitor Cst based on a data voltage) is not performed normally, degrading display quality.

In view of this, in the present embodiment, a configuration in which "the current drive capability of the second output node reset circuit 430 is higher than the current drive capability of the first output node reset circuit 330" is adopted. For example, by making the channel width of the transistor T43 in the second unit circuit 40 larger than the channel width of the transistor T33 in the first unit circuit 30, the current drive capability of the second output node reset circuit 430 can be made higher than the current drive capability of the first output node reset circuit 330. By this, the fall time of the monitoring control signal ML becomes shorter than the fall time of the writing control signal GL, suppressing degradation of display quality.

Note that since the monitoring control signal ML may be affected by the voltage level at the second internal node N(M), it is preferred to further adopt a configuration in which "the current drive capability of the second internal node reset circuit 440 is higher than the current drive capability of the first internal node reset circuit 340." By this, the fall time of the monitoring control signal ML can be more securely made shorter, and thus, degradation of display quality is effectively suppressed.

1.7.3 Technique for Increasing the Current Drive Capability of a Circuit

As a technique for increasing the current drive capability of a circuit, increasing the channel width of a transistor in the circuit is exemplified, but the present invention is not limited thereto. For example, by reducing the channel length of a transistor or increasing the gate capacitance of a transistor, too, the current drive capability can be increased. In addition, by adopting a transistor having a back-channel structure, an increase in effective current drive capability per unit size can also be achieved. Furthermore, by appropriately adjusting the composition of a transistor or adjusting parameters for drive voltage conditions, too, an improvement in current drive capability can be achieved.

1.8 Effects

According to the present embodiment, the organic EL display device 1 is configured to be able to measure a current flowing through a drive transistor T2 in a pixel circuit 50. Then, based on the measured current, a video signal is corrected. Hence, degradation of the drive transistor T2 is compensated for. Here, in the present embodiment, a configuration is adopted in which the writing control shift register 300 that drives the writing control lines GL is provided on one side of the display unit 500 and the monitoring control shift register 400 that drives the monitoring control lines ML is provided on the other side of the display unit 500. In such a configuration, the current drive capability of a first boost circuit (a boost circuit in each unit circuit forming the writing control shift register 300) 320 is higher than the current drive capability of a second boost circuit (a boost circuit in each unit circuit forming the monitoring control shift register 400) 420. Hence, the rise time of a writing control signal GL becomes shorter than the rise time of a monitoring control signal ML, suppressing degradation of display quality caused by insufficient charging of a capacitor Cst. In addition, the current drive capability of a second output node reset circuit (an output node reset circuit in each unit circuit forming the monitoring control shift register 400) 430 is higher than the current drive capability of a first output node reset circuit (an output node reset circuit in each unit circuit forming the writing control shift register 300) 330. Hence, the fall time of the monitoring control signal ML becomes shorter than the fall time of the writing control signal GL, suppressing degradation of display quality. By the above, according to the present embodiment, an organic EL display device is implemented that is configured to include two independent shift registers (the writing control shift register 300 and the monitoring control shift register 400) and is capable of performing a monitoring process without causing the degradation of display quality or the occurrence of abnormal operation.

1.9 Variants

1.9.1 Variants for the Configurations of the Unit Circuits

1.9.1.1 First Variant

In the above-described first embodiment, in each second unit circuit 40 in the monitoring control shift register 400, the second output control circuit 450 is provided so as to control an output from the second boost circuit 420 (see FIG. 11). However, the present invention is not limited thereto. It is also possible to adopt a configuration (a configuration of the present variant) in which the second output control circuit 450 is provided so as to control an output to the second boost circuit 420.

Figure 19:
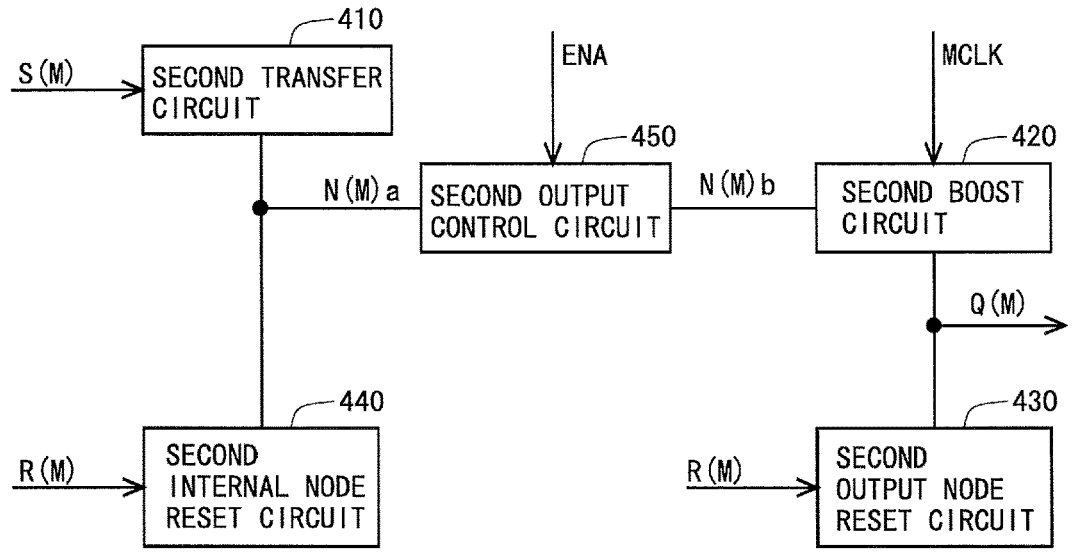
FIG. 19 is a block diagram showing a schematic configuration of a second unit circuit in a first variant of the first embodiment.
Figure 20:
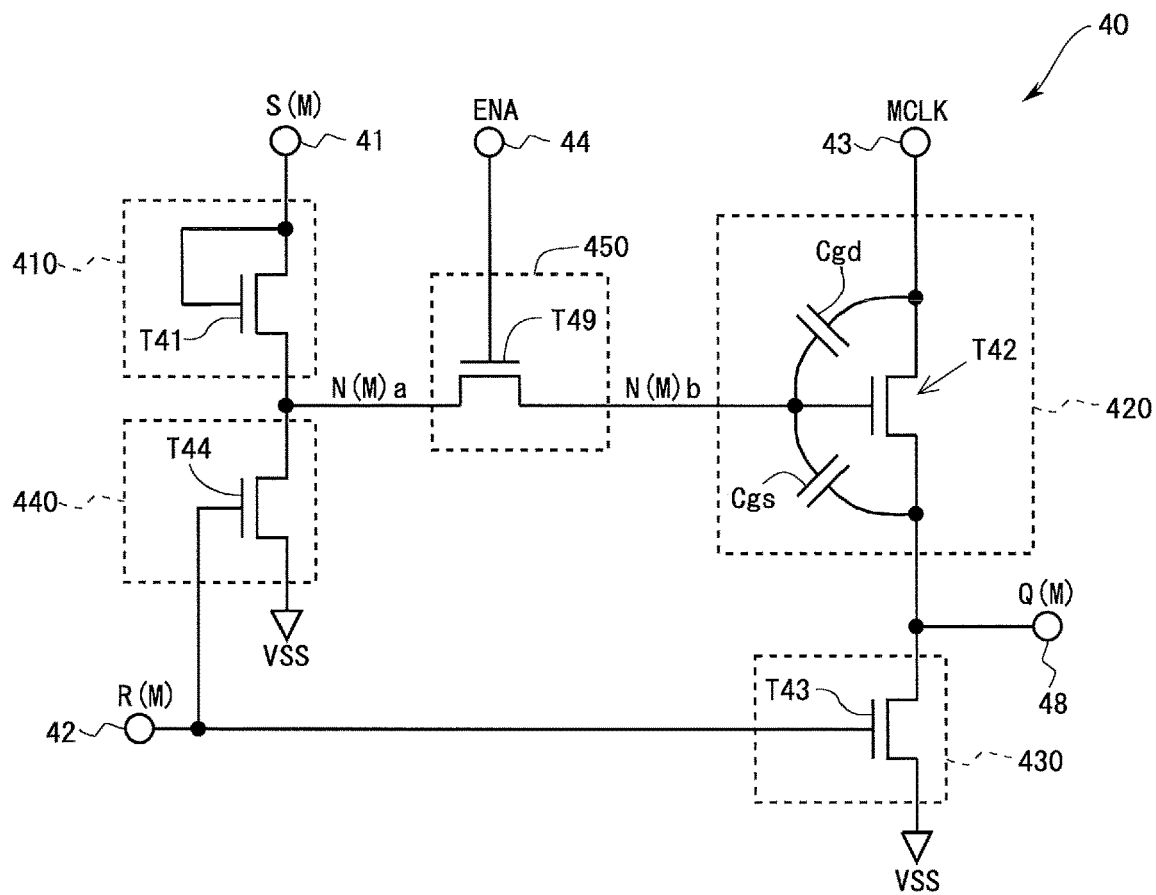
FIG. 20 is a circuit diagram showing a detailed configuration of the second unit circuit in the first variant of the first embodiment.

FIG. 19 is a block diagram showing a schematic configuration of a second unit circuit 40 in the present variant. FIG. 20 is a circuit diagram showing a detailed configuration of the second unit circuit 40 in the present variant. In the present variant, unlike the above-described first embodiment, a second output control circuit 450 is provided between a second transfer circuit 410 and a second boost circuit 420. Since the second output control circuit 450 is thus configured, the second internal node in the above-described first embodiment is divided into a region more on the input side than the second output control circuit 450 and a region more on the output side than the second output control circuit 450. Note that here, for convenience of description, both the region more on the input side than the second output control circuit 450 and the region more on the output side than the second output control circuit 450 are referred to as "second internal node." Note that the region more on the input side than the second output control circuit 450 is denoted by reference character N(M)a, and the region more on the output side than the second output control circuit 450 is denoted by reference character N(M)b. In the present variant, a second signal output circuit is implemented by a transistor T42 (second boost circuit 420), a transistor T49 (second output control circuit 450), and an output terminal 48.

The transistor T49 forming the second output control circuit 450 has a gate terminal to which a monitoring enable signal ENA is provided; a drain terminal connected to a source terminal of a transistor T41 and a drain terminal of a transistor 144; and a source terminal connected to a gate terminal of the transistor T42. Moreover, in the present variant, an output signal Q(M) outputted from each second unit circuit 40 is provided as a reset signal R(M) to a second unit circuit 40 of the previous stage, provided as a set signal S(M) to a second unit circuit 40 of the subsequent stage, and provided as a monitoring control signal ML to a corresponding monitoring control line ML.

In a configuration such as that described above, when the set signal S(M) goes to a high level with both the second internal node N(M)a and the second internal node N(M)b being at a low level, the voltage level at the second internal node N(M)a changes from a low level to a high level. Then, when the monitoring enable signal ENA goes to a high level with the voltage level at the second internal node N(M)a being at a high level, the voltage level at the second internal node N(M)b also changes from a low level to a high level. As a result, according to a change of the clock signal MCLK from a low level to a high level, the output signal Q(M) goes to a high level, and the monitoring control line ML corresponding to this second unit circuit 40 goes into a selected state. On the other hand, when the monitoring enable signal ENA is maintained at a low level with the voltage level at the second internal node N(M)a being at a high level, the voltage level at the second internal node N(M)b is maintained at a low level. Hence, the output signal Q(M) is maintained at a low level regardless of the clock operation of the clock signal MCLK. That is, the monitoring control line ML is maintained in a non-selected state. Note that normally a circuit for securely changing the potential at the second internal node N(M)b from a high level to a low level is provided in the second unit circuit 40.

As described above, by the configuration according to the present variant, too, the output of the monitoring control signal ML from the second unit circuit 40 can be controlled based on the monitoring enable signal ENA. As such, the second unit circuit 40 can also adopt a configuration in which the second output control circuit 450 is provided between the second transfer circuit 410 and the second boost circuit 420.

Figure 21:
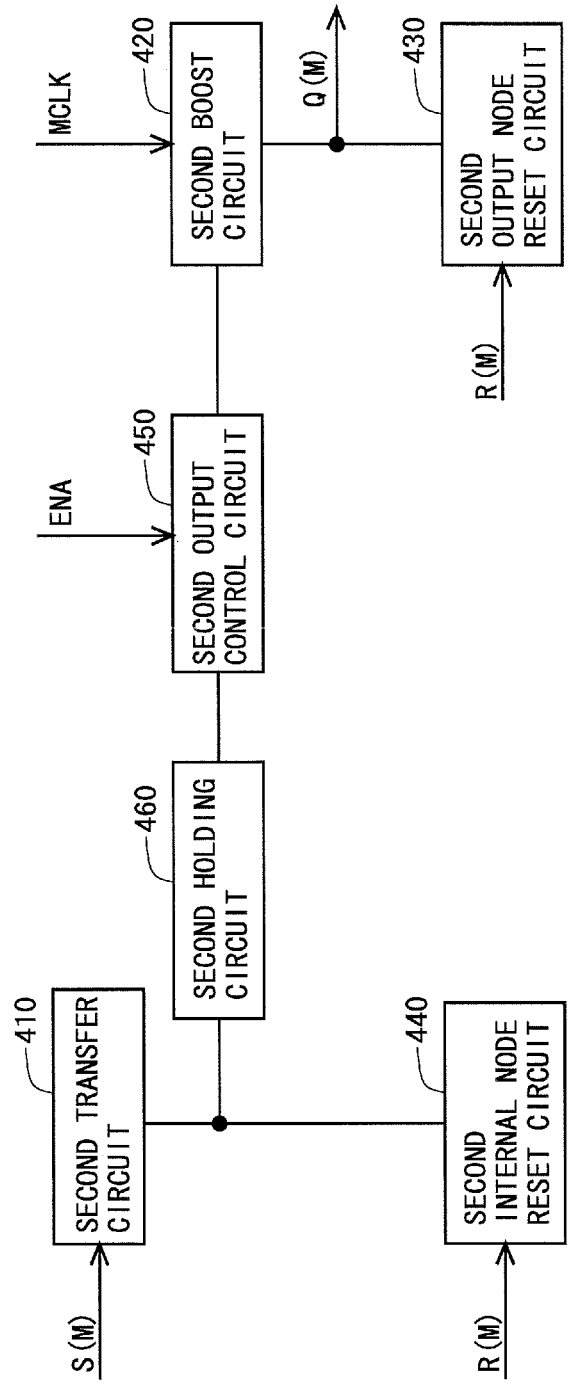
FIG. 21 is a block diagram showing a preferred schematic configuration of the second unit circuit in the first variant of the first embodiment.

Meanwhile, in the configuration according to the present variant, when a high-level set signal S(M) is inputted to the second unit circuit 40, the second transfer circuit 410 transfers the high-level signal to the second internal node N(M)a (the signal transferred is hereinafter referred to as "transferred signal"). In such a state, the monitoring enable signal ENA is maintained in a low level throughout a period during which the output signal Q(M) is to be maintained at a low level. Then, when the monitoring enable signal ENA changes from a low level to a high level, the above-described transferred signal which is a high-level signal is further transferred to the second output node N(M)b. Here, if the period from when the transferred signal is transferred to the second internal node N(M)a until the transferred signal is further transferred to the second internal node N(M)b is long, then there is a concern that the voltage level of the transferred signal (the voltage level at the second internal node N(M)a) decreases before the monitoring enable signal ENA changes to a high level. Hence, as shown in FIG. 21, it is preferred that a holding circuit (second holding circuit 460) for maintaining the voltage level of the transferred signal at a high level be provided between the second transfer circuit 410 and the second output control circuit 450. By providing such a second holding circuit 460, the occurrence of an operation failure of the second unit circuit 40 can be suppressed.

1.9.1.2 Second Variant

In the above-described first embodiment, the second output control circuit 450 that operates based on the monitoring enable signal ENA is provided in the second unit circuit 40 in order to control an output of the monitoring control signal ML (output signal Q2(M)) from the second unit circuit 40. However, the present invention is not limited thereto. As in the present variant, it is also possible to adopt a configuration in which the second output control circuit 450 is not provided in the second unit circuit 40 (i.e., a configuration in which the monitoring enable signal ENA is not used).

Figure 22:
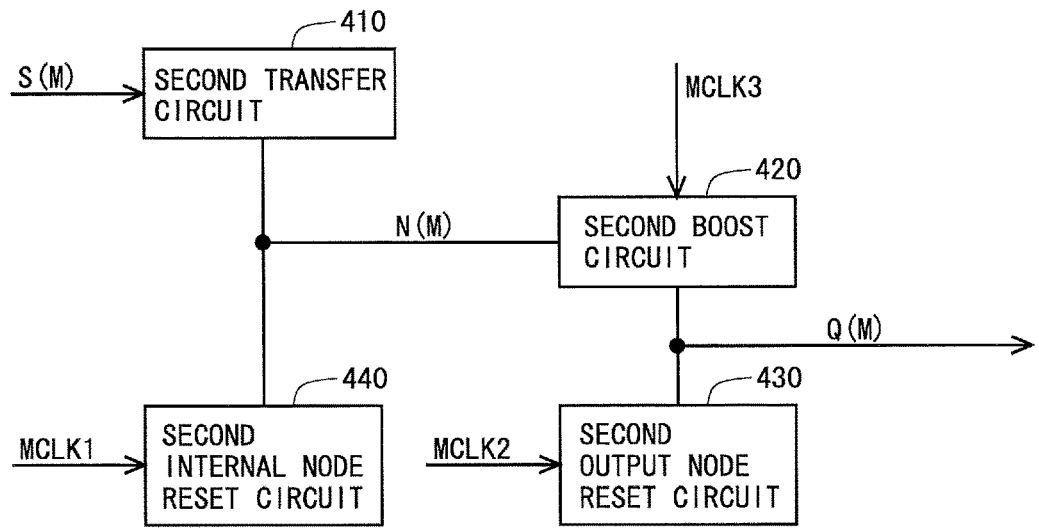
FIG. 22 is a block diagram showing a schematic configuration of a second unit circuit in a second variant of the first embodiment.
Figure 23:
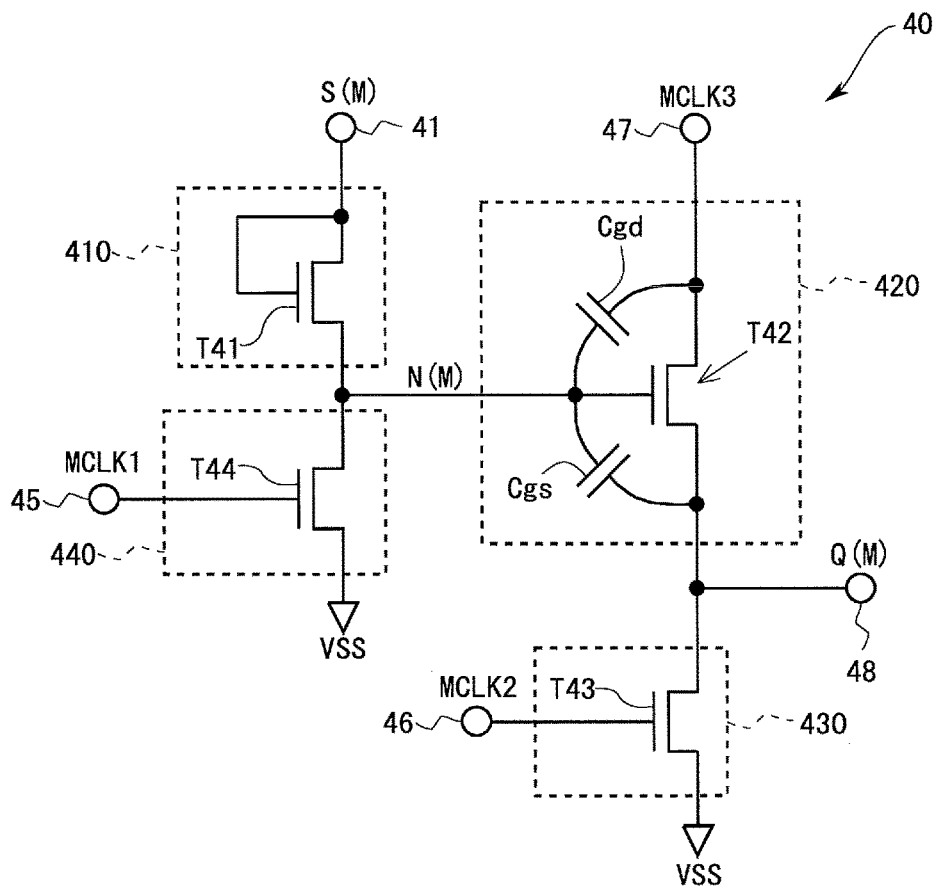
FIG. 23 is a circuit diagram showing a detailed configuration of the second unit circuit in the second variant of the first embodiment.

FIG. 22 is a block diagram showing a schematic configuration of a second unit circuit 40 in the present variant. FIG. 23 is a circuit diagram showing a detailed configuration of the second unit circuit 40 in the present variant. In the present variant, a second output control circuit 450 is not provided in the second unit circuit 40. Moreover, in the present variant, three clock signals MCLK1, MCLK2, and MCLK3 are provided to the second unit circuit 40. Specifically, the clock signal MCLK1 is provided to a gate terminal of a transistor 144 forming a second internal node reset circuit 440, the clock signal MCLK2 is provided to a gate terminal of a transistor T43 forming a second output node reset circuit 430, and the clock signal MCLK3 is provided to a drain terminal of a transistor 142 forming a second boost circuit 420. Note that, in the present variant, a second signal output circuit is implemented by the transistor T42 (second boost circuit 420) and an output terminal 48.

In a configuration such as that described above, by appropriately controlling the stopping and resumption of the clock operation of the clock signals MCLK1, MCLK2, and MCLK3, a monitoring process can be performed at desired timing also in the present variant.

1.9.1.3 Third Variant

In the above-described first embodiment, the length of a measurement period is set to be longer than one horizontal scanning period so that a monitoring process can be accurately performed (see FIG. 14). Hence, the voltage level at the second internal node N(M) needs to be maintained at a high level for a relatively long period. In view of this, it is preferred to adopt a configuration (a configuration of the present variant) in which a holding circuit for maintaining a voltage level at the second internal node N(M) at a high level is provided in the second unit circuit 40.

Figure 24:
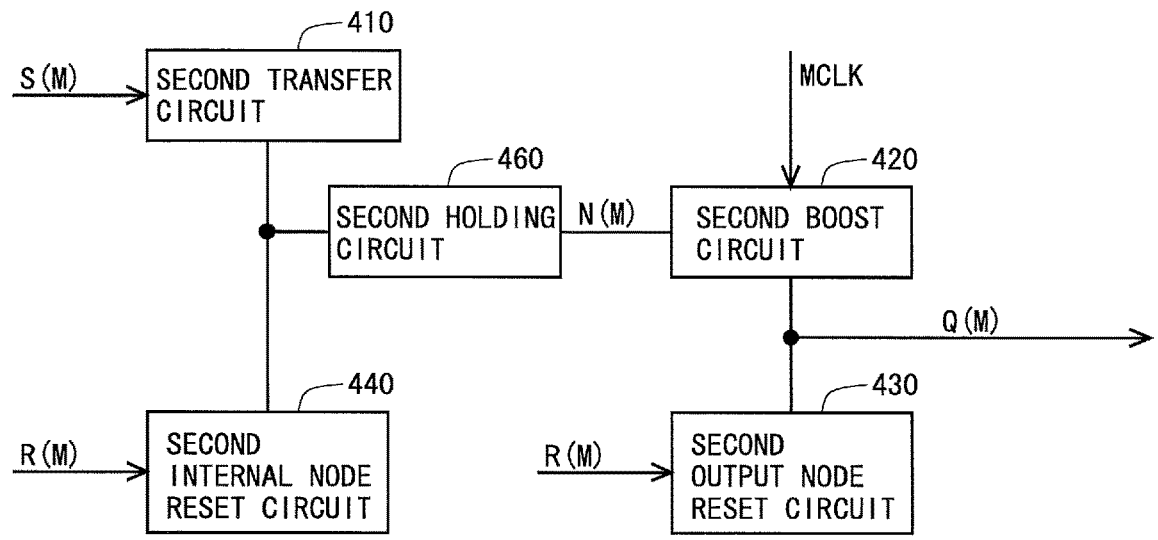
FIG. 24 is a block diagram showing a schematic configuration of a second unit circuit in a third variant of the first embodiment.
Figure 25:
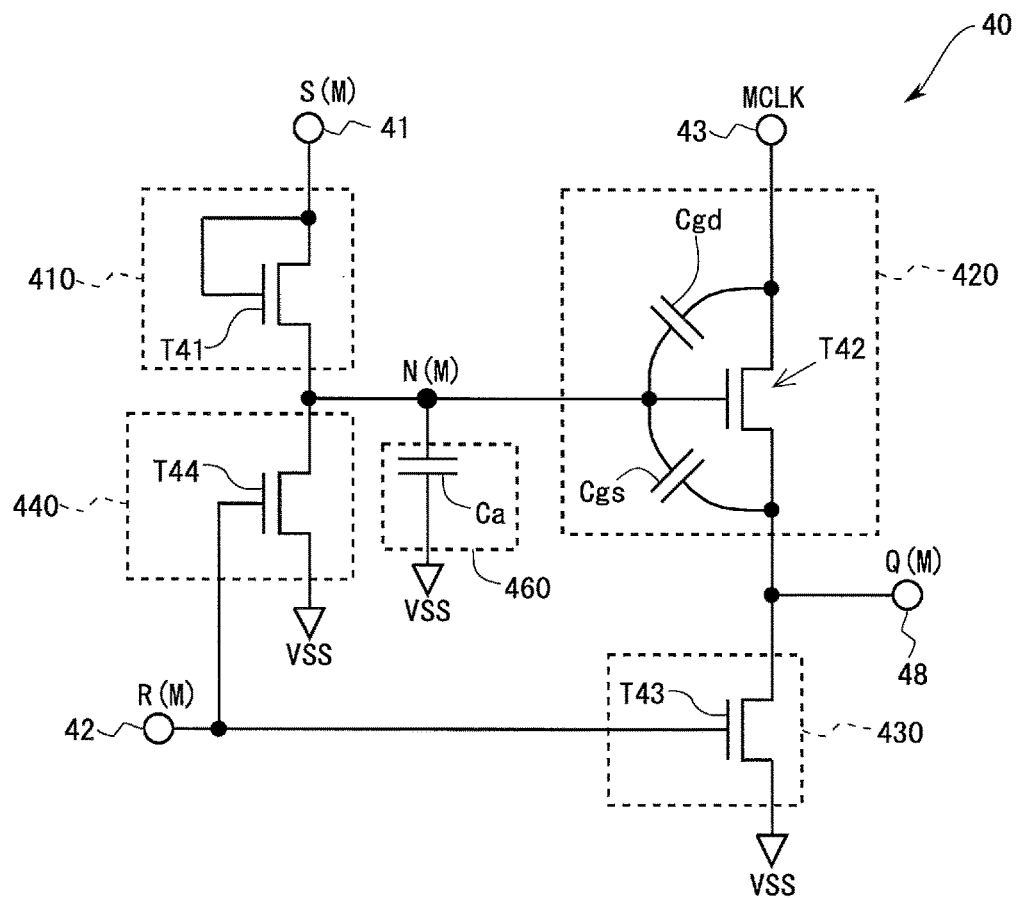
FIG. 25 is a circuit diagram showing a detailed configuration of the second unit circuit in the third variant of the first embodiment.

FIG. 24 is a block diagram showing a schematic configuration of a second unit circuit 40 in the present variant. FIG. 25 is a circuit diagram showing a detailed configuration of the second unit circuit 40 in the present variant. As shown in FIG. 24, in the present variant, a second holding circuit 460 for holding the voltage level of a high-level set signal S(M) which is transferred from a second transfer circuit 410 to a second internal node N(M) is provided in the second unit circuit 40. As shown in FIG. 25, the second holding circuit 460 is composed of a capacitor Ca. One end of the capacitor Ca is connected to the second internal node N(M), and the other end of the capacitor Ca is connected to an input terminal for a shift register low-level power supply voltage VSS.

According to the present variant, the holding circuit (second holding circuit 460) is provided between the second transfer circuit 410 and a second boost circuit 420. Hence, even when the period from a time point when the voltage level at a second internal node N(M) changes from a low level to a high level until a time point when an output of an active monitoring control signal ML is to start is relatively long in a given second unit circuit 40, the voltage level at the second internal node N(M) can be maintained at a high level. By this, the occurrence of an operation failure of the second unit circuit 40 can be suppressed.

Meanwhile, as described above, the second holding circuit 460 is provided in the second unit circuit 40 in the present variant. Hence, the time required to bring the second internal node N(M) into a reset state (low-level state) from a boosted state is longer in the present variant than in the above-described first embodiment. If the second internal node N(M) does not promptly go into a reset state after a monitoring process period ends, then an operation failure may occur. Hence, it is preferred to adopt a configuration in which "the current drive capability of the second internal node reset circuit 440 is higher than the current drive capability of the first internal node reset circuit 340." This is implemented by, for example, making the channel width of the transistor T34 in the first unit circuit 30 larger than the channel width of the transistor T44 in the second unit circuit 40 (see the above-described first variant). By this, the occurrence of an operation failure caused by the second internal node N(M) not promptly going into a reset state is suppressed.

In addition, a holding circuit (first holding circuit) similar to the above-described second holding circuit 460 may be provided in the first unit circuit 30, too. In this case, it is preferred to adopt a configuration in which "the signal holding capability of the second holding circuit 460 is higher than the signal holding capability of the first holding circuit." This is because the second internal node N(M) needs to maintain the voltage level at a high level for a longer period than the first internal node N(G).

1.9.1.4 Fourth Variant

In the above-described first embodiment, an output control circuit is provided only in the second unit circuit 40 out of the first unit circuit 30 and the second unit circuit 40, but the present invention is not limited thereto. As in the present variant, it is also possible to adopt a configuration in which an output control circuit is also provided in the first unit circuit 30.

Figure 26:
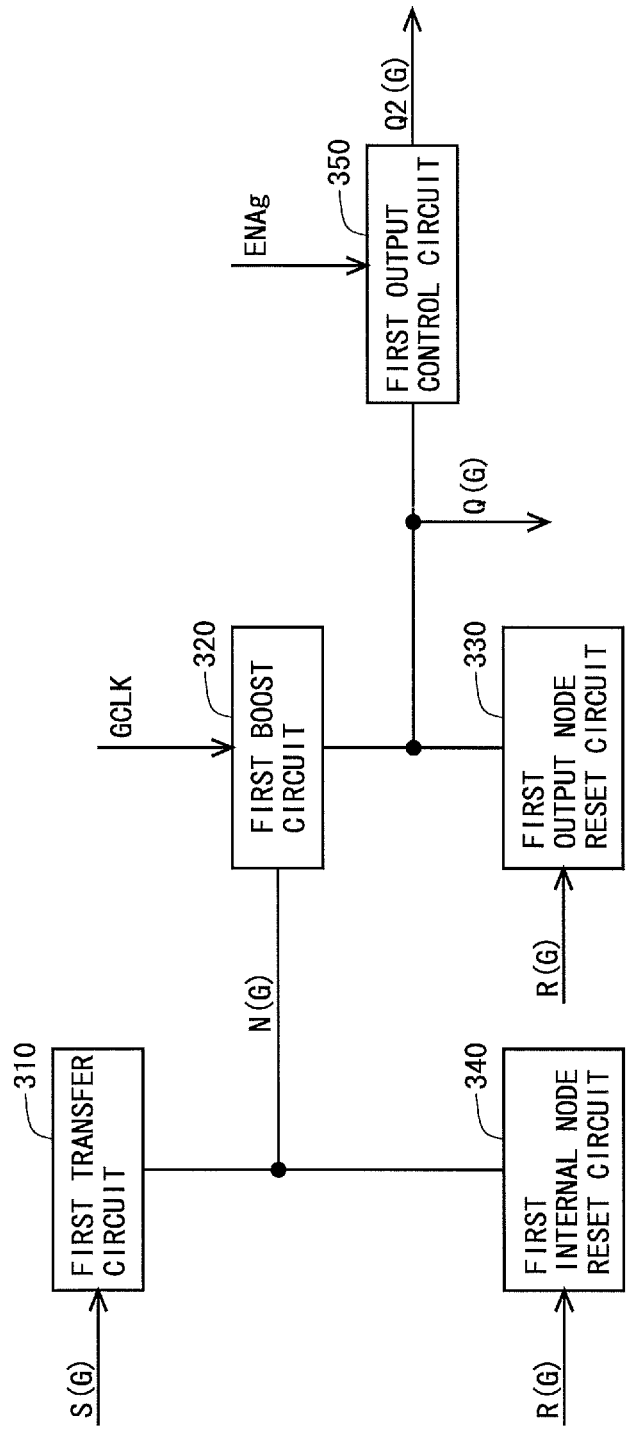
FIG. 26 is a block diagram showing a schematic configuration of a first unit circuit in a fourth variant of the first embodiment.
Figure 27:
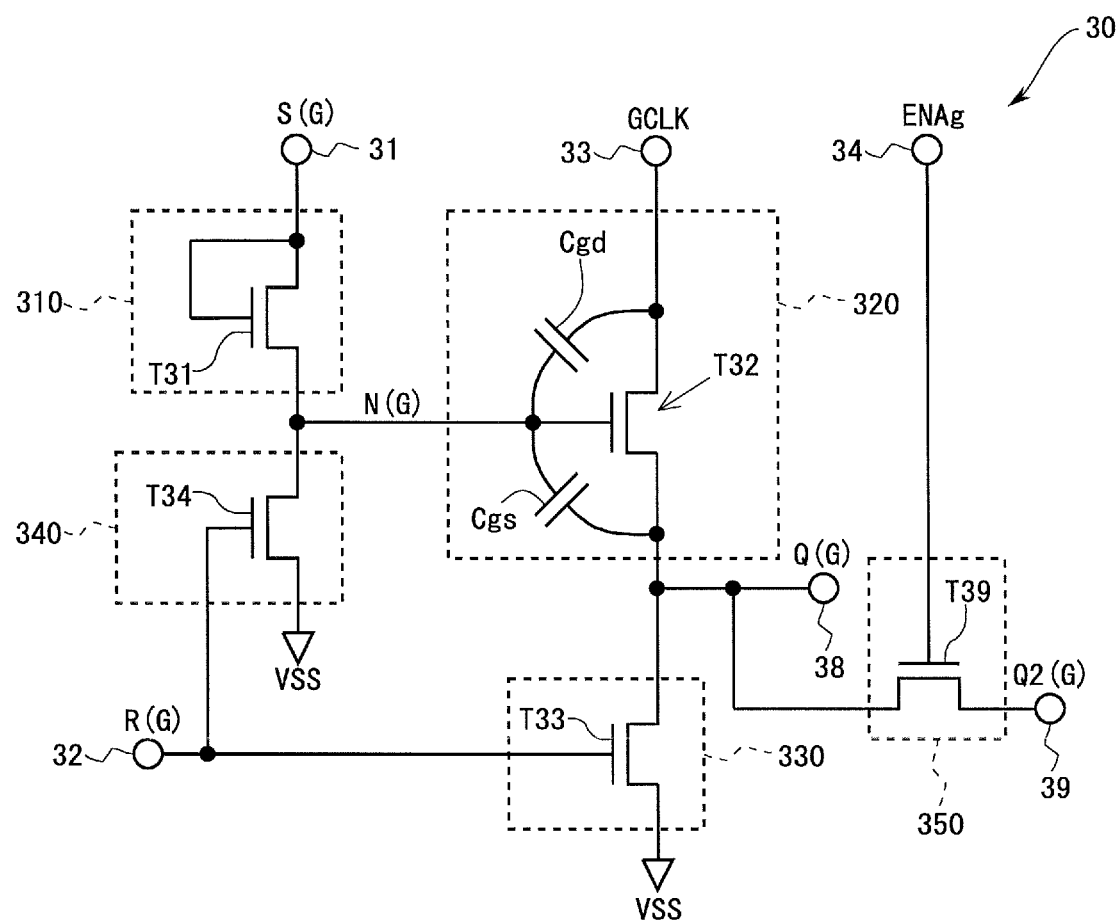
FIG. 27 is a circuit diagram showing a detailed configuration of the first unit circuit in the fourth variant of the first embodiment.

FIG. 26 is a block diagram showing a schematic configuration of a first unit circuit 30 in the present variant. FIG. 27 is a circuit diagram showing a detailed configuration of the first unit circuit 30 in the present variant. The configuration of a first unit circuit 30 in the present variant is the same as that of the second unit circuit 40 in the above-described first embodiment (see FIG. 11). Note that here an enable signal that controls the operation of an output control circuit (first output control circuit 350) in the first unit circuit 30 is referred to as "writing enable signal." The writing enable signal is denoted by reference character ENAg. In the present variant, a first signal output circuit is implemented by a transistor T32 (first boost circuit 320), a transistor T39 (first output control circuit 350), an output terminal 38, and an output terminal 39.

As described above, since the length of the period during which the selected state is maintained is shorter for the writing control line GL than for the monitoring control line ML, if the rise of the writing control signal GL is slow, then sufficient charging of the capacitor Cst in the pixel circuit 50 may not be performed. Hence, it is preferred to adopt a configuration in which "the current drive capability of the first output control circuit 350 is higher than the current drive capability of the second output control circuit 450." By this, the rise time of the writing control signal GL becomes shorter than the rise time of the monitoring control signal ML, suppressing degradation of display quality caused by insufficient charging of the capacitor Cst.

1.9.2 Variants for a Monitoring Process Period

In the above-described first embodiment, a monitoring process is performed during a period during which normal image display is performed, but the present invention is not limited thereto. So, various variants for a monitoring process period will be described below.

1.9.2.1 Fifth Variant

Regarding the display device, there is a period during which particularly significant image display is not performed, e.g., a period during standby. A monitoring process can also be performed during such a period. Thus, an example in which a monitoring process is performed during a period during which display of a so-called "solid screen" is performed will be described as a fifth variant of the above-described first embodiment.

Figure 28:
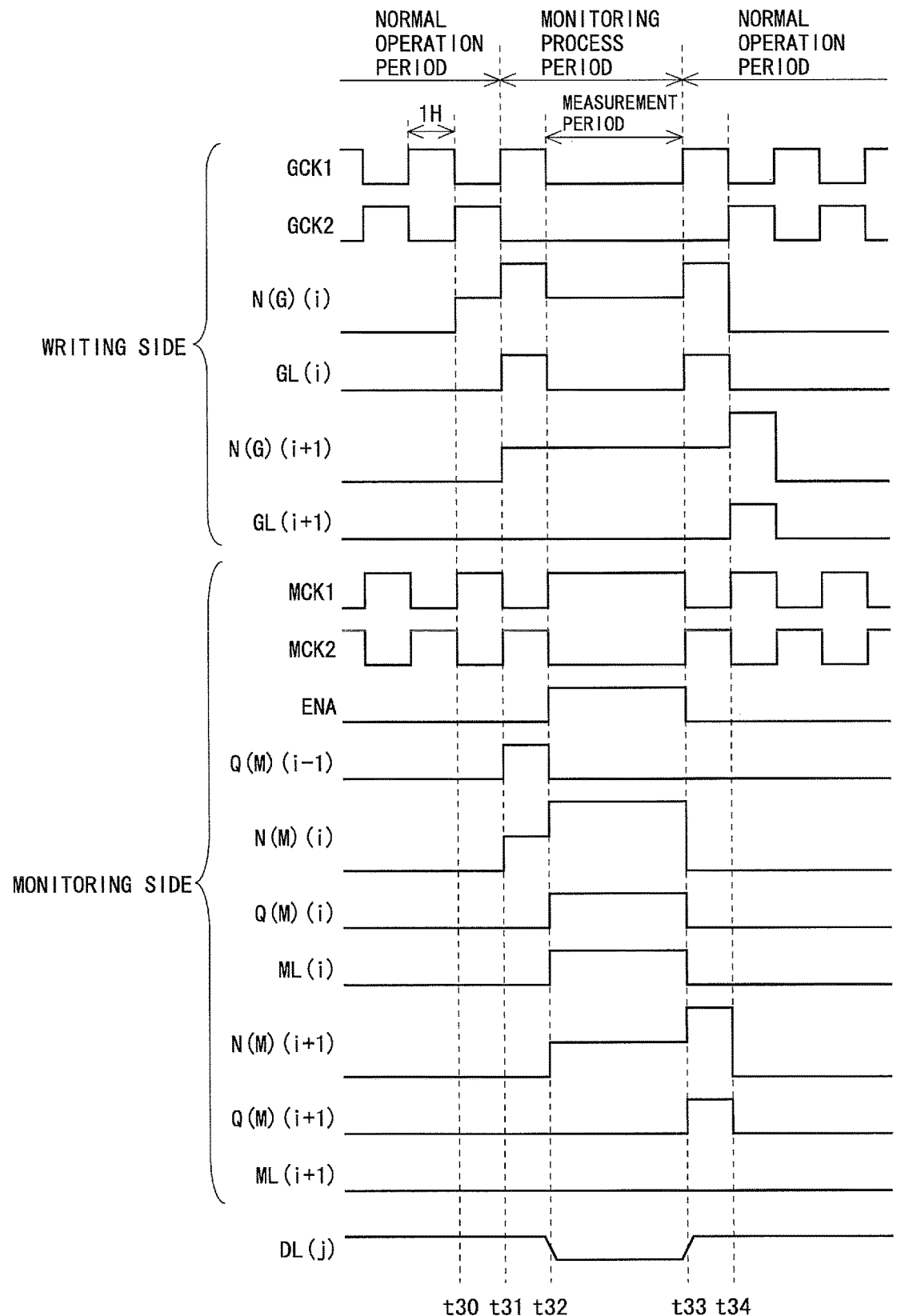
FIG. 28 is a timing chart for describing a method for driving writing control lines and monitoring control lines in a fifth variant of the first embodiment.

The configurations of the writing control shift register 300 (including the first unit circuits 30) and the monitoring control shift register 400 (including the second unit circuits 40) in the present variant are the same as those of the above-described first embodiment. FIG. 28 is a timing chart for describing a method for driving writing control lines GL and monitoring control lines ML in the present variant. In FIG. 28, a period prior to time point t31 and a period after time point t33 are normal operation periods, and a period from time point t31 to time point t33 is a monitoring process period. A measurement period from time point t32 to time point t33 corresponds to an amount-of-electricity measurement period. Note that the normal operation period in the present variant is a period during which display of a "solid screen" is performed on the display unit 500.

During a period up to time point t32, the same operation as that for the period up to time point t22 in the first embodiment is performed. Note, however, that in the present variant, during a period prior to time point t32, initialization data voltages (initialization signals) have been supplied to the data lines DL from the data line drive circuit 210. Note that the initialization data voltages are voltages of a certain magnitude for displaying a solid screen.

When reaching time point t32, in the writing control shift register 300, the clock signal GCK1 changes from a high level to a low level. By this, the writing control signal GL(i) changes from a high level to a low level, and the voltage level at the first internal node N(G) (i) in the first unit circuit 30(i) decreases. Meanwhile, at time point t32, the clock signal GCK2 is maintained at a low level. Hence, unlike a normal operation period, the first internal node N(G) (i+1) in the first unit circuit 30(i+1) is not boosted.

In addition, when reaching time point t32, in the monitoring control shift register 400, the clock signal MCK1 changes from a low level to a high level. By this, the second internal node N(M) (i) in the second unit circuit 40(i) goes into a boosted state, and the output signal Q(M) (i) outputted from the second unit circuit 40(i) changes from a low level to a high level. In addition, at time point t32, the monitoring enable signal ENA changes from a low level to a high level. Therefore, the monitoring control signal ML(i) for the ith row changes from a low level to a high level. Moreover, by the output signal Q(M) (i) changing from a low level to a high level, the voltage level at the second internal node N(M) (i+1) in the second unit circuit 40(i+1) changes from a low level to a high level.

As described above, when reaching time point t32, the writing control line GL(i) goes into a non-selected state and the monitoring control line ML(i) goes into a selected state. By this, in each pixel circuit 50 of the ith row, the transistor T1 goes into an off state and the transistor T3 goes into an on state. As a result, a drive current is outputted to the data line DL through the transistor T3, and the drive current is measured by the current measurement circuit 220.

When reaching time point t33, in the writing control shift register 300, the clock signal GCK1 changes from a low level to a high level. By this, the first internal node N(G) (i) in the first unit circuit 30(i) goes into a boosted state, and the writing control signal GL(i) for the ith row changes from a low level to a high level. At this time, initialization data voltages have been supplied to the data lines DL from the data line drive circuit 210. By this, during a period from time point t33 to time point t34, writing based on the initialization data voltages is performed in the pixel circuits 50 of the ith row.

In addition, when reaching time point t33, in the monitoring control shift register 400, the monitoring enable signal ENA changes from a high level to a low level, and the clock signal MCK2 changes from a low level to a high level. By the clock signal MCK2 changing from a low level to a high level, the second internal node N(M) (i+1) in the second unit circuit 40(i+1) goes into a boosted state, and the output signal Q(M) (i+1) outputted from the second unit circuit 40(i+1) changes from a low level to a high level. By this, the voltage level at the second internal node N(M) (i) in the second unit circuit 40(i), the output signal Q(M) (i), and the monitoring control signal ML(i) go to a low level. Note that since the monitoring enable signal ENA changes from a high level to a low level at time point t33, the monitoring control signal ML(i+1) for the (i+1)th row are maintained at a low level.

When reaching time point t34, in the writing control shift register 300, the clock signal GCK2 changes from a low level to a high level. By this, the first internal node N(G) (i+1) in the first unit circuit 30(i+1) goes into a boosted state, and the writing control signal GL(i+1) for the (i+1)th row changes from a low level to a high level. By this, the voltage level at the first internal node N(G) (i) in the first unit circuit 30(i) goes to a low level.

As described above, after performing a monitoring process during the period from time point t31 to time point t33, normal operation is performed during the period after time point t33. Note that data obtained in the monitoring process is provided as monitored data MO to the display control circuit 100 from the source driver 200. Then, when normal image display is performed, the display control circuit 100 corrects video signals based on the monitored data MO. By this, degradation of circuit elements such as drive transistors or organic EL elements is compensated for.

Meanwhile, in a case in which, as in the above-described first embodiment, a monitoring process is performed during a period during which normal image display is performed (i.e., a period during which writing based on any data voltages is performed), variations may occur in charging rate between pixels when the capacitors Cst are charged based on measurement voltages. Such variations in charging rate cause errors in drive current measurement results. If there are errors in measurement results, degradation of circuit elements is not sufficiently compensated for. In this regard, in the present variant, since voltages of a certain magnitude are supplied to the data lines DL except during a measurement period, variations in charging rate between pixels do not occur when the capacitors Cst are charged based on measurement voltages. Therefore, drive current measurement is accurately performed and degradation of circuit elements is sufficiently compensated for.

Moreover, when an image with a specific pattern is displayed, a difference occurs between a temperature near a pixel corresponding to a light-on location and a temperature near a pixel corresponding to a light-off location. Such a temperature difference also causes errors in drive current measurement results. In this regard, in the present variant, since writing based on voltages of the same magnitude is performed in the entire display unit 500 during a normal operation period, a temperature difference between pixels does not occur almost at all. Therefore, drive current measurement is accurately performed and degradation of circuit elements is sufficiently compensated for.

1.9.2.2 Sixth Variant

Regarding the display device, there is a period during which the writing control lines GL are not scanned, e.g., a vertical flyback period and a period immediately after the power is turned on. So, an example in which a monitoring process is performed during a vertical flyback period will be described as a sixth variant of the above-described first embodiment. Note that in the following, a period during which the writing control lines GL are not scanned is referred to as "non-scanning period."

Figure 29:
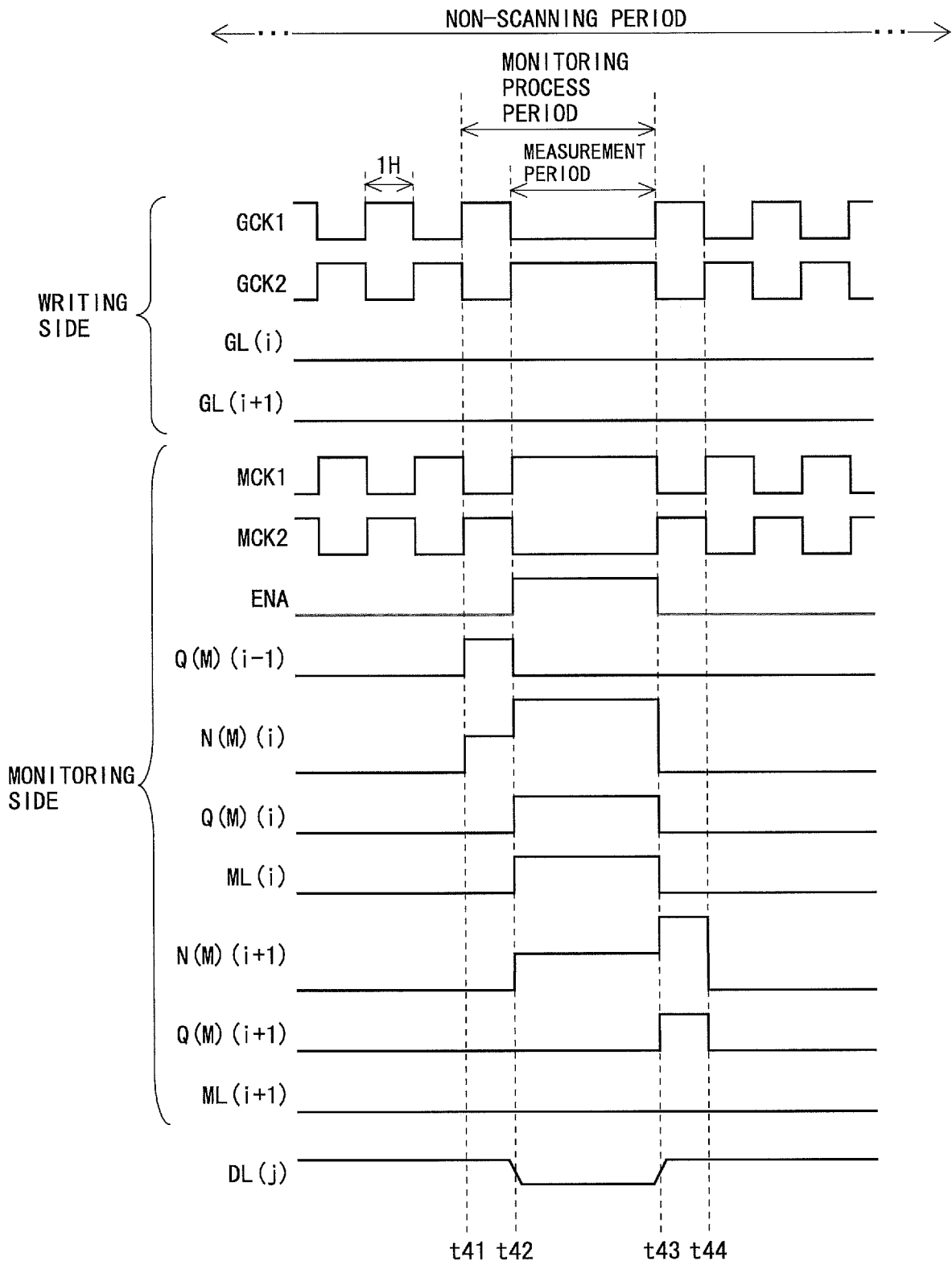
FIG. 29 is a timing chart for describing a method for driving writing control lines and monitoring control lines in a sixth variant of the first embodiment.

The configurations of the writing control shift register 300 (including the first unit circuits 30) and the monitoring control shift register 400 (including the second unit circuits 40) in the present variant are the same as those of the above-described first embodiment. FIG. 29 is a timing chart for describing a method for driving writing control lines GL and monitoring control lines ML in the present variant. In FIG. 29, a period from time point t41 to time point t43 is a monitoring process period. A measurement period from time point t42 to time point t43 corresponds to an amount-of-electricity measurement period.

As can be grasped from FIG. 29, throughout a non-scanning period, none of the writing control lines GL do not go into a selected state, regardless of the clock operation of the clock signals GCK1 and GCK2. The monitoring control shift register 400 operates in the same manner as in the above-described fifth variant. By this, a monitoring process is performed during the period from time point t41 to time point t43.

1.9.2.3 Seventh Variant

Although, in the above-described first embodiment and first to sixth variants, it is premised that a monitoring process is performed periodically, the present invention can also be applied to a case in which a monitoring process is performed on an irregular basis. So, an example in which the configuration is such that whether or not to perform a monitoring process can be controlled externally will be described as a seventh variant of the above-described first embodiment.

In the present variant, an organic EL display device is configured such that the stopping and resumption of an output of an active monitoring control signal ML from each second unit circuit 40 in the monitoring control shift register 400 can be controlled externally.

Figure 30:
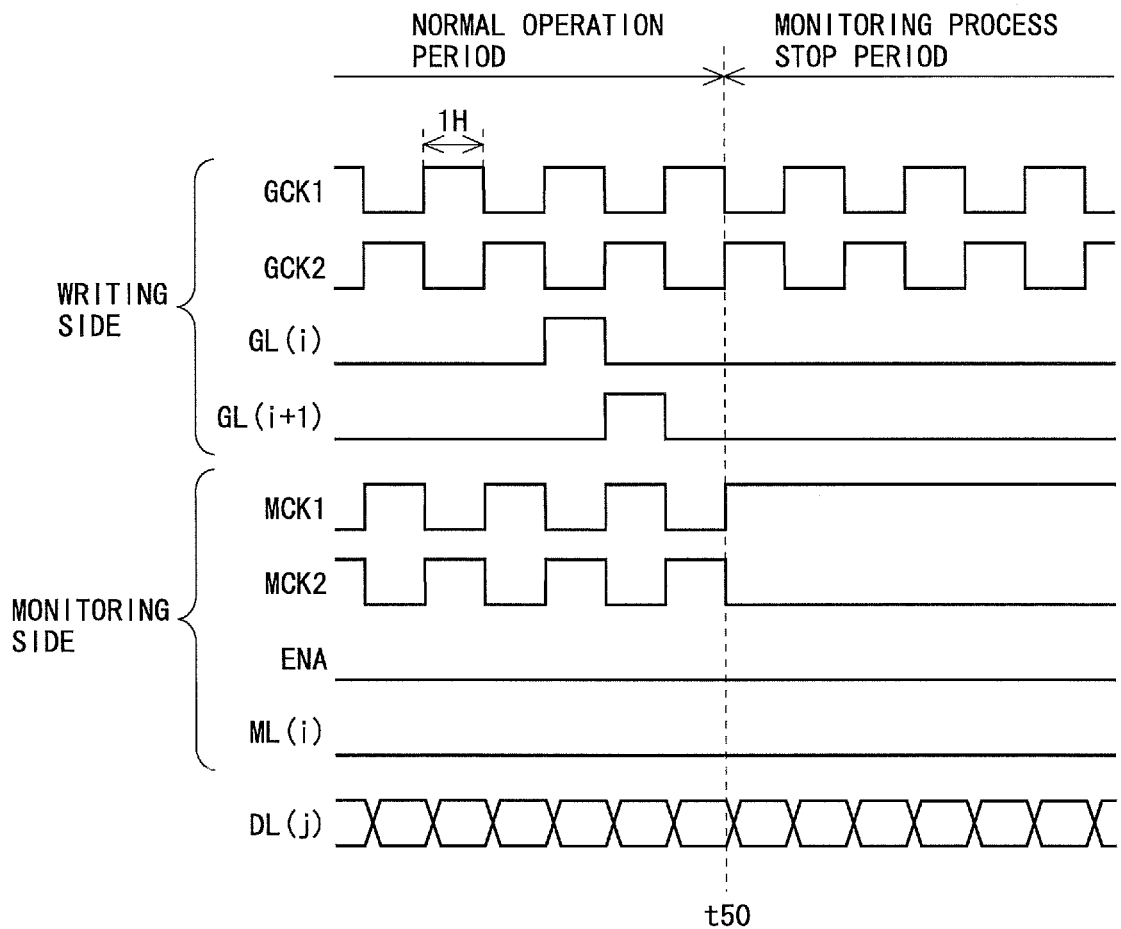
FIG. 30 is a timing chart for describing a method for driving writing control lines and monitoring control lines in a seventh variant of the first embodiment.

FIG. 30 is a timing chart for describing a method for driving writing control lines GL and monitoring control lines ML in the present variant. Here, an example will be described in which an instruction to stop the execution of a monitoring process for a while is provided during a normal operation period during which image display and a monitoring process are performed. In FIG. 30, a period prior to time point t50 is a normal operation period, and a period after time point t50 is a monitoring process stop period. That is, it is assumed that an instruction to stop the execution of a monitoring process for a while is provided at time point t50.

During the normal operation period, both the clock operation of the clock signals GCK1 and GCK2 provided to the writing control shift register 300 and the clock operation of the clock signals MCK1 and MCK2 provided to the monitoring control shift register 400 continue. By this, the writing control lines GL(1) to GL(n) provided in the display unit 500 sequentially go into a selected state. Note that when a monitoring process is performed, the waveforms of the clock signals GCK1 and GCK2, the clock signals MCK1 and MCK2, and the monitoring enable signal ENA are controlled, for example, in the same manner as for a period from time point t21 to time point t23 in the above-described first embodiment. In the above-described manner, image display or a monitoring process is performed during the normal operation period.

When an instruction to stop the execution of a monitoring process for a while is provided at time point t50, the display control circuit 100 stops the clock operation of the clock signals MCK1 and MCK2. By this, the operation of the monitoring control shift register 400 stops during the monitoring process stop period. Therefore, a monitoring process, i.e., a process of measuring drive currents, is not performed during the monitoring process stop period. In this manner, a monitoring process can be stopped for a long period of time, for example, when the changes (changes over time) in the characteristics of circuit elements are small.

1.9.3 Variant for a Monitoring Target

1.9.3.1 Eighth Variant

In the above-described first embodiment, the organic EL display device 1 is provided with the source driver 200 having the function of measuring currents outputted to the data lines DL from the pixel circuits 50. That is, current measurement is performed in order to obtain the characteristics of circuit elements (the drive transistors T2 or the organic EL elements OLED) in the pixel circuits 50. However, the present invention is not limited thereto, and voltage measurement may be performed in order to obtain the characteristics of the circuit elements in the pixel circuits 50.

Figure 31:
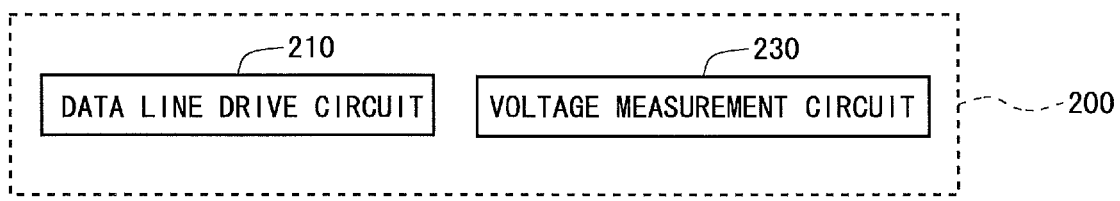
FIG. 31 is a diagram for describing an outline of a source driver in an eighth variant of the first embodiment.
Figure 32:
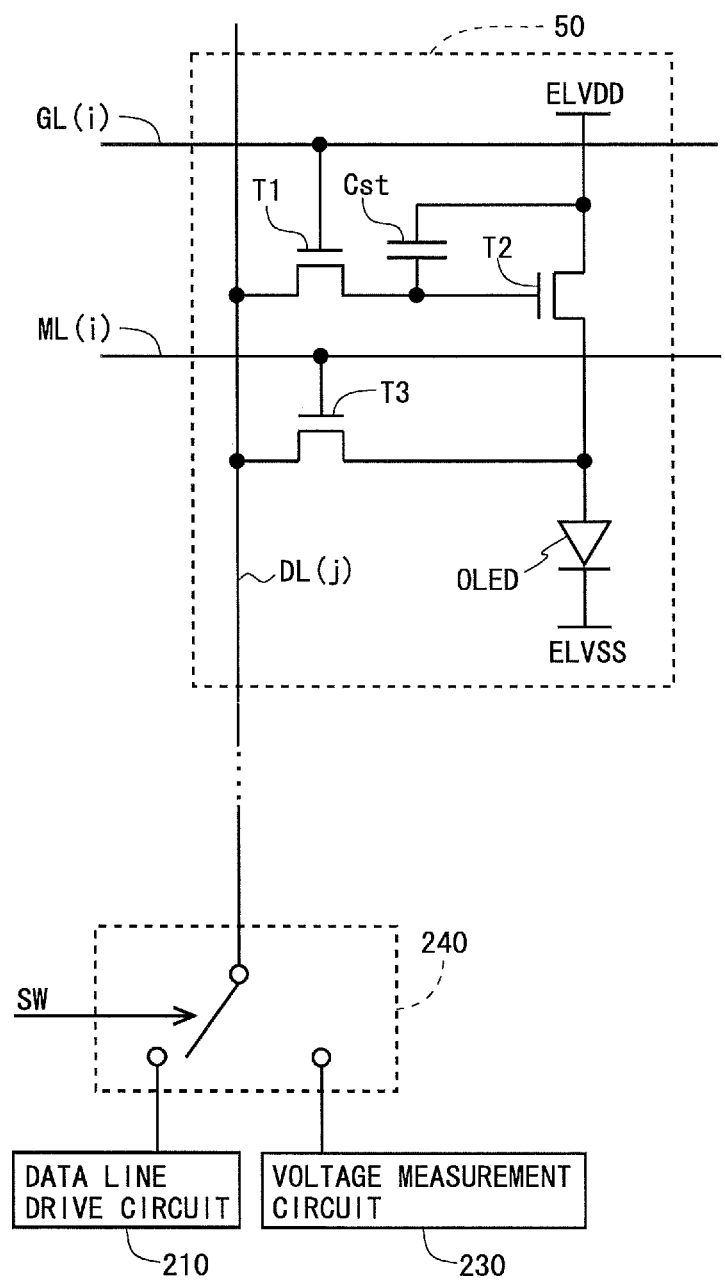
FIG. 32 is a diagram for describing a switching unit in the eighth variant of the first embodiment.

FIG. 31 is a diagram for describing an outline of a source driver 200 in the present variant. As shown in FIG. 31, the source driver 200 includes a portion that functions as a data line drive circuit 210 and a portion that functions as a voltage measurement circuit 230. Note that, in the present variant, an amount-of-electricity measurement circuit is implemented by the voltage measurement circuit 230. Note also that, as shown in FIG. 32, an organic EL display device according to the present variant is provided with a switching unit 240 for switching between a state in which the data line DL is connected to the data line drive circuit 210 and a state in which the data line DL is connected to the voltage measurement circuit 230. Then, it is configured such that the data line DL is connected to either one of the data line drive circuit 210 and the voltage measurement circuit 230, based on a switching control signal SW provided to the switching unit 240 from the display control circuit 100.

Figure 33:
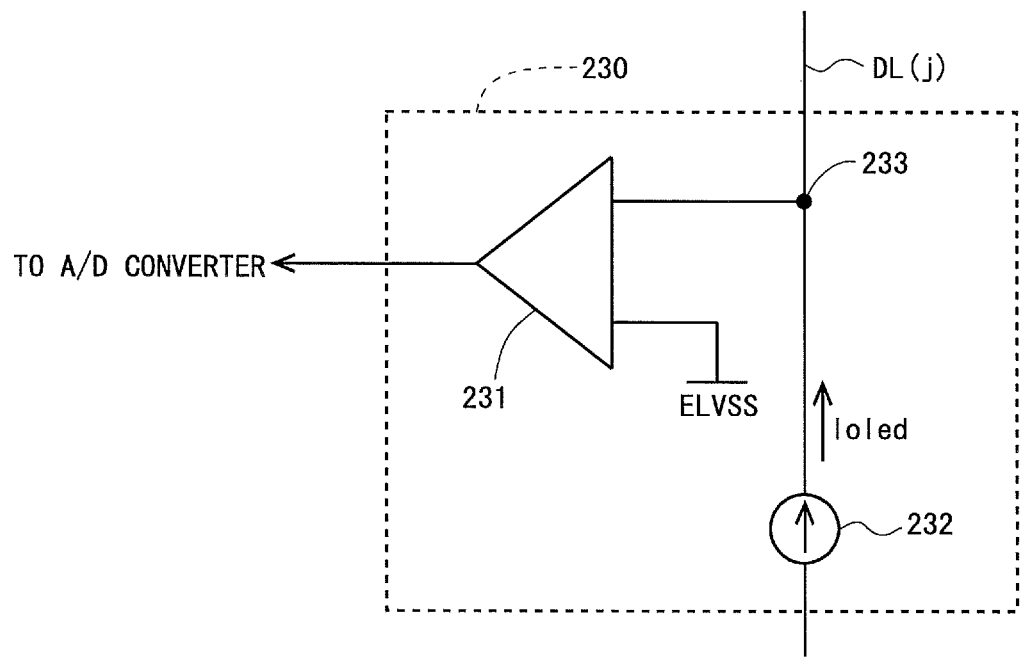
FIG. 33 is a diagram showing an exemplary configuration of a voltage measurement circuit in the eighth variant of the first embodiment.

FIG. 33 is a diagram showing an exemplary configuration of the voltage measurement circuit 230. As shown in FIG. 33, the voltage measurement circuit 230 includes an amplifier 231 and a constant current source 232. In such a configuration, with a constant current being supplied to a data line DL by the constant current source 232, the amplifier 231 amplifies a voltage between an electrode having an organic EL low-level power supply voltage ELVSS and a node 233. Then, the amplified voltage is provided to the AD converter 25 (see FIG. 5).

In the above-described manner, also in a case where a configuration in which voltage measurement instead of current measurement is performed is adopted, TFT characteristics or OLED characteristics can be obtained and correction of video signals, etc., can be performed based on the obtained information.

2. Second Embodiment

2.1 Configuration of a Display Unit

Figure 34:
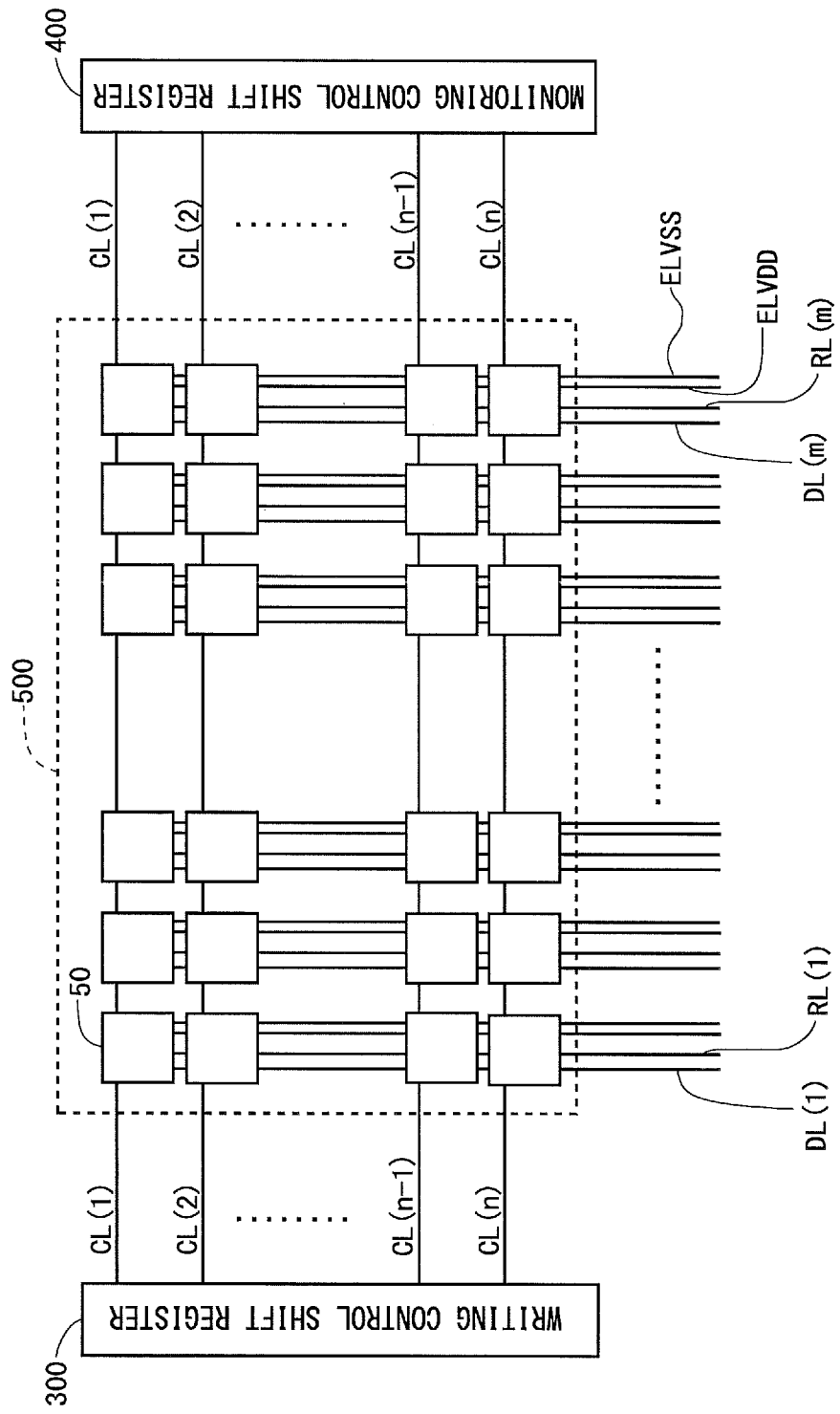
FIG. 34 is a diagram for describing a configuration of a display unit of an active matrix-type organic EL display device according to a second embodiment of the present invention.

A second embodiment of the present invention will be described. The overall configuration is the same as that of the above-described first embodiment and thus description thereof is omitted (see FIG. 2). The following only describes differences from the first embodiment. FIG. 34 is a diagram for describing a configuration of a display unit 500 in the present embodiment. In the present embodiment, unlike the first embodiment, a writing control line and a monitoring control line are shared by a shared control line CL which is a single control line. That is, in the present embodiment, instead of n writing control lines GL(1) to GL(n) and n monitoring control lines ML(1) to ML(n) in the first embodiment, n shared control lines CL(1) to CL(n) are disposed in the display unit 500. Pixel circuits 50 are provided at corresponding intersections of the shared control lines CL(1) to CL(n) and data lines DL(1) to DL(m). In addition, as in the first embodiment, organic EL high-level power supply lines ELVDD and organic EL low-level power supply lines ELVSS are disposed in the display unit 500. Furthermore, m monitoring lines RL(1) to RL(m) are disposed in the display unit 500 such that they have a one-to-one correspondence with the m data lines DL(1) to DL(m). Note that a signal provided to each of the shared control lines CL are referred to as "shared control signal." The shared control signal is denoted by the same reference character CL as the shared control line.

2.2 Configuration of the Pixel Circuit

Figure 35:
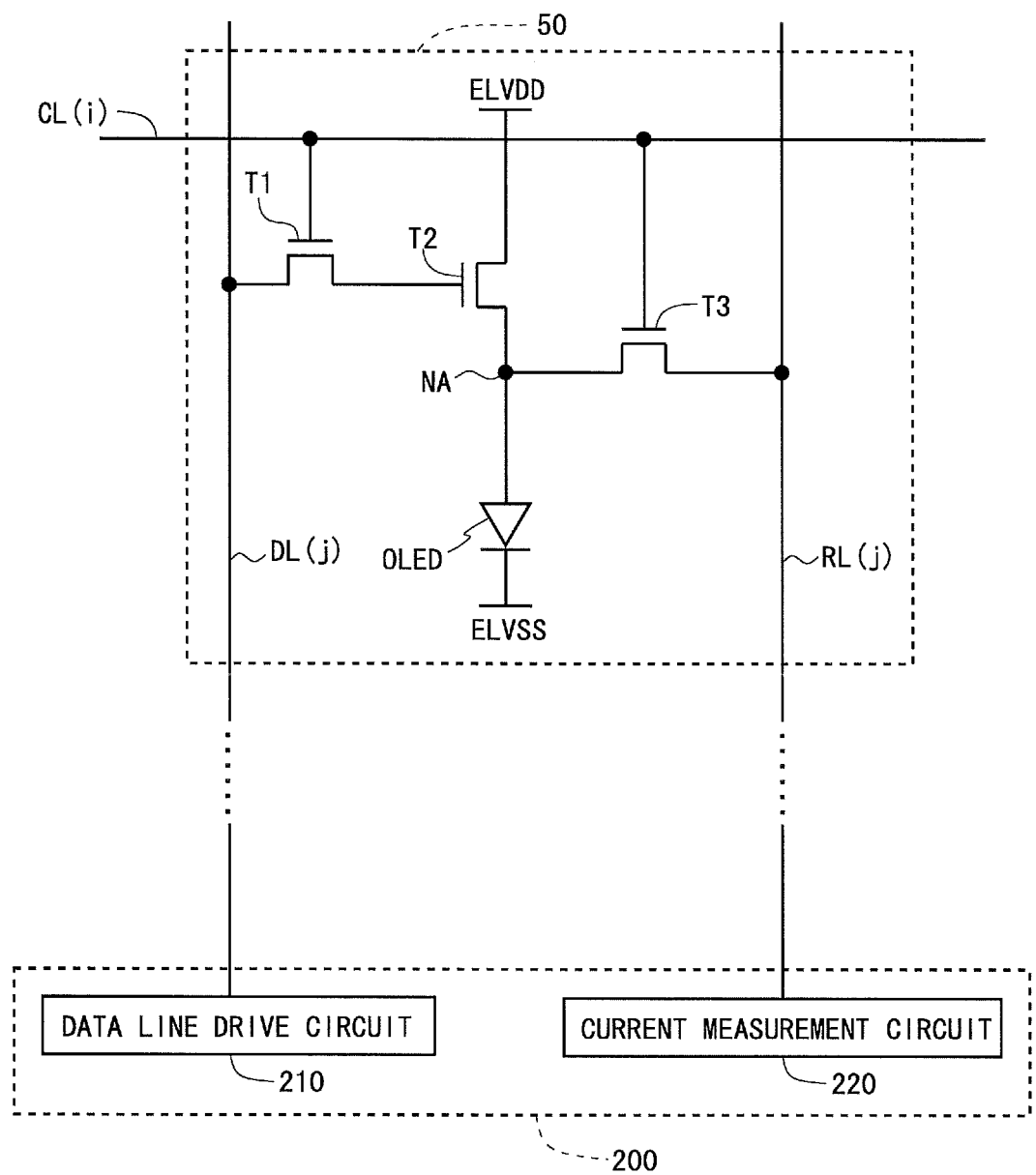
FIG. 35 is a diagram showing a configuration of a pixel circuit and a schematic configuration of a source driver in the second embodiment.

FIG. 35 is a circuit diagram showing a configuration of a pixel circuit 50 in the present embodiment. The pixel circuit 50 includes one organic EL element (electro-optical element) OLED and three transistors T1 to T3. The transistor T1 functions as an input transistor that selects a pixel, the transistor T2 functions as a drive transistor that controls the supply of a current to the organic EL element OLED, and the transistor T3 functions as a monitoring control transistor that controls whether to perform current measurement for detecting the characteristics of the drive transistor or the characteristics of the organic EL element OLED.

The transistor T1 is provided between a data line DL(j) and a gate terminal of the transistor T2. The transistor T1 has a gate terminal connected to a shared control line CL(i); and a source terminal connected to the data line DL(j). The transistor T2 is provided in series with the organic EL element OLED. The transistor T2 has the gate terminal connected to a drain terminal of the transistor T1; a drain terminal connected to an organic EL high-level power supply line ELVDD; and a source terminal connected to an anode terminal of the organic EL element OLED. The transistor T3 has a gate terminal connected to the shared control line CL(i); a drain terminal connected to the anode terminal of the organic EL element OLED; and a source terminal connected to a monitoring line RL(j). A cathode terminal of the organic EL element OLED is connected to an organic EL low-level power supply line ELVSS. Note that the data line DL is connected to the data line drive circuit 210 and the monitoring line RL is connected to the current measurement circuit 220.

2.3 Configurations of a Writing Control Shift Register and a Monitoring Control Shift Register A configuration of a writing control shift register 300 in the present embodiment is the same as that of the first embodiment (see FIGS. 6 to 8). Note, however, that an output terminal 38 is connected to a shared control line CL in the present embodiment. A configuration of a monitoring control shift register 400 in the present embodiment is the same as that of the first embodiment (see FIGS. 10 to 12). Note, however, that an output terminal 49 is connected to the shared control line CL in the present embodiment.

2.4 Drive Method

Figure 36:
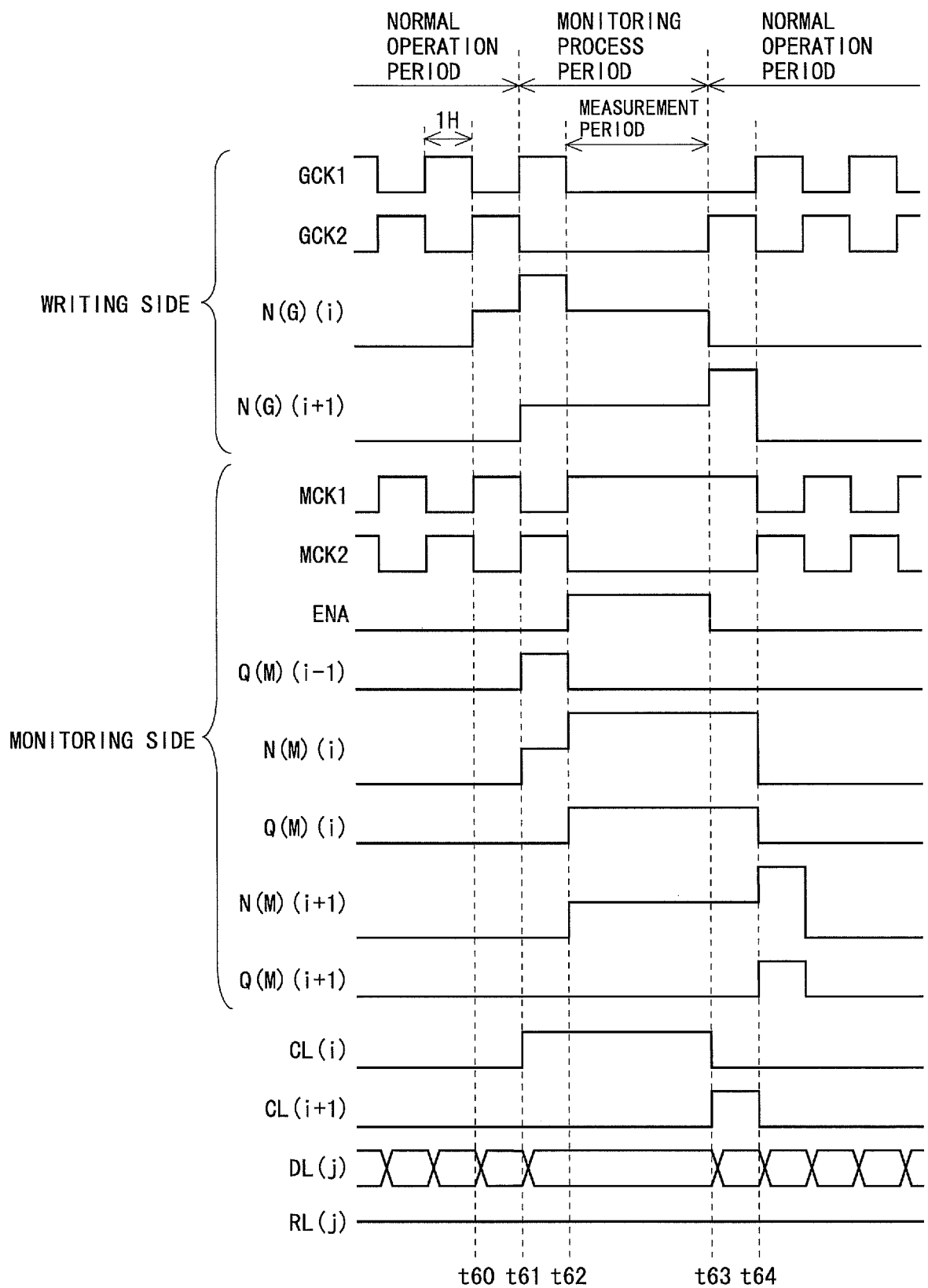
FIG. 36 is a timing chart for describing a method for driving shared control lines in the second embodiment.
Figure 37:
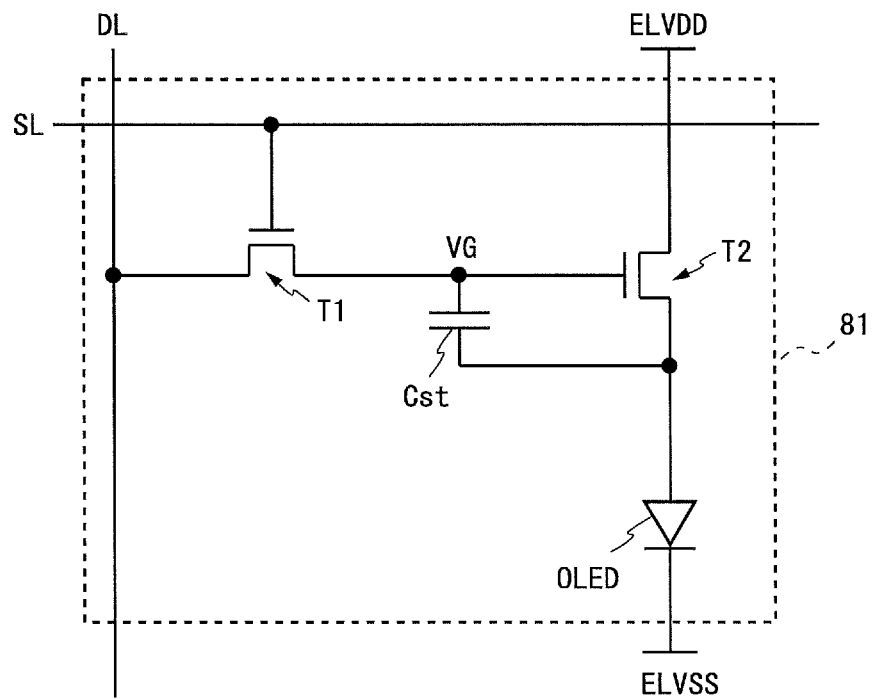
FIG. 37 is a circuit diagram showing a configuration of a conventional general pixel circuit.
Figure 38:
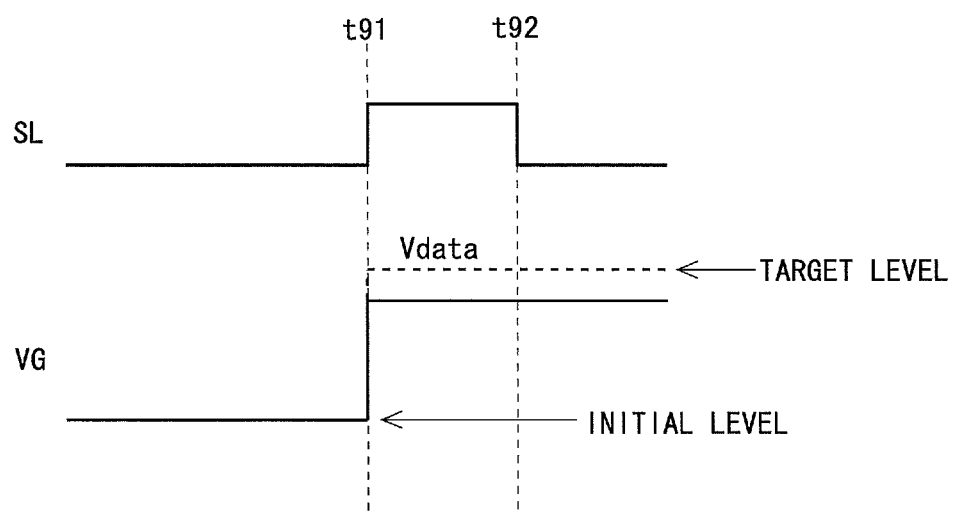
FIG. 38 is a timing chart for describing the operation of the pixel circuit shown in FIG. 37.
Figure 39:
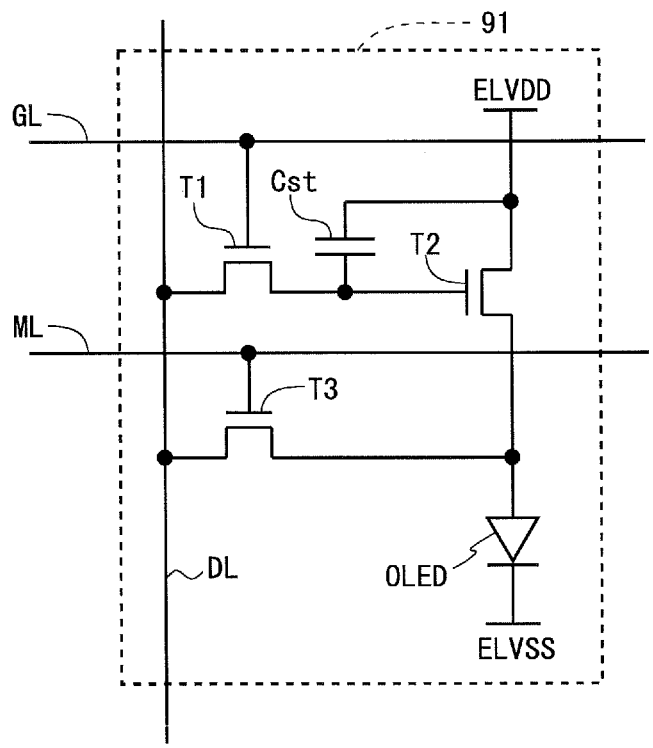
FIG. 39 is a circuit diagram showing an exemplary configuration of a pixel circuit for allowing drive current measurement so as to perform compensation depending on the characteristics of a drive transistor.
Figure 40:
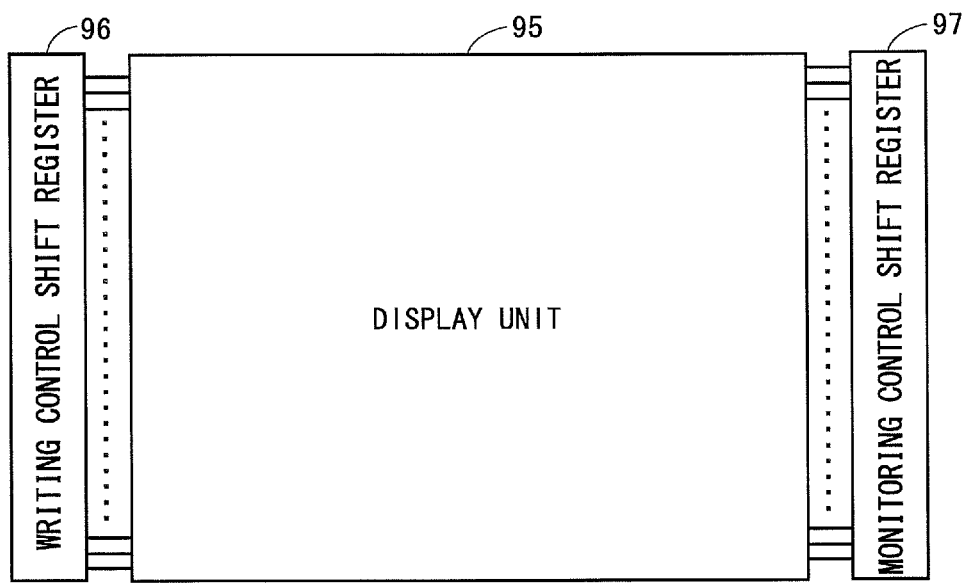
FIG. 40 is a block diagram for describing a configuration for driving writing control lines and monitoring control lines.

FIG. 36 is a timing chart for describing a method for driving shared control lines CL around a monitoring process period. Here, too, it is assumed that an ith row is a monitored row. In addition, it is assumed that a monitoring process is performed during a period during which normal image display is performed. In FIG. 36, a period prior to time point t61 and a period after time point t63 are normal operation periods (periods during which normal image display is performed on the display unit 500), and a period from time point t61 to time point t63 is a monitoring process period.

When a shared control signal CL(i−1) (not shown) for an (i−1)th row goes to a high level at time point t60, the voltage level at a first internal node N(G) (i) in the first unit circuit 30(i) changes from a low level to a high level since the shared control signal CL(i−1) is provided as a set signal S(G) to a first unit circuit 30(i).

When reaching time point t61, in the writing control shift register 300, a clock signal GCK1 changes from a low level to a high level. Since the clock signal GCK1 is provided as a clock signal GCLK to the first unit circuit 30(i), the first internal node N(G) (i) in the first unit circuit 30(i) goes into a boosted state. By this, a shared control signal CL(i) for the ith row changes from a low level to a high level. In addition, by the shared control signal CL(i) changing from a low level to a high level, the voltage level at a first internal node N(G) (i+1) in a first unit circuit 30(i+1) changes from a low level to a high level.

In addition, when reaching time point t61, in the monitoring control shift register 400, an output signal Q(M) (i−1) outputted from a second unit circuit 40(i−1) changes from a low level to a high level. Since the output signal Q(M) (i−1) is provided as a set signal S(M) to a second unit circuit 40(i), the voltage level at a second internal node N(M) (i) in the second unit circuit 40(i) changes from a low level to a high level.

As described above, when reaching time point t61, a shared control line CL(i) of the ith row goes into a selected state. By this, in each pixel circuit 50 of the ith row, a transistor T1 and a transistor T3 goes into an on state. By this, a data voltage supplied to the data line DL is provided to the gate terminal of the transistor T2, and a monitored voltage supplied to the monitoring line RL is provided to the source terminal of the transistors T2. As a result, the transistor T2 goes into an on state based on a voltage difference between the data voltage and the monitored voltage, and a current flowing from an organic EL high-level power supply line ELVDD to the monitoring line RL through the transistors T2 and T3 occurs. Note that it is assumed that the value of the data voltage and the value of the monitored voltage are set such that the voltage difference between the data voltage and the monitored voltage is greater than a threshold voltage of the transistor T2.

Meanwhile, the voltage level at a node denoted by reference character NA in FIG. 35 is substantially equal to the voltage level of the monitored voltage. Depending on the relationship between the voltage level at the node NA and the voltage level of the organic EL low-level power supply voltage ELVSS, a current flowing from the organic EL high-level power supply line ELVDD to the organic EL low-level power supply line ELVSS (a current flowing through the organic EL element OLED) may also occur in addition to a current flowing from the organic EL high-level power supply line ELVDD to the monitoring line RL. In such a case, currents flow through the transistor T2 and the organic EL element OLED, and thus, even when the current flowing through the monitoring line RL is measured, the characteristics of the transistor T2 cannot be properly detected. Hence, upon detection of the characteristics of the transistor T2, in order that a current flows through the transistor T2 but a current does not flow through the organic EL element OLED, the value of the data voltage and the value of the monitored voltage are set such that the following equation (1) and equation (2) hold:

$$VG - VNA > Vth(T) \qquad (1)$$

$$VNA - VL < Vth(O) \qquad (2)$$

where VG represents the value of a gate voltage of the transistor T2, VNA represents the value of a voltage at the node NA, VL represents the value of the organic EL low-level power supply voltage ELVSS, Vth(T) represents the value of a threshold voltage of the transistor T2, and Vth(O) represents the value of a threshold voltage of the organic EL element OLED.

Note that upon detection of the characteristics of the organic EL element OLED, in order that a current flows through the organic EL element OLED but a current does not flow through the transistor T2, the value of the data voltage and the value of the monitored voltage are set such that the following equation (3) and equation (4) hold:

$$VG-VNA<Vth(T) \quad (3)$$

$$VNA-VL>Vth(O) \quad (4)$$

When reaching time point t62, in the writing control shift register 300, the clock signal GCK1 changes from a high level to a low level. By this, the voltage level at the first internal node N(G) (i) in the first unit circuit 30(i) decreases. Meanwhile, at time point t62, a clock signal GCK2 is maintained at a low level. Hence, unlike a normal operation period, the first internal node N(G) (i+1) in the first unit circuit 30(i+1) is not boosted.

In addition, when reaching time point t62, in the monitoring control shift register 400, a clock signal MCK1 changes from a low level to a high level. Since the clock signal MCK1 is provided as a clock signal MCLK to the second unit circuit 40(i), the second internal node N(M) (i) in the second unit circuit 40(i) goes into a boosted state, and an output signal Q(M) (i) outputted from the second unit circuit 40(i) changes from a low level to a high level. In addition, at time point t62, a monitoring enable signal ENA changes from a low level to a high level. Hence, at time point t62, the shared control signal CL(i) for the ith row is maintained at a high level. Moreover, by the output signal Q(M) (i) changing from a low level to a high level, the voltage level at a second internal node N(M) (i+1) in a second unit circuit 40(i+1) changes from a low level to a high level.

As described above, at time point t62, the shared control line CL(i) is maintained in a selected state. Moreover, throughout a period from time point t62 to time point t63, the display control circuit 100 maintains the monitoring enable signal ENA at a high level and stops the clock operation of the clock signals GCK1, GCK2, MCK1, and MCK2. Then, during the period from time point t62 to time point t63, the current measurement circuit 220 measures drive currents flowing through the monitoring lines RL.

When reaching time point t63, in the monitoring control shift register 400, the monitoring enable signal ENA changes from a high level to a low level. By this, in the second unit circuit 40, an output terminal 48 and an output terminal 49 go into an electrically disconnected state (see FIG. 12). In addition, when reaching time point t63, in the writing control shift register 300, the clock signal GCK2 changes from a low level to a high level. Since the clock signal GCK2 is provided as a clock signal GCLK to the first unit circuit 30(i+1), the first internal node N(G) (i+1) in the first unit circuit 30(i+1) goes into a boosted state, and a shared control signal CL(i+1) for an (i+1)th row changes from a low level to a high level. At this time, data voltages have been supplied to the data lines DL from the data line drive circuit 210. By this, during a period from time point t63 to time point t64, writing based on the data voltages is performed in pixel circuits 50 of the (i+1)th row. Moreover, since the shared control signal CL(i+1) is provided as a reset signal R(G) to the first unit circuit 30, by the shared control signal CL(i+1) changing from a low level to a high level, the voltage levels at the first internal node N(G) (i) and the output terminal 38 in the first unit circuit 30(i) go to a low level. By the above, at time point t63, even when the voltage level at the second internal node N(M) (i) in the second unit circuit 40(i) and the output signal Q(M) (i) are maintained at a high level, the shared control signal CL(i) goes to a low level.

When reaching time point t64, the clock signal MCK2 changes from a low level to a high level. Since the clock signal MCK2 is provided as a clock signal MCLK to the second unit circuit 40(i+1), by the clock signal MCK2 changing from a low level to a high level, the second internal node N(M) (i+1) in the second unit circuit 40(i+1) goes into a boosted state, and an output signal Q(M) (i+1) outputted from the second unit circuit 40(i+1) changes from a low level to a high level. By this, the voltage level at the second internal node N(M) (i) in the second unit circuit 40(i) and the output signal Q(M) (i) go to a low level.

As described above, after performing a monitoring process during the period from time point t61 to time point t63, normal operation is performed during the period after time point t63. Then, video signals are corrected based on data obtained in the monitoring process, by which degradation of circuit elements is compensated for.

2.5 Regarding the Current Drive Capability of Components in the Unit Circuits As in the above-described first embodiment, in the present embodiment, too, a configuration in which "the current drive capability of the first boost circuit 320 is higher than the current drive capability of the second boost circuit 420" is adopted. By this, the rise time of the shared control signal CL when performing a normal data voltage writing process becomes shorter than the rise time of the shared control signal CL when performing a monitoring process. As a result, degradation of display quality caused by insufficient charging of capacitors Cst is suppressed.

Moreover, as in the above-described first embodiment, in the present embodiment, too, a configuration in which "the current drive capability of the second output node reset circuit 430 is higher than the current drive capability of the first output node reset circuit 330" is adopted. By this, the shared control signal CL can promptly fall also when a monitoring process period ends, suppressing degradation of display quality.

2.6 Effects

Also in the present embodiment, as in the above-described first embodiment, an organic EL display device is implemented that is configured to include two independent shift registers (the writing control shift register 300 and the monitoring control shift register 400) and is capable of performing a monitoring process without causing the degradation of display quality or the occurrence of abnormal operation.

In addition, according to the present embodiment, since the number of wiring lines can be reduced over the first embodiment, an improvement in definition is possible. Moreover, for example, a configuration can also be adopted in which there are prepared a mode in which only writing operation for image display is performed by stopping the operation of the monitoring control shift register 400 and a mode in which both of writing operation and monitoring operation are performed, and one of the modes can be selected depending on the changes (changes over time) in the characteristics of circuit elements.

3. Others

The present invention is not limited to the above-described embodiments (including the variants), and can be carried out by making various modifications thereto without departing from the true spirit and scope of the present invention. For example, although the above-described embodiments describe an organic EL display device as an example, the present invention can also be applied to display devices other than organic EL display devices as long as the display devices include self light-emitting type display elements that are driven by a current.

Moreover, for example, although the above-described embodiments describe an example in which an organic EL low-level power supply voltage ELVSS is supplied by a power supply line, the configuration may be such that an electrode that provides a constant potential to the entire surface of the display unit 500 (hereinafter, referred to as "solid electrode" for convenience sake) is provided and the potential of the solid electrode is set to be equal to the above-described organic EL low-level power supply voltage ELVSS. The same also applies to the organic EL high-level power supply voltage ELVDD. As solid electrodes, there are a transparent solid electrode that allows light to pass therethrough and a reflecting solid electrode that reflects light. As for configurations using such solid electrodes, for example, the following first to third configurations can be adopted according to a structure about how to extract light, etc. Note that here a potential corresponding to the above-described organic EL high-level power supply voltage ELVDD is represented by ELVDD1, and a potential corresponding to the above-described organic EL low-level power supply voltage ELVSS is represented by ELVSS1.

First Configuration

A wiring line for ELVDD1 is provided for each column by means of a thin line, and a transparent solid electrode for ELVSS1 is provided. This first configuration is typically adopted by an organic EL display device having a top emission structure.

Second Configuration

A wiring line for ELVDD1 is provided for each column by means of a thin line, and a reflecting solid electrode for ELVSS1 is provided. This second configuration is typically adopted by an organic EL display device having a bottom emission structure.

Third Configuration

A transparent solid electrode for ELVDD1 is provided, and a transparent solid electrode for ELVSS1 is provided. This third configuration is typically adopted by an organic EL display device having a top emission structure and having a multilayer wiring structure in which a power supply layer is an independent layer.

DESCRIPTION OF REFERENCE CHARACTERS

1: ORGANIC EL DISPLAY DEVICE
6: ORGANIC EL PANEL
30: FIRST UNIT CIRCUIT (UNIT CIRCUIT IN WRITING CONTROL SHIFT REGISTER)
40: SECOND UNIT CIRCUIT (UNIT CIRCUIT IN MONITORING CONTROL SHIFT REGISTER)
50: PIXEL CIRCUIT
100: DISPLAY CONTROL CIRCUIT
200: SOURCE DRIVER
300: WRITING CONTROL SHIFT REGISTER
320: FIRST BOOST CIRCUIT
330: FIRST OUTPUT NODE RESET CIRCUIT
340: FIRST INTERNAL NODE RESET CIRCUIT
400: MONITORING CONTROL SHIFT REGISTER
420: SECOND BOOST CIRCUIT
430: SECOND OUTPUT NODE RESET CIRCUIT
440: SECOND INTERNAL NODE RESET CIRCUIT
500: DISPLAY UNIT
T1: INPUT TRANSISTOR
T2: DRIVE TRANSISTOR
T3: MONITORING CONTROL TRANSISTOR
Cst: CAPACITOR
DL and DL(1) to DL(m): DATA LINE
GL and GL(1) to GL(n): WRITING CONTROL LINE
ML and ML(1) to ML(n): MONITORING CONTROL LINE
ENA: MONITORING ENABLE SIGNAL

The invention claimed is:

1. A display device having a plurality of pixel circuits formed in a matrix form, the display device comprising,
a plurality of writing control lines provided to correspond to respective rows, and each configured to transmit a writing control signal controlling whether to write data voltages into pixel circuits of a corresponding row;
a plurality of monitoring control lines provided to correspond to the respective rows, and each configured to transmit a monitoring control signal controlling whether to measure amounts of electricity representing characteristics of circuit elements included in pixel circuits of a corresponding row;
a plurality of data lines provided to correspond to respective columns, and each configured to supply the data voltages to pixel circuits of a corresponding column;
an amount-of-electricity measurement circuit configured to measure amounts of electricity supplied from the plurality of pixel circuits;
a writing control shift register including a plurality of stages and configured to sequentially output an on-level writing control signal to the plurality of writing control lines based on a first clock signal group, the plurality of stages having a one-to-one correspondence with the plurality of writing control lines;
a monitoring control shift register including a plurality of stages and configured to output an on-level monitoring control signal to a monitoring control line of a monitored row based on a second clock signal group, the plurality of stages having a one-to-one correspondence with the plurality of monitoring control lines, and the monitored row being a target row for measurement of an amount of electricity;
a data line drive circuit configured to apply the data voltages to the plurality of data lines; and
a drive control circuit configured to control operation of the amount-of-electricity measurement circuit, the writing control shift register, the monitoring control shift register, and the data line drive circuit, wherein
a first unit circuit forming each of the stages of the writing control shift register includes:
a first internal node;

a first transfer circuit configured to transfer an on-level signal to the first internal node, the on-level signal being outputted from a first unit circuit forming a stage previous to its own stage;

a first signal output circuit including a first output node connected to a writing control line corresponding to its own stage; and a first boost circuit configured to increase a voltage level at the first internal node based on a clock signal included in the first clock signal group, the first signal output circuit being configured to output a writing control signal from the first output node, and the writing control signal having a voltage level equal to a voltage level of the clock signal provided to the first boost circuit;

a first internal node reset circuit configured to bring a voltage level at the first internal node to an off level; and a first output node reset circuit configured to bring a voltage level at the first output node to an off level, a second unit circuit forming each of the stages of the monitoring control shift register includes:

a second internal node;

a second transfer circuit configured to transfer an on-level signal to the second internal node, the on-level signal being outputted from a second unit circuit forming a stage previous to its own stage;

a second signal output circuit including a second output node connected to a monitoring control line corresponding to its own stage; and a second boost circuit configured to increase a voltage level at the second internal node based on a clock signal included in the second clock signal group, the second signal output circuit being configured to output a monitoring control signal from the second output node, and the monitoring control signal having a voltage level equal to a voltage level of the clock signal provided to the second boost circuit;

a second internal node reset circuit configured to bring a voltage level at the second internal node to an off level; and a second output node reset circuit configured to bring a voltage level at the second output node to an off level, current drive capability of the first boost circuit is higher than current drive capability of the second boost circuit, current drive capability of the second output node reset circuit is higher than current drive capability of the first output node reset circuit, and the drive control circuit:

controls the operation of the writing control shift register such that the output of the on-level writing control signal to the plurality of writing control lines stops during an amount-of-electricity measurement period, the amount-of-electricity measurement period being a period during which measurement of an amount of electricity by the amount-of-electricity measurement circuit is to be performed;

controls the operation of the monitoring control shift register such that the on-level monitoring control signal is outputted to the monitoring control line of the monitored row during the amount-of-electricity measurement period;

the second signal output circuit further includes a second output control circuit configured to control an output of an on-level monitoring control signal from the second output node, based on a second enable signal; and the second output control circuit is provided in a region between the second transfer circuit and the second boost circuit so as to divide the second internal node into two regions.

2. The display device according to claim 1, wherein the plurality of data lines each transmit amounts of electricity to the amount-of-electricity measurement circuit, the amounts of electricity being supplied from pixel circuits of a corresponding column, and each of the pixel circuits includes:

a writing control transistor having a control terminal of the writing control transistor connected to a corresponding writing control line; a first conductive terminal of the writing control transistor; and a second conductive terminal of the writing control transistor connected to a corresponding data line;

a monitoring control transistor of the monitoring control transistor having a control terminal connected to a corresponding monitoring control line; a first conductive terminal of the monitoring control transistor; and a second conductive terminal of the monitoring control transistor connected to the corresponding data line;

a drive transistor having a control terminal of the drive transistor connected to the first conductive terminal of the writing control transistor; a first conductive terminal of the drive transistor to which an on-level power supply voltage is provided; and a second conductive terminal of the drive transistor connected to the first conductive terminal of the monitoring control transistor; and an organic EL element having an anode terminal connected to the second conductive terminal of the drive transistor; and a cathode terminal to which an off-level power supply voltage is provided.

3. The display device according to claim 1, further comprising a plurality of monitoring lines provided to correspond to the respective columns, and each configured to transmit amounts of electricity to the amount-of-electricity measurement circuit, the amounts of electricity being supplied from pixel circuits of a corresponding column, wherein a writing control line and a monitoring control line are shared by a shared control line, the shared control line being a single control line, and each of the pixel circuits includes:

a writing control transistor having a control terminal connected to a corresponding shared control line; and a second conductive terminal connected to a corresponding data line;

a monitoring control transistor having a control terminal connected to the corresponding shared control line; and a second conductive terminal connected to a corresponding monitoring line;

a drive transistor having a control terminal connected to a first conductive terminal of the writing control transistor; a first conductive terminal to which an on-level power supply voltage is provided; and a second conductive terminal connected to a first conductive terminal of the monitoring control transistor; and an organic EL element having an anode terminal connected to the second conductive terminal of the drive transistor; and a cathode terminal to which an off-level power supply voltage is provided.

4. The display device according to claim 1, wherein the first signal output circuit further includes a first output control circuit configured to control an output of an on-level writing control signal from the first output node, based on a first enable signal, and current drive capability of the first output control circuit is higher than current drive capability of the second output control circuit.

5. The display device according to claim 1, wherein the second unit circuit further includes a second holding circuit configured to hold the on-level signal transferred to the second internal node from the second transfer circuit.

6. The display device according to claim 5, wherein current drive capability of the second internal node reset circuit is higher than current drive capability of the first internal node reset circuit.

7. The display device according to claim 5, wherein
the first unit circuit further includes a first holding circuit configured to hold the on-level signal transferred to the first internal node from the first transfer circuit, and
signal holding capability of the second holding circuit is higher than signal holding capability of the first holding circuit.

8. The display device according to claim 1, wherein the drive control circuit stops the output of the on-level writing control signal to the plurality of writing control lines by the writing control shift register, by stopping clock operation of the first clock signal group during the amount-of-electricity measurement period.

9. The display device according to claim 1, wherein the drive control circuit controls the operation of the writing control shift register and the operation of the monitoring control shift register such that an on-level monitoring control signal is outputted to the monitoring control line of the monitored row during a period during which the output of the on-level writing control signal to the plurality of writing control lines is stopped.

10. The display device according to claim 1, wherein stopping and resumption of the output of the on-level monitoring control signal by the monitoring control shift register can be controlled externally.

11. The display device according to claim 1, wherein the drive control circuit controls the operation of the writing control shift register and the operation of the monitoring control shift register such that a writing control signal provided to a writing control line of the monitored row and a monitoring control signal provided to a monitoring control line of the monitored row go to an on level in synchronization with each other.

12. A display device having a plurality of pixel circuits formed in a matrix form, the display device comprising,
a plurality of writing control lines provided to correspond to respective rows, and each configured to transmit a writing control signal controlling whether to write data voltages into pixel circuits of a corresponding row;
a plurality of monitoring control lines provided to correspond to the respective rows, and each configured to transmit a monitoring control signal controlling whether to measure amounts of electricity representing characteristics of circuit elements included in pixel circuits of a corresponding row;
a plurality of data lines provided to correspond to respective columns, and each configured to supply the data voltages to pixel circuits of a corresponding column;
an amount-of-electricity measurement circuit configured to measure amounts of electricity supplied from the plurality of pixel circuits;
a writing control shift register including a plurality of stages and configured to sequentially output an on-level writing control signal to the plurality of writing control lines based on a first clock signal group, the plurality of stages having a one-to-one correspondence with the plurality of writing control lines;
a monitoring control shift register including a plurality of stages and configured to output an on-level monitoring control signal to a monitoring control line of a monitored row based on a second clock signal group, the plurality of stages having a one-to-one correspondence with the plurality of monitoring control lines, and the monitored row being a target row for measurement of an amount of electricity;
a data line drive circuit configured to apply the data voltages to the plurality of data lines; and
a drive control circuit configured to control operation of the amount-of-electricity measurement circuit, the writing control shift register, the monitoring control shift register, and the data line drive circuit, wherein
a first unit circuit forming each of the stages of the writing control shift register includes:
a first internal node;
a first transfer circuit configured to transfer an on-level signal to the first internal node, the on-level signal being outputted from a first unit circuit forming a stage previous to its own stage;
a first signal output circuit including a first output node connected to a writing control line corresponding to its own stage; and a first boost circuit configured to increase a voltage level at the first internal node based on a clock signal included in the first clock signal group, the first signal output circuit being configured to output a writing control signal from the first output node, and the writing control signal having a voltage level equal to a voltage level of the clock signal provided to the first boost circuit;
a first internal node reset circuit configured to bring a voltage level at the first internal node to an off level; and
a first output node reset circuit configured to bring a voltage level at the first output node to an off level,
a second unit circuit forming each of the stages of the monitoring control shift register includes:
a second internal node;
a second transfer circuit configured to transfer an on-level signal to the second internal node, the on-level signal being outputted from a second unit circuit forming a stage previous to its own stage;
a second signal output circuit including a second output node connected to a monitoring control line corresponding to its own stage; and a second boost circuit configured to increase a voltage level at the second internal node based on a clock signal included in the second clock signal group, the second signal output circuit being configured to output a monitoring control signal from the second output node, and the monitoring control signal having a voltage level equal to a voltage level of the clock signal provided to the second boost circuit;
a second internal node reset circuit configured to bring a voltage level at the second internal node to an off level; and
a second output node reset circuit configured to bring a voltage level at the second output node to an off level,
current drive capability of the first boost circuit is higher than current drive capability of the second boost circuit, current drive capability of the second output node reset circuit is higher than current drive capability of the first output node reset circuit, and the drive control circuit:
controls the operation of the writing control shift register such that the output of the on-level writing control signal to the plurality of writing control lines stops during an amount-of-electricity measurement period, the amount-of-electricity measurement period being a period during which measurement of an amount of electricity by the amount-of-electricity measurement circuit is to be performed;

controls the operation of the monitoring control shift register such that the on-level monitoring control signal is outputted to the monitoring control line of the monitored row during the amount-of-electricity measurement period; and the drive control circuit stops the output of the on-level writing control signal to the plurality of writing control lines by the writing control shift register, by stopping clock operation of the first clock signal group during the amount-of-electricity measurement period.

13. The display device according to claim 12, wherein the plurality of data lines each transmit amounts of electricity to the amount-of-electricity measurement circuit, the amounts of electricity being supplied from pixel circuits of a corresponding column, and each of the pixel circuits includes:
a writing control transistor having a control terminal of the writing control transistor connected to a corresponding writing control line; a first conductive terminal of the writing control transistor; and a second conductive terminal of the writing control transistor connected to a corresponding data line;

a monitoring control transistor of the monitoring control transistor having a control terminal connected to a corresponding monitoring control line; a first conductive terminal of the monitoring control transistor; and a second conductive terminal of the monitoring control transistor connected to the corresponding data line;

a drive transistor having a control terminal of the drive transistor connected to the first conductive terminal of the writing control transistor; a first conductive terminal of the drive transistor to which an on-level power supply voltage is provided; and a second conductive terminal of the drive transistor connected to the first conductive terminal of the monitoring control transistor; and an organic EL element having an anode terminal connected to the second conductive terminal of the drive transistor; and a cathode terminal to which an off-level power supply voltage is provided.

14. The display device according to claim 12, further comprising a plurality of monitoring lines provided to correspond to the respective columns, and each configured to transmit amounts of electricity to the amount-of-electricity measurement circuit, the amounts of electricity being supplied from pixel circuits of a corresponding column, wherein a writing control line and a monitoring control line are shared by a shared control line, the shared control line being a single control line, and each of the pixel circuits includes:

a writing control transistor having a control terminal connected to a corresponding shared control line; and a second conductive terminal connected to a corresponding data line;

a monitoring control transistor having a control terminal connected to the corresponding shared control line; and a second conductive terminal connected to a corresponding monitoring line;

a drive transistor having a control terminal connected to a first conductive terminal of the writing control transistor; a first conductive terminal to which an on-level power supply voltage is provided; and a second conductive terminal connected to a first conductive terminal of the monitoring control transistor; and an organic EL element having an anode terminal connected to the second conductive terminal of the drive transistor; and a cathode terminal to which an off-level power supply voltage is provided.

15. The display device according to claim 12, wherein the second signal output circuit further includes a second output control circuit configured to control an output of an on-level monitoring control signal from the second output node, based on a second enable signal, the first signal output circuit further includes a first output control circuit configured to control an output of an on-level writing control signal from the first output node, based on a first enable signal, and current drive capability of the first output control circuit is higher than current drive capability of the second output control circuit.

16. The display device according to claim 12, wherein the second unit circuit further includes a second holding circuit configured to hold the on-level signal transferred to the second internal node from the second transfer circuit.

17. The display device according to claim 16, wherein current drive capability of the second internal node reset circuit is higher than current drive capability of the first internal node reset circuit.

18. The display device according to claim 16, wherein the first unit circuit further includes a first holding circuit configured to hold the on-level signal transferred to the first internal node from the first transfer circuit, and signal holding capability of the second holding circuit is higher than signal holding capability of the first holding circuit.

19. The display device according to claim 12, wherein the drive control circuit controls the operation of the writing control shift register and the operation of the data line drive circuit such that an on-level writing control signal is outputted to a writing control line of the monitored row and an initialization signal is applied to the plurality of data lines during at least a period immediately before the amount-of-electricity measurement period.

20. The display device according to claim 12, wherein the drive control circuit controls the operation of the writing control shift register and the operation of the monitoring control shift register such that an on-level monitoring control signal is outputted to the monitoring control line of the monitored row during a period during which the output of the on-level writing control signal to the plurality of writing control lines is stopped.

* * * * *